(12) United States Patent
Singh et al.

(10) Patent No.: US 7,209,851 B2
(45) Date of Patent: Apr. 24, 2007

(54) METHOD AND STRUCTURE TO DEVELOP A TEST PROGRAM FOR SEMICONDUCTOR INTEGRATED CIRCUITS

(75) Inventors: Harsanjeet Singh, Danville, CA (US); Ankan Pramanick, San Jose, CA (US); Mark Elston, Salinas, CA (US); Yoshifumi Tahara, Sunnyvale, CA (US); Toshiaki Adachi, San Jose, CA (US)

(73) Assignee: Advantest America R&D Center, Inc., Santa Clara, CA (US)

( * ) Notice: Subject to any disclaimer, the term of this patent is extended or adjusted under 35 U.S.C. 154(b) by 133 days.

(21) Appl. No.: 10/918,513

(22) Filed: Aug. 13, 2004

(65) Prior Publication Data

US 2005/0154550 A1 Jul. 14, 2005

Related U.S. Application Data

(63) Continuation-in-part of application No. 10/772,434, filed on Feb. 6, 2004.

(60) Provisional application No. 60/573,577, filed on May 22, 2004, provisional application No. 60/447,839, filed on Feb. 14, 2003.

(51) Int. Cl.
*G06F 19/00* (2006.01)

(52) U.S. Cl. ............ 702/119; 702/108; 702/120; 702/121; 702/122; 717/124

(58) Field of Classification Search ........... 702/119, 702/120–122, 108; 717/124
See application file for complete search history.

(56) References Cited

U.S. PATENT DOCUMENTS 4,807,161 A 2/1989 Comfort et al.

2003/0217343 A1 11/2003 Rajsuman et al.

FOREIGN PATENT DOCUMENTS

DE 10031536 A1 1/2001

OTHER PUBLICATIONS

ATE Open Architecture Initative. Oct. 8, 2002. <www.semitest.org/site/News/News_Files/files_news2>.*
Chang, E. et al. (1998). "A Scalable Architecture for VLSI Test," *IEEE, Proceedings International Test Conference 1998*, Washington, DC. Paper 20.2, pp. 500-506.
Conti, D. R. (2002). "Mission Impossible? Open Architecture ATE," *IEEE, Proceedings International Test Conference 2002*, Washington, DC. Panel 5.1, p. 1207.
Evans, A.C. (1999). "Applications of Semiconductor Test Economics, and Multisite Testing to Lower Cost of Test," *IEEE, Proceedings International Test Conference 1999*, Washington, DC. Paper 5.2, pp. 113-123.

(Continued)

*Primary Examiner*—Marc S. Hoff
*Assistant Examiner*—Phuong Huynh
(74) *Attorney, Agent, or Firm*—Morrison & Foerster LLP

(57) ABSTRACT

A method for managing a pattern object file in a modular test system is disclosed. The method includes providing a modular test system, where the modular test system comprises a system controller for controlling at least one site controller, and where the at least one site controller controls at least one test module and its corresponding device under test (DUT). The method further includes creating an object file management framework for establishing a standard interface between vendor-supplied pattern compilers and the modular test system, receiving a pattern source file, creating a pattern object metafile based on the pattern source file using the object file management framework, and testing the device under test through the test module using the pattern object metafile.

30 Claims, 14 Drawing Sheets

OTHER PUBLICATIONS

Mirizzi, D.J. et al. (1993). "Implementation of Parrellelsite Test on an 8-Bit Configurable Microcontroller," *IEEE, Proceedings International Test Conference 1993*, Washington, DC. Paper 8.3, pp. 226-235.

Perez, S.M. (2002). "The Consequences of an Open ATE Architecture," *IEEE, Proceedings International Test Conference 2002*, Washington, DC. Panel P5.4, p. 1210.

Schoettmer, U. et al. (1995). "Challenging the 'High Performance—High Cost' Paradigm in Test," *IEEE, Proceedings International Test Conference 1995*, Washington, DC. Paper 37.1, pp. 870-879.

Simpson, W.R. (1995). "Cutting the Cost of Test; the Value-added Way," *IEEE, Proceedings International Test Conference 1995*, Washington, DC. Paper 41.2, p. 921.

West, B.G. (2002). "Open ATE Architecture: Key Challenges," *IEEE, Proceedings International Test Conference 2002*, Washington, DC. Panel P5.6, p. 1212.

Fan, D. et al. (2003). "Case Study—Using STIL as Test Pattern Language," *NPTest, Inc. LLC*, ITC International Test Conference, 32:3, pp. 811-817.

International Search Report mailed on Feb. 16, 2006 for PCT Application No. PCT/JP2005/009816 filed on May 23, 2005, 6 pages.

Portelli, B. et al. (May 22, 1989). "Demonstration of Avionics Module Exchangeability via Simulation (DAMES) Program Overview," *Proceedings of the IEEE 1989 Natl Aerospace and Elect. Conf. (NAECON 1989)*, Dayton, OH, vol. 2:660-667.

Rajsuman, R. (Jan. 30, 2004). "An Overview of the Open Architecture Test System," *Proceedings of the 2nd IEEE Intl Workshop on Elect. Design, Test, and Applications (Delta '04)*, pp. 1-6.

\* cited by examiner

Action = Pattern Data * Timing Data (Limited by TimeSet) * Waves

METHOD AND STRUCTURE TO DEVELOP A TEST PROGRAM FOR SEMICONDUCTOR INTEGRATED CIRCUITS

CROSS-REFERENCE TO RELATED APPLICATIONS

This application is a continuation-in-part application and claims the benefit of co-pending U.S. application Ser. No. 10/772,434, "Method and Structure to Develop a Test Program for Semiconductor Integrated Circuits," filed Feb. 6, 2004, which claims the benefit of application No. 60/447, 839, "Method and Structure to Develop a Test Program for Semiconductor Integrated Circuits," filed Feb. 14, 2003; this application also claims the benefit of U.S. provisional application No. 60/573,577, "Software Development in an Open Architecture Test System" filed May 22, 2004; all of which are assigned to Advantest Corporation and all of which are incorporated herein in their entirety by reference.

BACKGROUND OF THE INVENTION

1. Field of Invention

The present invention relates to the field of automated test equipment (ATE) for semiconductor testing. In particular, the present invention relates to a method and system for managing pattern object files in a modular test system.

2. Description of Related Art

In conventional ATE systems, the contents of pattern object files are closely tied to vendor-specific proprietary hardware. No standard has existed for integrating pattern object files in a test system to work with various vendors' proprietary hardware. In addition, module vendors do not want to publicly share their proprietary formats, which make it difficult to develop a general pattern object format. Moreover, enforcing a common format may create additional overhead that could lead to compromises in the efficiency of pattern use. As a result, there is no common object file format for pattern data to be used among various module vendors. Module vendors have to provide their own pattern compilers to compile pattern source files into pattern object files. This has led to a cumbersome cycle of translating pattern files each time a vendor chooses to use a different vendor's test equipment. It is desired to overcome these disadvantages.

Therefore, there is a need for an open architecture modular test system. In particular, there is a need for a mechanism for managing pattern object files in a modular test system.

SUMMARY OF THE INVENTION

This application describes test program development using object-oriented constructs, e.g., C++ objects and classes. In particular, this method is suitable for developing test programs for an open architecture tester, such as that described in U.S. application Ser. Nos. 60/449,622, 10/404, 002 and 10/403,817, assigned to the assignee of the present invention.

An embodiment of the present invention provides a method for developing a test program by describing test system resources, test system configuration, module configuration, test sequence, test plan, test condition, test pattern and timing information in general-purpose object-oriented, e.g., C/C++, constructs to test a device under test, e.g., an IC, on a semiconductor test system, such as automated test equipment (ATE). The files containing these descriptions are stored in memory, i.e., a computer-readable medium, accessible to the test system or related equipment that uses the files.

Describing test system resources may comprise specifying a resource type, where the resource type is associated with at least one test module for applying a test to the IC, specifying a parameter type associated with the resource type, and specifying a parameter of the parameter type.

Describing test system configuration may comprise specifying a site controller for controlling at least one test module, where each test module applies a test to the IC, and specifying an input port of a module connection enabler. The test system couples the site controller to the module connection enabler at the specified input port, and the module connection enabler couples the site controller to a test module. The module connection enabler may be implemented as a switch matrix.

Describing module configuration may comprise specifying a module identifier for specifying a module type, specifying executable code for controlling a test module of the module type specified by the module identifier, and specifying a resource type associated with the test module. The executable code may take the form of a dynamic link library.

Describing module configuration may further involve the user specifying a slot identifier for specifying an output port of the module connection enabler, where the test system couples the test module to the module connection enabler at the output port, and the module connection enabler couples the test module to a corresponding site controller. The user may also specify a vendor identifier for identifying the provider of the test module, and an identifier of the maximum number of resource units available in connection with the resource type. The resource type may be, for example, digital tester pins and the resource units tester channels. Alternatively, the tester channel resource units may also correspond to resource types such as, for example, analog tester pins, RF tester pins, power supply pins, digitizer pins, and arbitrary waveform generation pins. An indicator relating to which resource units are disabled may also be provided. The resource units indicated as disabled may represent defective resource units of the test module.

Describing test conditions may comprise specifying at least one test condition group, specifying a specification set including at least one variable; and specifying a selector for selecting an expression to be bound to a variable. Association of the test condition group with a selector for the specification set defines a test condition.

Describing a test sequence may comprise specifying the order (or flow) in which various tests can be applied.

Describing test patterns may comprise specifying the test patterns, associated voltage and current levels, transitions in signal values, corresponding rise and fall times and associated timing.

An embodiment of the present invention also includes the use of preheader files. A preheader file is compiled to create a header file for a class associated with a test entity. The preheader includes a parameter block for specifying parameters for setting at least one attribute of the test entity, and a template block for specifying source code that is inserted by a compiler into the header file for the test entity class. The header file may be a C++ header file. The test entity may be a test and the test entity class may be a test class, for example. The parameters may relate to pattern lists and test conditions, for example.

In one embodiment, a method for managing a pattern object file in a modular test system includes providing a modular test system, where the modular test system comprises a system controller for controlling at least one site controller, and where the at least one site controller controls at least one test module and its corresponding device under test (DUT). The method further includes creating an object file management framework for establishing a standard interface between vendor-supplied pattern compilers and the modular test system, receiving a pattern source file at the site controller, creating a pattern object metafile based on the pattern source file using the object file management framework, and testing the device under test through the test module using the pattern object metafile.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

DETAILED DESCRIPTION OF THE PREFERRED EMBODIMENTS

Methods and systems are provided for managing pattern object files in a modular test system. The following description is presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

The present invention is generally described in terms of the Open architecture test system as disclosed in U.S. application Ser. Nos. 60/449,622, 10/404,002 and 10/403,817 by the same assignee. Those skilled in the art will recognize, however, that embodiments of the test program development system and method of the present invention are applicable not only to an open tester architecture, but also to fixed tester architectures, as well.

A description of the open architecture test system may be found in U.S. application Ser. No. 10/772,372, "Method and Apparatus for Testing Integrated Circuits," which claims the benefit of U.S. application No. 60/449,622 by the same assignee.

Figure 1:
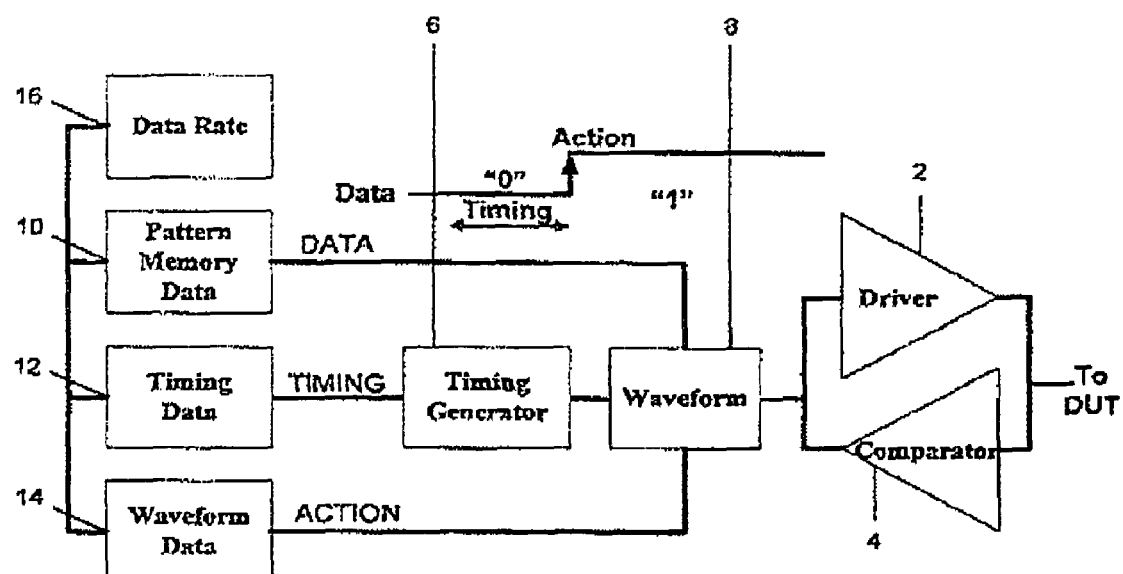
FIG. 1 illustrates a conventional tester architecture.

FIG. 1 illustrates a generalized architecture of a conventional tester showing how a signal is generated and applied to a device-under-test (DUT). Each DUT input pin is connected to a driver 2 that applies test data, while each DUT output pin is connected to a comparator 4. In most cases, tri-state driver-comparators are used so that each tester pin (channel) can act either as an input pin or as an output pin. The tester pins dedicated to a single DUT collectively form a test site that works with an associated timing generator 6, waveform generator 8, pattern memory 10, timing data memory 12, waveform memory data 14, and block 16 that define the data rate.

Figure 2:
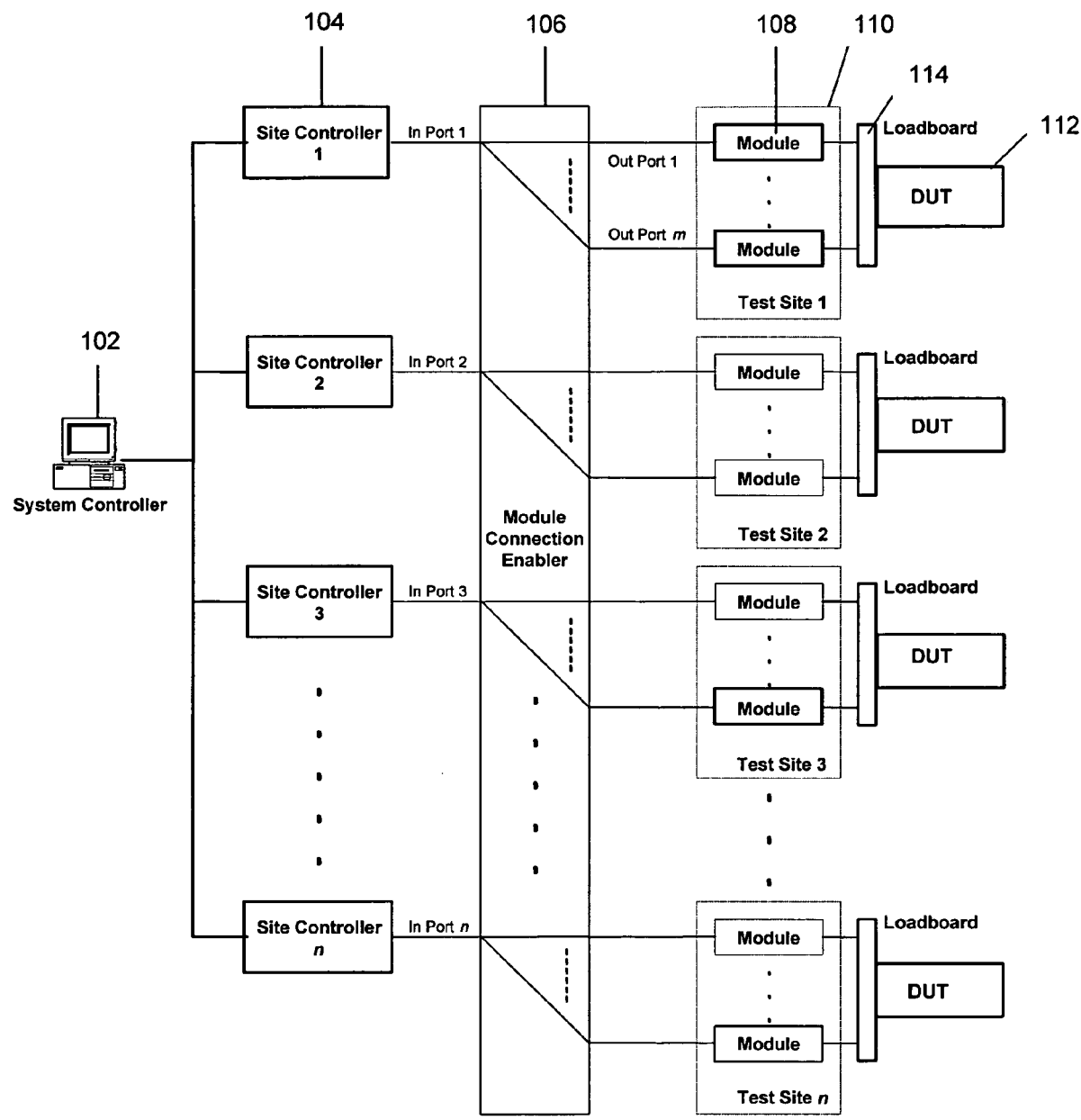
FIG. 2 illustrates a tester architecture according to an embodiment of the present invention.

FIG. 2 illustrates a system architecture 100 according to an embodiment of the present invention. A system controller (SysC) 102 is coupled to multiple site controllers (SiteCs) 104. The system controller may also be coupled to a network to access files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). Possible hardware implementations include dedicated connections, switch connections, bus connections, ring connections, and star connections. The module connection enabler 106 may be implemented by a switch matrix, for example. Each test site 110 is associated with a DUT 112, which is connected to the modules of the corresponding site through a loadboard 114. In one embodiment, a single site controller may be connected to multiple DUT sites.

The system controller 102 serves as the overall system manager. It coordinates the site controller activities, manages system-level parallel test strategies, and additionally provides for handler/probe controls as well as system-level data-logging and error handling support. Depending on the operational setting, the system controller 102 can be deployed on a CPU that is separate from the operation of site controllers 104. Alternatively a common CPU may be shared by the system controller 102 and the site controllers 104. Similarly, each site controller 104 can be deployed on its own dedicated CPU (central processing unit), or as a separate process or thread within the same CPU.

The system architecture can be conceptually envisioned as the distributed system shown in FIG. 2 with the understanding that the individual system components could also be regarded as logical components of an integrated, monolithic system, and not necessarily as physical components of a distributed system.

in another embodiment, the system controller and the site controllers may be implemented with one or more computing devices. Each computing device may include an operating system that includes procedures for handling various basic system services and for performing hardware dependent tasks;

an application layer for interfacing between the operating system and other application programs of the test system, such as application programs for managing pattern object files;

a processor unit for executing instructions from the operating system and application programs; and a memory unit for storing data of the test system, the memory unit may include random access memory, non-volatile memory, or mass storage device.

The application programs may include executable procedures, sub-modules, tables and other data structures. In other embodiments, additional or different modules and data structures may be used, and some of the modules and/or data structures listed above may not be used. The application programs may be implemented in software and/or in hardware. When implementing in hardware, they may be implemented in application specific integrated circuits (ASICs) or in field programmable gate arrays (FPGAs).

Figure 3:
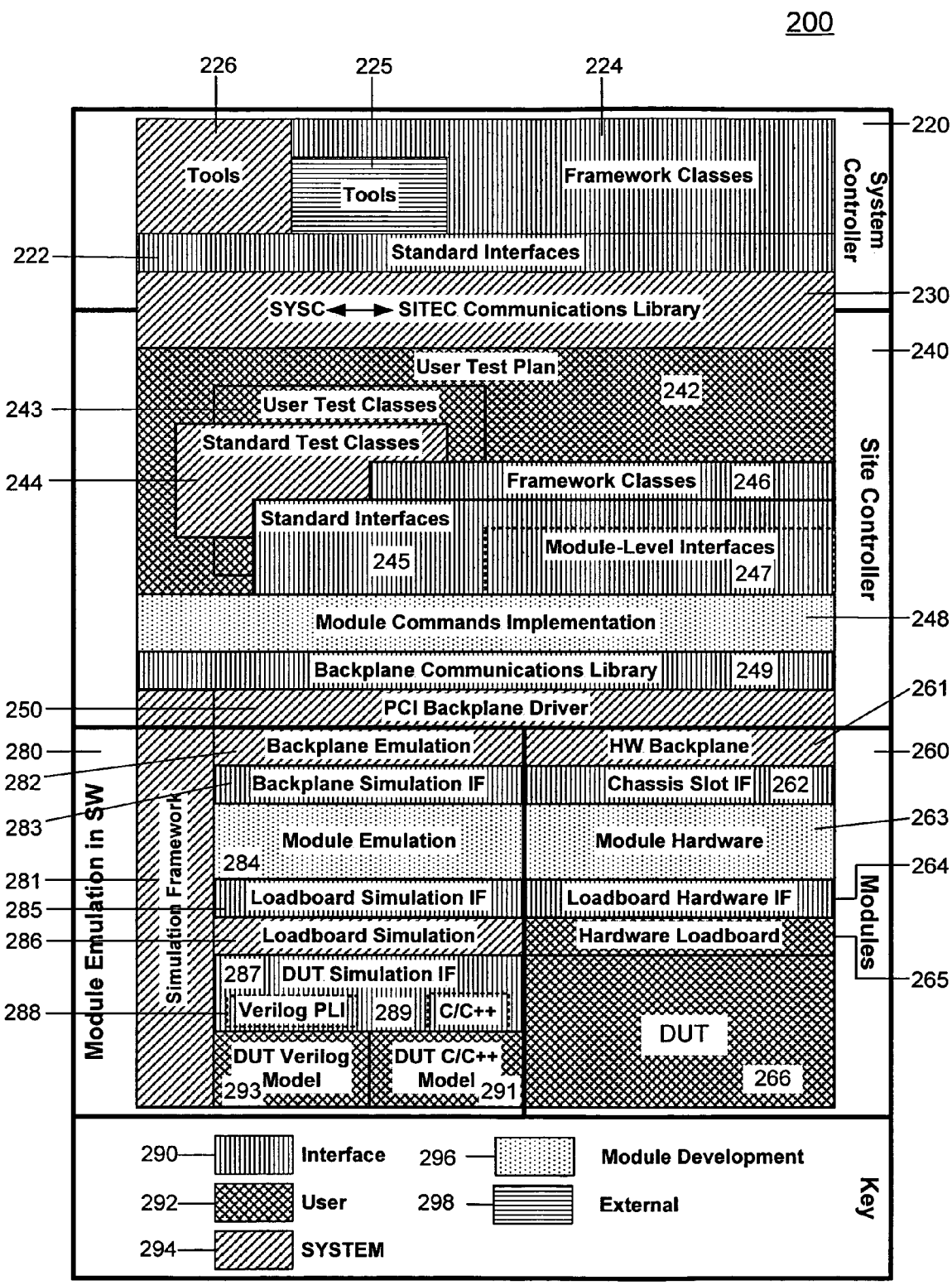
FIG. 3 illustrates a tester software architecture according to an embodiment of the present invention.

FIG. 3 illustrates a software architecture 200 according to an embodiment of the present invention. The software architecture 200 represents a distributed operating system, having elements for the system controller 220, at least one site controller 240, and at least one module 260 in correspondence to related hardware system elements 102, 104, 108. In addition to the module 260, the architecture 200 includes a corresponding element for module emulation 280 in software.

As an exemplary choice, the development environment for this platform can be based on Microsoft Windows. The use of this architecture has side benefits in program and support portability (e.g., a field service engineer could connect a laptop which runs the tester operating system to perform advanced diagnostics). However, for large compute-intensive operations (such as test pattern compiles), the relevant software can be made as an independent entity capable of running independently to allow job scheduling across distributed platforms. Related software tools for batch jobs are thus capable of running on multiple platform types.

As an exemplary choice, ANSI/ISO standard C++ can be taken as the native language for the software. Of course, there are a multitude of options available (to provide a layer over the nominal C++ interfaces) that allows a third party to integrate into the system with an alternative language of its own choice.

FIG. 3 illustrates a shading of elements according to their organization by nominal source (or collective development as a sub-system) including the tester operating system, user components 292 (e.g., supplied by a user for test purposes), system components 294 (e.g., supplied as software infrastructure for basic connectivity and communication), module development components 296 (e.g., supplied by a module developer), and external components 298 (e.g., supplied by external sources other than module developers).

From the perspective of source-based organization, the tester operating system (TOS) interface 290 include: System Controller to Site Controller interfaces 222, framework classes 224, Site Controller to Module interfaces 245, framework classes 246, predetermined module-level interfaces, backplane communications library 249, chassis slot IF (Interface) 262, loadboard hardware IF 264, backplane simulation IF 283, loadboard simulation IF 285, DUT simulation IF 287, Verilog PLI (programming language interface) 288 for DUT's Verilog model and C/C++ language support 289 for DUT's C/C++ model.

User components 292 include: a user test plan 242, user test classes 243, hardware loadboard 265, and DUT 266, a DUT Verilog model 293 and a DUT C/C++ model 291.

System components 294 include: system tools 226, communications library 230, test classes 244, a backplane driver 250, HW backplane 261, simulation framework 281, backplane emulation 282, and loadboard simulation 286.

Module-development components 296 include: module commands implementation 248, module hardware 263, and module emulation 284.

External components 298 include external tools 225.

The system controller 220 includes interfaces 222 to site controller, framework classes 224, system tools 226, external tools 225, and a communications library 230. The System Controller software is the primary point of interaction for the user. It provides the gateway to the Site Controllers of the invention, and synchronization of the Site Controllers in a multi-site/DUT environment as described in U.S. application No. 60/449,622 by the same assignee. User applications and tools, graphical user interface (GUI)-based or otherwise, run on the System Controller. The System Controller also may act as the repository for all Test Plan related information, including Test Plans, test patterns and test parameter files. The memory storing these files may be local to the system controller or offline, e.g., connected to the system controller through a network. A test parameter file contains parameterization data for a Test class in the object oriented environment of an embodiment of the invention.

Third party developers can provide tools in addition to (or as replacements for) the standard system tools 226. The standard interfaces 222 on the System Controller 220 include interfaces that the tools use to access the tester and test objects. The Tools (applications) 225, 226 allow interactive and batch control of the test and tester objects. The tools include applications for providing automation capabilities (through, for example, the use of SECS/TSEM, etc.)

The Communications library 230 residing on the system controller 220 provides the mechanism to communicate with the Site Controllers 240 in a manner that is transparent to user applications and test programs.

The Interfaces 222 resident in memory associated with the System Controller 220 provide open interfaces to the framework objects that execute on the System Controller. Included are interfaces allowing the Site Controller-based module software to access and retrieve pattern data. Also included are interfaces that applications and tools use to access the tester and test objects, as well as scripting interfaces, which provide the ability to access and manipulate the tester and test components through a scripting engine. This allows a common mechanism for interactive, batch and remote applications to perform their functions.

The Framework Classes 224 associated with the System Controller 220 provide a mechanism to interact with these above-mentioned objects, providing a reference implementation of a standard interface. For example, the site controller 240 of the invention provides a functional test object. The system controller framework classes may provide a corresponding functional test proxy as a remote system controller-based surrogate of the functional test object. The standard functional test interface is thus made available to the tools on the system controller 220. The framework classes effectively provide an operating system associated with the host system controller. They also constitute the software elements that provide the gateway to the Site Controllers, and provide synchronization of the Site Controllers in a multi-site/DUT environment. This layer thus provides an object model in an embodiment of the invention that is suitable for manipulating and accessing Site Controllers without needing to deal directly with the Communications layer.

The site controller 240 hosts a user test plan 242, user test classes 243, standard test classes 244, standard interfaces 245, site controller framework classes 246, module high level command interfaces (i.e., predetermined module-level interfaces 247, module commands implementation 248, backplane communications library 249, and a backplane driver 250. Preferably most of the testing functionality is handled by the site controllers 104/240, thus allowing independent operation of the test sites 110.

Figure 4:
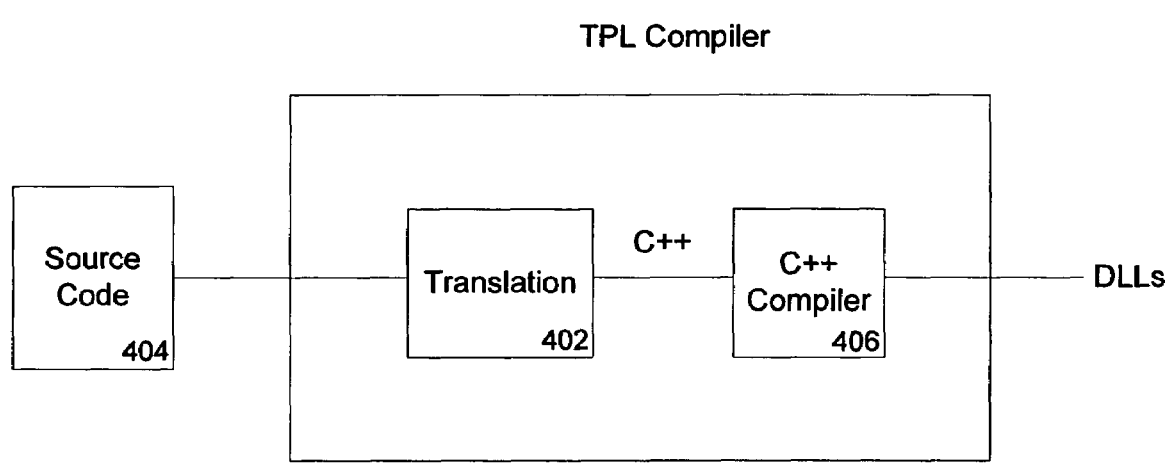
FIG. 4 illustrates a test program compiler according to an embodiment of the present invention.

A Test Plan 242 is written by the user. The plan may be written directly in a standard computer language employing object-oriented constructs, such as C++, or described in a higher level test programming language to produce C++ code, which can then be compiled into the executable test program. For test program development, one embodiment of the invention employs assignee's inventive Test Program Language (TPL) compiler. Referring to FIG. 4, the test program compiler 400 acts in part as a code generator including a translator section 402 to translate a test program developer's source files 404 describing tests and associated parameters into object-oriented constructs, such as C++ code. A compiler section 406, in turn, compiles and links the code into executables, e.g., DLLs, to create the test program that may be executed by the tester system. Although the application of the TPL code generator/translator to test systems is novel, please note that code generators are known in the art. Also, the compiler section may be a standard C++ compiler known in the art.

The test plan creates test objects by using the Framework Classes 246 and/or standard or user supplied Test Classes 244 associated with the site controllers, configures the hardware using the Standard Interfaces 245, and defines the test plan flow. It also provides any additional logic required during execution of the test plan. The test plan supports some basic services and provides an interface to the services of underlying objects, such as debug services (e.g., breakpointing), and access to underlying framework and standard classes.

The source code input to the test program compiler 400 includes a Test Plan description file that specifies the objects used in a test plan and their relationships to one another. This file is translated to C++ code that is executed on the Site Controller in the form of an implementation of a standard interface, which may be denoted ITestPlan. This code is packaged into a Windows dynamic link library (DLL), which may be loaded onto the Site Controller. The Test Program DLL is generated to have standard known entry points that the Site Controller software can use to generate and return the TestPlan object it contains. The Site Controller software loads the Test Program DLL into its process space and uses one of the entry points to create an instance of the Test Plan object. Once the Test Plan object has been created, the Site Controller software can then execute the test plan.

The Framework classes 246 associated with the site controllers are a set of classes and methods that implement common test-related operations. The site controller-level framework includes, for example, classes for power supply and pin electronics sequencing, setting level and timing conditions, obtaining measurements, and controlling test flow. The framework also provides methods for runtime services and debugging. The framework objects may work through implementing the standard interfaces. For example, the implementation of the TesterPin framework class is standardized to implement a general tester pin interface that test classes may use to interact with hardware module pins.

Certain framework objects may be implemented to work with the help of the module-level interfaces 247 to communicate with the modules. The site controller framework classes effectively act as a local operating system supporting each site controller.

In general more than ninety percent of the program code is data for the device test, and the remaining ten percent of the code realizes the test methodology. The device test data is DUT-dependent (e.g., power supply conditions, signal voltage conditions, timing conditions, etc.). The test code consists of methods to load the specified device conditions on to ATE hardware, and also those needed to realize user-specified objectives (such as datalogging). The framework of an embodiment of the invention provide a hardware-independent test and tester object model that allows the user to perform the task of DUT test programming.

To increase the reusability of test code, such code may be made independent of any device-specific data (e.g., pin name, stimulus data, etc.), or device-test-specific data (e.g., conditions for DC units, measurement pins, number of target pins, name of pattern file, addresses of pattern programs). If code for a test is compiled with data of these types, the reusability of the test code would decrease. Therefore, according to an embodiment of the invention, any device-specific data or device-test-specific data may be made available to the test code externally, as inputs during code execution time.

In an embodiment of the invention, a Test Class, which is an implementation of a standard test interface, denoted here as ITest, realizes the separation of test data and code (and hence, the reusability of code) for a particular type of test. Such a test class may be regarded as a "template" for separate instances of itself, which differ from each other only on the basis of device-specific and/or device-test-specific data. Test classes are specified in the test plan file. Each Test class typically implements a specific type of device test or setup for device test. For example, an embodiment of the invention may provide a specific implementation of the ITest interface, for example, FunctionalTest, as the base class for all functional tests for DUTs. It provides the basic functionality of setting test conditions, executing patterns, and determining the status of the test based on the presence of failed strobes. Other types of implementations may include AC and DC test classes, denoted here as ACParametricTests and DCParametricTests.

All test types may provide default implementations of some virtual methods (e.g., init( ), preExec( ), and postExec( )). These methods become the test engineer's entry points for overriding default behavior and setting any test-specific parameters. However, custom test classes can also be used in test plans.

Figure 5:
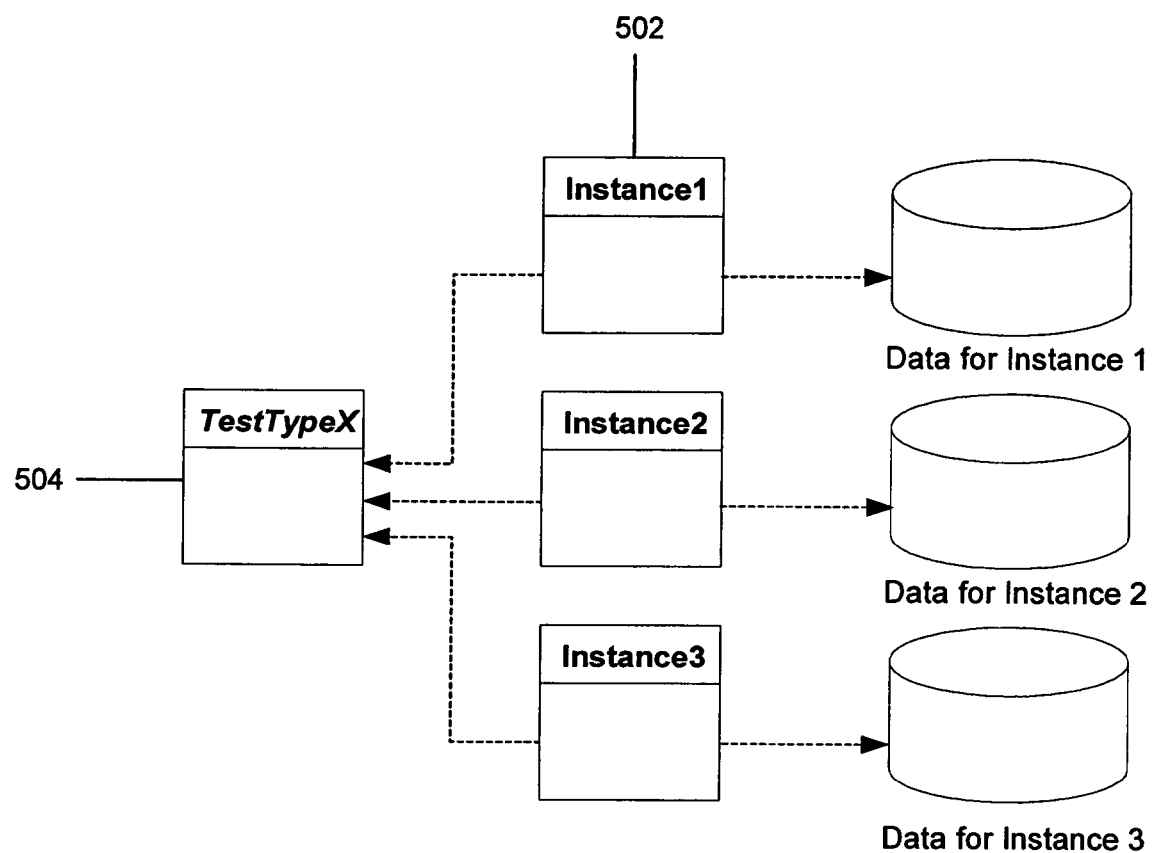
FIG. 5 illustrates how different test instances may be derived from a single test class according to an embodiment of the present invention.

Test classes allow the user to configure class behavior by providing parameters that are used to specify the options for a particular instance of that test. For example, a Functional Test may take parameters PList and TestConditionS, to specify the Pattern List to execute, and the Level and Timing conditions for the test, respectively. Specifying different values for these parameters (through the use of different "Test" blocks in a test plan description file) allows the user to create different instances of a Functional Test. FIG. 5 illustrates how different test instances may be derived from a single test class. These classes may be programmed directly in object-oriented constructs, such as C++ code, or designed to allow a test program compiler to take the description of the tests and their parameters from a test plan file and generate corresponding C++ code, which can be compiled and linked to generate the test program. A Template Library may be employed as the general-purpose library of generic algorithms and data structures. This library may be visible to a user of the tester, so that the user may, for example, modify the implementation of a test class to create a user-defined test class.

As to user-developed test classes, an embodiment of the system supports integration of such test classes into the framework in that all test classes derive from a single test interface, e.g., ITest, so that the framework can manipulate them in the same way as the standard set of system test classes. Users are free to incorporate additional functionality into their test classes, with the understanding that they have to use custom code in their test programs to take advantage of these additional facilities.

Each test site 110 is dedicated to testing one or more DUTs 106, and functions through a configurable collection of test modules 112. Each test module 112 is an entity that performs a particular test task. For example, a test module 112 could be a DUT power supply, a pin card, an analog card, etc. This modular approach provides a high degree of flexibility and configurability.

The Module Commands Implementation classes 248 may be provided by module hardware vendors, and implement either the module-level interfaces for hardware modules, or provide module-specific implementations of standard interfaces, depending on the commands implementation method chosen by a vendor. The external interfaces of these classes are defined by pre-determined module level interface requirements, and backplane communications library requirements. This layer also provides for extension of the standard set of test commands, allowing the addition of methods (functions) and data elements.

The Backplane Communications Library 249 provides the interface for standard communications across the backplane, thereby providing the functions necessary to communicate with the modules connected to the test site. This allows vendor-specific module software to use a Backplane Driver 250 to communicate with the corresponding hardware modules. The backplane communications protocol may use a packet based format.

Tester Pin objects represent physical tester channels and derive from a tester pin interface, denoted here as ITesterPin. The software development kit (SDK) of an embodiment of the invention provides a default implementation of ITesterPin, which may be called TesterPin, which is implemented in terms of a predetermined module-level interface, IChannel. Vendors are free to make use of TesterPin if they can implement their module's functionality in terms of IChannel; otherwise, they must provide an implementation of ITesterPin to work with their module.

The standard module interface, denoted here as IModule, provided by the tester system of the invention generically represents a vendor's hardware module. Different vendors may provide different modules. Also, a vendor may provide a plurality of different modules. Vendor-supplied module-specific software for the system may be provided in the form of executables such as dynamic link libraries (DLLs). Software for each module-type from a vendor may be encapsulated in a single DLL. Each such software module is responsible for providing vendor-specific implementations for the module interface commands, which comprise the API for module software development.

There are two aspects of the module interface commands: first, they serve as the interface for users to communicate (indirectly) with a particular hardware module in the system, and second, they provide the interfaces that third-party developers can take advantage of to integrate their own modules into the site controller level framework. Thus, the module interface commands provided by the framework are divided into two types:

The first, and most obvious, are those "commands" exposed to the user through the framework interfaces. Thus, a tester pin interface (ITesterPin) provides methods to get and set level and timing values, while a power supply interface (IPowerSupply) provides methods for powering up and powering down, for example.

In addition, the framework provides the special category of the predetermined module-level interfaces, which can be used to communicate with the modules. These are the interfaces used by framework classes (i.e., "standard" implementations of framework interfaces) to communicate with vendor modules.

However, the use of the second aspect, the module-level interfaces, is optional. The advantage of doing so is that vendors may then take advantage of the implementations of classes such as ITesterPin and IPowerSupply, etc. while focusing on the content of specific messages sent to their hardware by implementing the module-level interfaces. If these interfaces are inappropriate to the vendor, however, they may choose to provide their custom implementations of the framework interfaces (e.g., vendor implementations of ITesterPin, IPowerSupply, etc.). These would then provide the custom functionality that is appropriate for their hardware.

With this open architecture as background, the test program development system of the present invention is further described as follows. Section A below describes rules to describe the test environment in which test program will be used;; section B describes the method and rules for test program development; section C specifies the method and rules to develop a test plan and how to define the main structure of the test program; section D describes how to run a test program on an open architecture test system; section E describes a method and rules for test patterns; section F describes rules to describe the timing of the test patterns; and section G describes rules for the overall tester operation.

A. Components

The test environment comprises a set of files that specify the necessary conditions for bringing up the tester, and for preparing it to run a set of tests. The test environment preferably includes files for:

1. Tester Resource definition: for the specification of the types of tester resources—and supported parameters for such resources—that are available in the open architecture test system.
2. Tester configuration: for the specification of Site Controllers, sites and corresponding mappings.
3. Module configuration: for specification of the hardware module in each site
4. Pin descriptions: for naming of DUT pins, such as signal pins, power supplies, and to describe pin groups,
5. Socket: for the specification of DUT pin-to-tester pin assignments
6. Pin options: for the specification of special options, or modes, for pins.
7. Pattern lists: for the specification of test patterns and their sequence.
8. Patterns: for the specification of test vectors.

Of the above, items 1–3 are created by ICF (installation and configuration files) with information from a CMD (configuration management database), and made available at a well-known location, while items 4–8 are user-specified. This section provides descriptions for the items 1–6 above; items 7–8 are described in more detail in section E. Specific methods and rules are preferably used to develop each of these components; these methods and rules will be described in this section with examples.

A1. The Resource Definition

Each hardware module provides one or more types of hardware resources (resources for short) for use by the test system. The tester Resource Definition is preferably used to declare a set of resource names for the available resource types, and a set of parameter names and types associated with each particular resource type. For instance, the resource name dpin is used to refer to digital tester pins. These resources have parameters such as VIL (for the input low voltage), VIH (for the input high voltage), VOL (for the output low voltage), VOH (for the output high voltage), etc. A resource definition file will have the extension ".rsc". Shown below is an example resource definition, containing some tester resources:

```

# File Resources.rsc

Version 0.1.2;
ResourceDefs
{
    # digital pins
    dpin
    {
        # Low and High voltages for input pins
        Voltage VIL, VIH;
        # Low and High voltages for output pins
        Voltage VOL, VOH;
    }
    # power supplies
    dps
    {
        #
        # PRE_WAIT specifies the time to wait after voltage
        #       reached its final value to start pattern
        #       generation. The actual time that the system
        #       will wait is a small system specified range:
        #       PRE_WAIT−delta <= actual <= PRE_WAIT+delta
        #
        # PRE_WAIT_MIN is a minimum amount to wait after voltage
        #       reached its final value to start pattern generation.
        #       It is a system specified range:
        #       PRE_WAIT_MIN <= actual <=
PRE_WAIT_MIN+delta
        #
        # POST_WAIT specifies the time to wait after pattern
        #       generation ends to shut down the power. The actual
        #       time that the system will wait is a small system
        #       defined range:
        #       POST_WAIT−delta <= actual <= POST_WAIT+delta
        #
        # POST_WAIT_MIN specifies the time to wait after pattern
        #       generation ends to shut down the power. The actual
        #       time that the system will wait is a small system
        #       defined range:
        #       POST_WAIT_MIN <= actual <=
POST_WAIT_MIN+delta
        #
        Time PRE_WAIT;
        Time PRE_WAIT_MIN;
        Time POST_WAIT;
        Time POST_WAIT_MIN;
        # The voltage.
        Voltage VCC;
    }
}
```

Note that the type of a resource parameter (such as Voltage or Time) is preferably a standard engineering unit. Vendors supplying special purpose resources that prefer the specification of different parameters should provide their own resource definition files.

Structure for the Resource Definition

Given below is a structure for the resource definition file in accordance with a preferred embodiment of the present invention:

```
resource-file:
    version-info resource-defs
version-info:
    Version version-identifer ;
resource-defs:
    ResourceDefs { resource-def-list }
resource-def-list:
    resource-def
    resource-def-list resource-def
resource-def:
    resource-name { resource-params-decl-list }
resource-params-decl-list:
    resource-params-decl
    resource-params-decl-list resource-params-decl
resource-params-decl:
    elementary-type-name resource-param-name-list ;
resource-param-name-list:
    resource-param-name
    resource-param-name-list , resource-param-name
```

Undefined non-terminals above are specified below:

1. version-identifier: A sequence of one or more characters from the set [0-9a-zA-Z.]. It represents a version number.
2. resource-name: A sequence of one or more characters from the set [a-zA-Z_0-9], not starting with a digit. It represents the name of a resource, such as dpin or dps.
3. elementary-type-name: A sequence of one or more characters from the set [a-zA-Z_0-9], not starting with a digit. It represents the name of an elementary type, such as Voltage (cf.).
4. resource-param-name: A sequence of one or more characters from the set [a-zA-Z_0-9], not starting with a digit. It represents the name of a resource parameter, such as VIL.

A2. Tester Configuration

The Tester Configuration is a set of rules that is preferably used to list the Site Controllers in a particular system configuration, and the connection of the Site Controllers to the Switch Matrix input ports. In the architecture of an embodiment of the invention, a single Site Controller can be connected to a single switch matrix input port. Thus, in this context, the switch matrix connections serve as implicit identifiers for the Site Controllers in the system (other configurations are possible). The following is an example of a typical tester configuration:

```

# Tester Configuration, Sys.cfg

Version 1.2.5;
SysConfig
{
    #
    # The first field is the hostname of the Site Controller machine;
    # it can be specified as either a dotted-decimal IP address or a
    # domain-qualified hostname.
    #
    # The second field is the switch matrix input port number, which
    # implicitly serves as the identifier for the Site Controller
    # connected to it.
    #
    zeus.olympus.deities.org      2;
    127.0.0.2                     4;
    127.0.0.0                     1; # SITEC-1
    127.0.0.3                     3;
}
```

The system configuration for a particular test-floor system is part of the system profile, and is made available as the system configuration file Sys.cfg. Note that in one embodiment the Site Controller connected to port 1 ("127.0.0.0" in the above example) may enjoy special status, in which it alone configures the Switch Matrix. This "special" Site Controller will be referred to as SITEC-1. Also note that the site controller address in this example is an IP address because the site controllers may be connected to the system controller by an internal network. Conversely, the system controller may be connected to an external network to access files, such as pattern data.

Structure for the Tester Configuration

Given below is a structure for the system configuration file in accordance with an embodiment of the present invention:

```
system-config-file:
    version-info system-config
version-info:
    Version version-identifer ;
system-config:
    SysConfig { site-controller-connection-list }
site-controller-connection-list:
    site-controller-connection
    site-controller-connection-list site-controller-connection
site-controller-connection:
    site-controller-hostname input-port ;
site-controller-hostname:
    ip-address
    domain-qualified-hostname
ip-address:
    octet . octet . octet . octet
domain-qualified-hostname:
    name
    domain-qualified-hostname . name
```

Undefined non-terminals above are specified below:
1. version-identifier: A sequence of one or more characters from the set [0-9a-zA-Z.]. It represents a version number.
2. octet: A nonnegative integer from 0 to 255 (in decimal notation).
3. name: A sequence of one or more characters from the set [a-zA-Z_0-9], not starting with a digit. It represents a name segment in a domain-qualified hostname.
4. input-port: A nonnegative integer, in decimal notation.

A3. The Module Configuration

The Module Configuration allows the specification of the physical configuration of the tester, e.g., the physical location and type of each module in a SYSTEM chassis. This is necessitated by the dynamic nature of the tester bus configuration, which allows a mapping of the tester bus address to the physical slot location. This information allows a hardware discovery process that occurs at system boot-up time to validate the SYSTEM configuration. Each output port of the Switch Matrix defines a physical slot, which is preferably occupied by a single hardware module. Shown below is an example of a module configuration specified in the file Modules.cfg in accordance with an embodiment of the invention:

```

# Module Configuration File, Modules.cfg

Version 0.0.1;
ModuleConfig
{
    #
    # A configuration definition which provides information about
    # the module type that is attached to slots 1–12 and 32–48.
    # Note that a module might provide more than
    # a single type of resource.
    #
    Slot 1–12, 32–48               # Switch matrix output ports
                                   # which use the configuration
                                   # defined below.
    {
        VendorID 1;                # defined vendor code.
        ModuleID 1;                # Vendor-defined id code.
        ModuleDriver mod1.dll;     # Module software.
        #
        # Resource named dpin specifies channels
        # for digital data. The name dpin is not
        # a keyword. It is simply the name of a hardware
        # resource, and is obtained from the resource
        # definition file.
        #
        Resource dpin
        {
            MaxAvailable 32;       # Resource units 1 .. 32.
        }
        Resource analog
        {
            MaxAvailable 16;       # Resource units 1 .. 16.
            Disabled      1–8;     # Disabled resources 1 .. 8.
                                   # So, enabled ones are 9 .. 16.
        }
    }
    #
    # A configuration definition which provides information about
    # the module type that is attached to slots 16–30, 50, and 61–64.
    #
    Slot 16–30, 50, 61–64
    {
        Resource dpin
        {
            MaxAvailable 32;       # Max available resource units.
            Disabled   3, 30–32;   # Disabled resources.
        }
        ModuleDriver    "module two.dll";
        VendorID        2;
        ModuleID        2;
    }
```

```

# A configuration definition, which provides information about
# the module type that is attached to slots 65–66.

Slot 65–66
{
      ModuleID      4;              # DPS module with 8
supplies.
      ModuleDriver     mod4.dll;
      VendorID      1;
      #
      # Resource type dps specifying resource units for a
      # Device Power Supply
      #
      Resource dps
      {
         MaxAvailable 4;
         Disabled    1;
      }
   }
}
```

As mentioned earlier, in one embodiment a slot refers to connector through which a hardware module can be connected, such as an output port of the switch matrix. Each configuration definition provides information about the module that may be attached to one or more slots. The VendorID specified in a configuration definition is a unique ID associated with a vendor. The ModuleID refers to a type of module provided by this vendor. There may be several instances of the same ModuleID in a tester configuration. The ModuleDriver refers to a vendor supplied DLL to service the module. Finally, the Resource refers to the units serviced by this module, and provides a name for the resource type; the resource name is obtained from the resource definition file.

The above example describes three configuration blocks in a module configuration file. In one implementation, the first configuration block, slots 1–12 and 32–48 are serviced by a module produced by vendor 1. This vendor provides the module, the identifier "1" to refer to this module type, and the module driver library to control the module. This module can provide two types of resource units, one designated by the resource name "dpin", with preferably a total number of 32 resource units (i.e., "channels"), all of which are available, and the other designated by the resource name "analog", with a total number of 16 resource units, of which only 9 through 16 are available. The second and third configuration blocks are specified in a manner similar to the first configuration.

Note that the provision for allowing channels to be denoted as "disabled" is to allow for the identification of defective resource units on modules that are still functional otherwise. Note also that a configuration block may have one or more slot identifiers. When a block has more than a single slot identifier, then the identified slots are said to be cloned.

The module configuration file, Modules.cfg, is created as part of the system profile by the ICM (installation configuration management system) (with test-floor-specific information provided by the user), and made available at a well-known location. The ICM is a utility that can be local to the test system, e.g., on the system controller, or reside elsewhere on the network to which the system controller is connected. The ICM manages the CMD (configuration management database), and typically updated on hardware changes to the system configuration. ICM allows the user to configure the system, e.g., site controllers and modules. The CMD is a database that stores the configurations. For actual tester configuration/operation ICM generates the configuration files, e.g., module configuration, and other files, and copies them and associated files, such as particular module DLLs, onto the tester.

Structure for Module Configuration

Below is the module configuration structure in accordance with the preferred embodiment:

```
file-contents:
      version-info module-config-def
version-info:
      Version version-identifier ;
module-config-def:
      ModuleConfig { slot-entry-list }
slot-entry-list:
      slot-entry
      slot-entry-list slot-entry
slot-entry:
      Slot positive-integer-list { slot-info }
slot-info:
      required-config-list
required-config-list:
      required-config
      required-config-list required-config
required-config:
      VendorID id-code ;
      ModuleID id-code ;
      ModuleDriver file-name ;
      Resource resource-name { max-spec disabled-spec_opt }
max-spec:
      MaxAvailable positive-integer ;
disabled-spec:
      Disabled positive-integer-list ;
positive-integer-list:
      positive-integer-list-entry
      positive-integer-list , positive-integer-list-entry
positive-integer-list-entry:
      positive-integer
      positive-integer-number-range
positive-integer-number-range:
      positive-integer - pos-integer
```

Undefined non-terminals above are described below:
1. version-identifier: A sequence of one or more characters from the set [0-9a-zA-Z.], where the first character must be from the set [0-9].
2. positive-integer: A sequence of one or more characters from the set [0-9], not starting with a 0.
3. id-code: A sequence of one or more characters from the set [a-zA-Z_0-9].
4. resource-name: A sequence of one or more characters from the set [a-zA-Z_0-9], where the first character must be from the set [a-zA-Z].

Comments are supported; comments start with the '#' character, and extend to the end of the line.

A4. Pin Descriptions

The DUT pin descriptions are described using a Pin Descriptions file. The user makes available a description of the DUT pins in a pin description file, which has the extension .pin. This plain text file contains, at least the following: a listing of the DUT pin names; and initial definitions of named pin groups, which make use of the defined DUT pin names ("initial" since they can be subsequently modified or added to, etc., programmatically).

The separation of this data specification from the Test Plan description allows general reuse of the DUT pin definitions, and allows the pattern compiler to derive pin names (required for resolving references to pin names used in vector specifications) from the pin description file, without having the process tied to a specific Test Plan.

Shown below is an example pin description file:

```

# Pin description file, myDUT.pin.

# Note that this implicitly imports the resource
# configuration file,Resources.rsc.

Version 1.1.3a;
PinDescription
{
    Resource dpin
    {
        A0;
        A1;
        A2;
        A3;
        A4;
        # This syntax expands to the names "ABUS[1]" and
"ABUS[2]"
        ABUS[1:2];
        A5;
        BBUS[1:8];
        DIR;
        CLK;
        Group Grp1
        {
            DIR, CLK, A0, A1, A2, A3, A4, BBUS[1:4]
        }
        Group Grp2
        {
            A5,
            #
            # The following line will expand to
            #"DIR, A1, A2, A4, A5, BBUS[2] ":
            #
            Grp1 − CLK − A0 − A3 − BBUS[1] − BBUS[3:4] + A5,
            BBUS[5:8]
        }
    }
    Resource dps
    {
        vcc1;
        vcc2;
        vcc3;
        Group PSG
        {
            vcc1, vcc2
        }
    }
}
```

Note that the DUT pin and pin group definitions are encapsulated within resource type blocks, to allow the compiler to correlate pin and pin group definitions with the allowable parameter settings for Levels, etc.

The following points about pin descriptions should be noted:

1. Pin groups and pins share the same namespace and have global (i.e., Test Plan) scope. One of the consequences of the global scoping of these names is that pins and pin groups cannot use duplicated names, even when declared in different resource blocks.
2. At least one Resource definition is required in the pin description file.
3. At least one pin name should be defined in each resource.
4. Pin and group names are required to be unique within resource boundaries.
5. The same pin or group name can be defined for two or more resources.

However, duplicates within the same resource are ignored.

6. All pin names and group names that appear in a group definition should have been already defined within that resource.
7. Group definitions, if given, should have at least one pin name or group name (i.e., a group definition cannot be empty).
8. A pin group definition can include a reference to a previously-defined pin group.
9. A pin group definition can include set operations such as addition and subtraction of previously defined pins and/or pin groups.

Structure for the Pin Descriptions

Given below is the structure for the pin descriptions in accordance with the preferred embodiment of the present invention:

```
pin-description-file:
    version-info pin-description
version-info:
    Version version-identifer ;
pin-description:
    PinDescription { resource-pins-def-list }
resource-pins-def-list:
    resource-pins-def
    resource-pins-def-list resource-pins-def
resource-pins-def:
    Resource resource-name { pin-or-pin-group-def-list }
pin-or-pin-group-def-list:
    pin-or-pin-group-def
    pin-or-pin-group-def-list pin-or-pin-group-def
pindef-or-pin-groupdef:
    pin-def ;
    pin-group-def
pin-def:
    pin-name
    pin-name [ index : index ]
pin-group-def:
    Group pin-group-name { pin-group-def-item-list }
pin-group-def-item-list:
    pin-def
    pin-group-def-item-list , pin-def
```

Undefined non-terminals above are specified below:

1. version-identifier: A sequence of one or more characters from the set [0-9a-zA-Z.]. It represents a version number.
2. resource-name: A sequence of one or more characters from the set [a-zA-Z_0-9] not starting with a digit. It represents the name of a resource, such as dpin or dps.
3. pin-name: A sequence of one or more characters from the set [a-zA-Z_0-9] not starting with a digit. It represents the name of a pin A0.
4. pin-group-name: A sequence of one or more characters from the set [a-zA-Z_0-9] not starting with a digit. It represents the name of a pin group ABUS.
5. index: A nonnegative integer. It represents the lower bound or an upper bound on a group of related pins.

A5. The Socket

The Socket specifies the mapping between DUT pin names and physical tester pin (channel) assignments (the physical tester channel numbers are defined in the module configuration file). Note that different Sockets can be used to support different DUT packages and different load board configurations, etc. For a multi-DUT system, the Socket definitions for DUT/channel assignments can support "cloning" of a basic Socket to multiple sites. However, different Sockets (i.e., different physical mappings for the same logical pins) should respect site module partitions. Thus, in addition to providing DUT pin to tester channel assignments, the socket also effectively defines the site partitioning. A Socket file could thus contain definitions for several individual site sockets. Shown below is a sample socket file defining three DUT sites:

```
Version 1.1.3
SocketDef
{
    DUTType CHIP3
    {
        PinDescription dutP3.pin; # The pin description file for CHIP3
        DUT 2 # Uses the full-specification syntax
        {
            SiteController 1; # Switch Matrix input port
            Resource dpin
            {
                #
                # The CLK pin is assigned to resource dpin,
                # slot 2, resource unit (channel) 13.
                #
                CLK       2.13;
                #
                # The DIR pin is assigned to resource dpin,
                # slot 5, resource unit 15.
                DIR       5.15;
                #
                # The following statement will be expanded to
                #     BBUS[7] 5.4
                #     BBUS[6] 5.5
                #     BBUS[5] 5.6
                #
                # So for example, the pin sequence BBUS[7], BBUS[6],
                # BBUS[5] is assigned to the same slot 5, and to
                # resource units 4, 5 and 6 respectively.
                #
                BBUS[7:5]    5.[4:6];
                BBUS[1:4]    7.[21:18];
                BBUS[8]      9.16;
            }
            Resource dps
            {
                #
                # The V1 pin is assigned to resource dps,
                # slot 1, resource unit (channel) 1.
                #
                VCC1 1.1;
                #
                # The VCC2 pin is assigned to resource dps,
                # slot 1, resource unit (channel) 2.
                #
                VCC2 1.2;
            }
        } # End DUT 2
        DUT 1 # This is "cloned" from DUT 2 above
        {
            SiteController 1; # Same Site Controller as for DUT 2
            Resource dpin
            {
                SlotOffset 1;      # Offset value for slots
            }
            Resource dps
            {
                SlotOffset 10; # Offset value for slots
            }
            #
            # The offset syntax above indicates that the slot/resource
            # unit assignments are "cloned" from the first DUT defined
            # for this DUTType, i.e., DUT 2, with the slots offset by
            # the SlotOffset values.
            #
            # Looking at the definition of dpin resource units for
            # DUT 2, CLK is bound to slot 2. Hence, for the present
            # DUT, CLK is bound to slot 2 + 1 = 3.
            #
            # Some of the new bindings in effect due to the offset
            # assignments are shown in the table below:
            #
            # ----------------------------------------------
            #    Pin         Resource     RUnit     Slot
            # ----------------------------------------------
            #    CLK         dpin         13        2 + 1 = 3
            #    DIR         dpin         15        5 + 1 = 6
            #    BBUS[8]     dpin         16        9 + 1 = 10
            #    VCC1        dps          1         1 + 10 = 11
            #    VCC2        dps          2         1 + 10 = 11
            #
        } # End DUT 1
    } # End DUTType CHIP
    DUTType 74LS245
    {
        PinDescription dutLS.pin;
        DUT 3 disabled # This DUT site is disabled, and will be ignored
        {
            ...
        }
    } # End DUTType 74LS245
} # End SocketDef
```

The following points about a Socket file should be noted:

1. The Socket file uses information from both module configuration file, and the user's pin description files for the given DUT types (see specification for PinDescription in the example above). The module configuration information is made implicitly available to the Socket file compiler. The socket file compiler is a sub-part of the pattern compiler that reads and analyzes the socket DUT name to tester channel mapping, and the module configuration and pin description files to set up the mapping of tester pins to DUT pins used by the pattern compiler.
2. At least one DUT site definition per DUT type is required, and it must use the full-specification syntax, as opposed to the SlotOffset syntax. If more than one DUT site definition is provided for the same DUT type, the first one must use the full-specification syntax.
3. Each subsequent DUT site definition (for the same DUT type) may use either the full-specification syntax or the SlotOffset syntax, but not both. This allows individual sites to deviate from a standard pattern (due to, for example, inoperative channels).
4. The bindings derived from the SlotOffset syntax are defined relative to the first site defined for that DUT type (which uses the full-specification syntax).
5. DUT sites do not need to be declared in the actual physical order. This allows a case where the first (physical) site deviates from the pattern.
6. The DUT site IDs are required to be unique across the entire Socket (i.e., across all DUT types defined therein).
7. At least one resource definition is required per DUT site definition.
8. The site definitions must be used in conjunction with the module configuration to determine if the test configuration is single-site/single-DUT or single-site/multi-DUT.

9. In all cases, the Socket file should specify a set of DUT channel mappings which are consistent with the pin description file and the module configuration file.
10. In some cases, it will be desirable to allow the Socket definition to specify that one or more DUT channels are disconnected from the tester (for example, by designating the assigned physical channel as one with the special ID "0.0"). In this case, these DUT channels may be used and referenced in the context of the test program. Operations on such channels will result in system warnings (but not errors.). At load time, pattern data for disconnected channels will be discarded.

Structure for the Socket

Below is the structure for the module configuration in accordance with a preferred embodiment of the present invention:

```
socket-file:
    version-info socket-def
version-info:
    Version version-identifer ;
socket-def:
    SocketDef { device-specific-socket-def-list }
device-specific-socket-def-list:
    device-specific-socket-def
    device-specific-socket-def-list device-specific-socket-def
device-specific-socket-def:
    DUTType DUT-type-name { pin-description-file dut-info-list }
pin-description-file:
    PinDesc pin-description-file-name ;
dut-info-list:
    dut-info
    dut-info-list dut-info
dut-info:
    DUT dut-id { site-controller-input-port resource-info-list }
site-controller-input-port:
    SiteController switch-matrix-input-port-number ;
resource-info-list:
    resource-info
    resource-info-list resource-info
resource-info:
    Resource resource-name { resource-item-unit-assignment-list }
resource-item-unit-assignment-list:
    resource-item-unit-assignment
    resource-item-unit-assignment-list resource-item-unit-assignment
resource-item-unit-assignment:
    resource-item-name slot-number . resource-unit ;
    resource-item-name [ resource-item-index ] slot-number .
resource-unit-index ;
    resource-item-name [ resource-item-index-range ] \
        slot-number . [ resource-unit-index-range ] ;
    resource-item-index-range:
        resource-item-index : resource-item-index
    resource-unit-index-range:
        resource-unit-index : resource-unit-index
```

Undefined non-terminals above are specified below:
1. version-identifier: A sequence of one or more characters from the set [0-9a-zA-Z]. It represents a version number.
2. DUT-type-name: A sequence of one or more characters from the set [0-9a-zA-Z], where the first character must not be from the set [0-9]. It represents a type of DUT, such as CHIP3.
3. pin-description-file-name: The simple name of a file, not including its directory name, but including all extensions. The filename is of the syntax recognized by the host operating system, and allows blanks and other characters if enclosed in quotes.
4. switch-matrix-input-port-number: A nonnegative integer in decimal notation to represent the port number of the input port connected to the Site Controller.
5. dut-id: A nonnegative integer in decimal notation to identify an instance of a DUT.
6. resource-name: A sequence of one or more characters from the set [0-9a-zA-Z.], where the first character must not be a digit. It represents the name of a resource defined in a resource file.
7. resource-item-name: A sequence of one or more characters from the set [0-9a-zA-Z.], where the first character must not be a digit. It represents the name of a resource unit, such as a pin or a pin group.
8. resource-item-index: A nonnegative integer in decimal notation that represents a particular member of a group of resource items. When in the context of a resource-item-index-range it represents the lower or upper bound of a contiguous sequence of resource item group.
9. resource-unit-index: A nonnegative integer in decimal notation that represents a particular member of a group of resource units (channels).

When in the context of a resource-unit-index-range it represents the lower or upper bound of a contiguous sequence of resource unit group.

A6. Pins

Note that in addition to logical pin name to physical channel mappings (as provided by the Socket), several attributes can be used for specifying the tester resources. For example, options might be used to define particular hardware configurations for channels, which may be test-specific, vendor-specific, and/or test system-specific. These will be described using the Pin Mode Options, and made available via a Pin Mode Options file.

A Pin Mode Option definition would support the configuration of special options or modes for a tester channel. This could, for example, be used to select and configure channel multiplexing. It is preferred that the Pin Mode Option only be used as part of a Test Plan initialization flow, since it might require significant channel configuration. The Pin Option syntax supports vendor-defined options. An example is shown below:

```
PinModeOptions
{
    clock       IN        double;
    a0          OUT       single;
    ...
};
```

Test Environment Configuration

As pointed out earlier, the resource definition file (Resources.rsc), the system configuration file (Sys.cfg) and the module configuration file (Modules.cfg) are preferably made available at a "well-known" location. This "well-known" location is the directory specified by the value of the system environment variable Tester_ACTIVE_CONFIGS. For example, if the value of Tester_ACTIVE_CONFIGS is the directory F:\Tester_SYS\configs, the system will expect the following files to be present:
F:\Tester_SYS\configs\Resources.rsc
F:\Tester_SYS\configs\Sys.cfg
F:\Tester_SYS\configs\Modules.cfg During installation, the Installation and Configuration Management system (ICM) residing on the host computer will preferably set the value of Tester_ACTIVE_CONFIGS. Every time the ICM creates a new version of one of the above files, it will place the new version in the location pointed to by Tester_ACTIVE_CONFIGS. Note that in addition to the above three files, other system configuration files such as the simulation configuration file are also placed in the location pointed to by Tester_ACTIVE_CONFIGS B. Rules for Test Program Development One of the two principal end-user oriented components of the tester system is the test environment. The other component is the programming facility that the tester makes available for the end user (i.e., test engineer and test class developers).

The principal component of the programming environment is the test plan. The test plan uses test classes (which are different implementations of a test interface denoted Test), which realize the separation of test data and code for particular types of tests.

The plan may be written directly as a C++ test program, or described in a test plan description file, which is processed by a Test Program Generator (translator 402) to produce object-oriented code, such as C++ code. The generated C++ code can then be compiled into the executable test program. The data required for populating a test class instance, such as levels, timings, etc., are specified by the user in the test plan description file.

A test program contains a set of user written files that specify details for running a test on a device. An embodiment of the invention includes sets of rules that permit a user to write these files using C++ constructs.

One of the requirements according to the embodiment of the invention is to follow the modularity of the open architecture test system. A modular development permits users to write individual components dealing with different aspects of the test, and then permits these components to be mixed and matched in various ways to yield a complete test program. A test program in accordance with the preferred embodiment of the present invention comprises a set of files as follows:

files *.usrv for user variables and constants;
files *.spec for specification sets;
files *.lvl for levels;
files *.tim for timings;
files *.tcg for test condition groups;
files *.bdefs for bin definitions;.
files *.ph for a pre-header, files for custom functions and test classes.
files *.ctyp for custom types;
files *.cvar for custom variables; and
files *.tpl for test plans.

The file extensions above are a recommended convention facilitating categorization of files. A single test program will preferably comprise a single test plan file, and the files it imports. An "import" refers to other files with data that is either directly referenced by the importer (the file that specifies the import), or is imported by some other file directly referenced by the importer. The test plan file could define globals, flows, and other such objects within it, or it could import this information from other files. These rules allows any of the above components to be either in their own individual files, or directly inlined into a test plan file. Note that the test plan is similar in concept to a C-language main( ) function.

Test Program Features
User Variables and Constants,
Specification Set,
Levels,
Timings,
Test Conditions
Bin Definition
Pre-Headers
Custom Types
Custom Variables
Test Plan Test program identifiers preferably start with an upper or lower case alphabetical character, and can subsequently have any number of alphabetical, numerical, or underscore (_) characters. It has several keywords which are provided in the description given below. These keywords are visually identified in code in this document using a bold font, such as Version. Keywords are reserved, and preferably not be used as identifiers. There are several special symbols such as {, }, (, ), :, and others which are described below.

Elaboration of Test Objects

An import of a test description file enables the importing file to refer to names of objects made available by the imported file. This allows the importing file to reference the objects named by the imported file. Consider a socket file aaa.soc that imports a pin description file xxx.pin. There could be another bbb.soc file that also imports xxx.pin. However, neither of these imports cause the objects described by xxx.pin to come into existence. They merely reference objects that are already assumed to exist.

The question arises: when do such objects come into existence? This is where the Test Plan file is fundamentally different. In an analogy to C, it would be a file with a main( ) routine in it. An "Import" statement in test plan file will elaborate these objects, that is, cause these objects to come into existence. The test plan mickey.tpl shown below causes the objects in xxx.pin and aaa.soc to be elaborated:

```
# File for Mickey's TestPlan
Version 3.4.5;

# These import statements will actually cause the
# objects to come into existence:

Import xxx.pin; # Elaborates pin and pin-group objects
Import aaa.soc; # Elaborates site socket map objects
# Other imports as necessary
...
Flow Flow1
{
    ...
}
```

An import of xxx.pin in the test plan causes all the pin and pin group objects declared in xxx.pin to be elaborated. This is described as follows: "the file xxx.pin is elaborated". It is not necessary for a Test Plan to directly import all the files that need to be elaborated. A file x is imported by a file y if either of the two statements below is true:

1. y has an import statement that names x; or 2. x is imported by z, and y has an import statement naming z.

When a test program is compiled, it will elaborate all the objects in the files that are imported by the test plan. The set of files imported by a test plan are topologically sorted to yield an order in which the files are elaborated. The set of files imported by a test plan is referred to as the import closure of the test plan. If the import closure of a test plan cannot be topologically sorted, then there must be an imports cycle. Such a situation is erroneous, and will be rejected by the compiler.

User Variables and Constants

Global variables and constants will be defined using the UserVariables and Constants. Constants are objects whose value is bound at compile time, and cannot be changed. The maximum integer value, for instance, would be a constant. On the other hand, the expression bound to variables can change at runtime via an API.

Integer,
UnsignedInteger,
Double,
String,
Voltage in Volts (V),
VoltageSlew in Volts per Second (VPS),
Current in Amps (A),
Power in Watts (W),
Time in Seconds (S),
Length in Meters (M),
Frequency in Hertz (Hz),
Resistance in Ohms (Ohms), and
Capacitance in Farads (F).

The types Integer, UnsignedInteger, Double, and String are referred to as Basic Types. The Basic Types have no measurement units. The Elementary Types which are not basic types are a Double, with an associated measurement unit and a scale. The scaling symbols are common engineering scaling symbols:

p (pico) for 10–12, as in pF (pico-farad)
n (nano) for 10–9, as in nS (nano-second)
u (micro) for 10–6, as in uS (micro-second)
m (milli) for 10–3, as in mV (milli-amp)
k (kilo) for 10+3, as in kOhm (kilo-ohm)
M (mega) for 10+6, as in MHz (mega-hertz)
G (giga) for 10+9, as in GHz (giga-hertz)

A separate file with user variables and constants will have the extension .usrv. Below is an example of a file with some global constants. An example of a file with some variables is given later.

```
# -----------------------------------------------------
# File limits.usrv
# -----------------------------------------------------
Version 1.0.0;

# This UserVars collection declaration declares a set of
# globally available variables and constants.

UserVars
{
    # Some constant Integer globals used in various places.
    Const Integer     MaxInteger = 2147483647;
    Const Integer     MinInteger = -2147483648;
    # Smallest value such that 1.0 + Epsilon != 1.0
    Const Double Epsilon = 2.2204460492503131e-016;
    # Some important constants related to Double
    Const Double MaxDouble = 1.7976931348623158e+308;
    Const Double MinDouble = - MaxDouble;
    Const Double ZeroPlus = 2.2250738585072014e-308;
    Const Double ZeroMinus = - ZeroPlus;
}
```

The set of UserVars declared above are considered definitions of the variable on the left of the '='. As a result, a single occurrence of the definition of a variable or constant is preferred, and it should be initialized.

As mentioned earlier, constants should not be changed once they are defined. The expression bound to a constant can involve previously defined constants and literal values. Variables, on the other hand, can be changed via an API. The expression bound to a variable can involve previously defined variables, constants and literal values.

Each variable is bound to an expression object which is maintained at runtime. This provides the capability of changing the expression associated with a variable at runtime, and then re-evaluating all the variables. The expression object is a parsed form of the right hand side of a variable or constant definition. In one embodiment, no facility is provided for the changing of constants at runtime. Their value is preferably fixed at compile time.

Any number of such files with globals can exist in the import closure of a test plan. While the above globals file is a set of numeric limits, here is a set of engineering globals using engineering measurement units, and some random user variables:

```
# -----------------------------------------------------
# File myvars.usrv
# -----------------------------------------------------
Version 0.1;

# This declares a UserVars collection of some engineering
# globals.

UserVars MyVars
{
    # Engineering quantities.
    Const Voltage VInLow = 0.0;            # 0 Volts
    Const Voltage VInHigh = 5.0;           # 5 Volts
    Const Voltage VOutLow = 400.0 mV;      # 400 milliVolts
    Const Voltage VOutHigh = 5.1;          # 5.1 Volts
    Const Time DeltaT = 2.0E-9;            # 2 nanoseconds
    Const Time ClkTick = 1.0ns;            # 1 nanosecond
    Const Resistance R10 = 10.0 kOhms;     # 10 kilo Ohms
    # Some variables are declared below.
    Current ILow = 1.0 mA;                 # 1 milliAmp
    Current IHigh = 2.0 mA;                # 2 milliAmp
    Power PLow = ILow * VInLow;            # Low power value
    Power PHigh = IHigh * VInHigh;         # High power value
    #
    # An array of low values for all A bus pins.
    # The vil for A0 will be in ABusVil[0], for A1
    # in ABusVil[1], and so on.
    #
    Voltage ABusVil[8] = {1.0, 1.2, Others = 1.5};
}
```

The compiler preferably checks that units and types match up. Note that since a Voltage times a Current yields a Power, the equations for PLow and PHigh above will compile. However, a statement such as the following will typically not compile:

```

# Does not compile because a Current and a Voltage
    cannot be added
# to yield a Power.

Power Pxxx=IHigh+VInHigh;
```

The compiler will allow certain automatic type conversions:

Power Pxxx=2; # Set the power to 2.0 watts
Integer Y=3.6; # Y gets assigned 3
Power Pyyy=Y; # Pyyy gets assigned 3.0 watts
Double Z=Pyyy; # Pyyy gets converted to a unitless Double Explict type conversion to Double, UnsignedInteger and Integer is also permitted:

Power Pxxx=3.5;
Explicit type conversion is allowed, but not required.
X becomes 3.5

Double X=Double(Pxxx); # X becomes 3.5
Integer Y=Integer(Pxxx); # Y becomes 3
Conversion between unrelated types is also possible, by converting to an intermediate basic type:
Power Pxxx=3.5;
Explicit type conversion is required.
Length L=Double(Pxxx); # L becomes 3.5 meters
Voltage V=Integer(Pxxx); # V becomes 3.0 Volts.

The TestPlan object provides a UserVars class which is a collection that contains names and their associated expressions, values, and types. User variables can go into a Default User Variables Collection, or into a Named User Variables Collection. The UserVars declarations in the example above, which have no specified name, go into the default collection. However, it is possible to explicitly name a collection as follows:

```
# Declare X and Y in the MyVars UserVars collection.
UserVars MyVars
{
    Integer X = 2.0;
    #
    # Refers to the above X, and to the globally
    # available MaxInteger from the default
    # UserVars collection.
    #
    Integer Y = MaxInteger - X;
}
# Declare X, Y1 and Y2 in the YourVars UserVars collection.
UserVars YourVars
{
    Integer X = 3.0;
    # Refers to the X from MyVars.
    Integer Y1 = MaxInteger - MyVars.X;
    # Refers to the X declared above.
    Integer Y2 = MaxInteger - X;
}
# More variables being added to the MyVars collection
UserVars MyVars
{
    #
    # Refers to X and Y from the earlier declaration
    # of MyVars.
    #
    Integer Z = X + Y;
}
```

Name resolution within a UserVars collection proceeds as follows: If a name is qualified—i.e., a name comprises two segments separated by a dot—then the variable comes from a named user variables collection, named by the segment that precedes the dot. So, MyVars.X above refers to the X in the MyVars collection. The name "_UserVars" can be used to explicitly denote the default user variables collection.

If the name is not qualified, and there is a constant or variable of the same name in the present collection, then the name resolves to that constant or variable.

Otherwise, the name resolves to a constant or variable in the default user variables collection.

Evaluation of a block of definitions in a UserVars collection can be thought of happening sequentially, from the first definition to the last. This may require each variable being defined before it is used.

Furthermore, there could be several blocks of definitions for a UserVars collection, each of which are defining several variables. All of these blocks of definitions can be thought of as being evaluated in declaration order in the test plan, and then the variables of each block are also checked in declaration order.

Finally, there could be several UserVars collections, each of which define variables over several blocks of definitions. All of the variables again can be thought of as being initialized in declaration order. Thus, in the above example, the evaluation order would be: MyVars.X, MyVars.Y, YourVars.X, YourVars.Y1, YourVars.Y2, MyVars.Z.

When a UserVars collection uses a variable from another collection, it preferably uses just the raw value of the variable. No dependency information is maintained between collections. Thus, dependency based re-evaluation can be limited to a single collection.

Each user variables collection refers to an instance of a C++ UserVars class. The default object of the C++ UserVars class is named "_UserVars". Variables in an UserVars declaration that is unnamed are from the default user variables collection, and are added to this default object. Variables in a named user variables collection are added to an object of the C++ UserVars class having that name. In the above example, the "MyVars" C++ object will end up having the variables X, Y and Z.

C++ for User Variables

User variables are implemented as a collection of n-tuples having the name string, a const/var boolean, the type as an enumerated value and the expression as an expression tree. The expression of a name can be set by a call:

```
enum ElemenaryType {UnsignedIntegerT, IntegerT,
                    DoubleT, VoltageT, ...};
Status setExpression(const String& name,
                     const bool isConst,
                     const elementaryType,
                     const Expression& expression);
```

The type Expression is a type that is a parsed form of the text corresponding to the right hand side of an assignment. There will be a globally available instance of UserVars. For example, the set of user variables in limits.usrv (cf. page) is implemented by the set of calls shown below:

_UserVars.setExpression("MaxInteger", true, IntegerT, Expression(2147483647));

_UserVars.setExpression("MinInteger", true, IntegerT, Expression(-2147483648));

_UserVars.setExpression("Epsilon", true, DoubleT, Expression(2.2204460492503131e-016));

_UserVars.setExpression("MaxDouble", true, DoubleT, Expression(1.7976931348623158e+308));

_UserVars.setExpression("MinDouble", true, DoubleT, Expression("-MaxDouble"));

_UserVars.setExpression("ZeroPlus", true, DoubleT, Expression(2.2250738585072014e-308));

_UserVars.setExpression("ZeroMinus", true, DoubleT, Expression("-ZeroPlus"));

Below are the C++ statements that would be executed for the variables declared in myvars.usrv:

myVars.setExpression("VInLow", true, VoltageT, Expression(0.0));

myVars.setExpression("VInHigh", true, VoltageT, Expression(5.0));

myVars.setExpression("DeltaT", true, TimeT, Expression(2.0E-9));

```
myVars.setExpression("ClkTick", true, TimeT, Expression(1.0E-9));
myVars.setExpression("R10", true, ResistanceT, Expression(10.0E+3));
myVars.setExpression("ILow", false, CurrentT, Expression(1.0E-3));
myVars.setExpression("IHigh", false, CurrentT, Expression(2.0E-3));
myVars.setExpression("PLow", false, PowerT, Expression("ILow * VInLow"));
myVars.setExpression("PHigh", false, PowerT, Expression("IHigh * VInHigh"));
myVars.setExpression("ABusVil[0]", false, VoltageT, Expression(1.0));
myVars.setExpression("ABusVil[1]", false, VoltageT, Expression( 1.2));
myVars.setExpression("ABusVil[2]", false, VoltageT, Expression(1.5));
myVars.setExpression("ABusVil[3]", false, VoltageT, Expression(1.5));
myVars.setExpression("ABusVil[4]", false, VoltageT, Expression(1.5));
myVars.setExpression("ABusVil[5]", false, VoltageT, Expression(1.5));
myVars.setExpression("ABusVil[6]", false, VoltageT, Expression(1.5));
myVars.setExpression("ABusVil[7]", false, VoltageT, Expression(1.5));
```

In the code above, the Expression class preferably has constructors that represent the parsed form of the expression. Expression has several constructors, including one that takes a string literal and parses it, and another that takes a string literal to use just as a string literal. These are distinguished by additional parameters which are not specified above for the sake of readability.

User variables in the default user variables collection will be managed by the _UserVars object of class UserVars. User variables in a named user variables collection Xxx will be managed by a UserVars object named Xxx.

Runtime API for UserVars

The C++ UserVars class that contains these names and expressions exports an application programming interface (API) to evaluate and modify these values at runtime. Modification of the expressions associated with UserVars also addresses the issue of when the UserVars will be reevaluated, and what the impact of the evaluation will be.

Consider first the issue of when the re-evaluation of UserVars as a result of a change should be triggered. If it is triggered immediately upon making a change to the expression, then the user would not be able to make a series of related changes prior to triggering the re-evaluation. Consequently, re-evalutation is triggered by an explicit call by the user.

The impact of reevaluation can be considered next. There are three kinds of re-evaluation that are available in accordance with the preferred embodiment:

UserVars Collection Re-evaluation is re-evaluation limited to a single UserVars collection. The semantics of this operation is to re-evaluate all the variables of this collection once again.

UserVars Targeted Re-evaluation is re-evaluation limited to a change to the expression bound to a single name. This would enable the user to change the expression of a single name, and cause the re-evaluation of the collection to take place, taking into consideration only this particular change.

User Vars Global Re-evaluation is re-evaluation of all UserVars collections. This basically triggers a re-evaluation of all the UserVars collections in declaration order and is quite costly.

All of the above re-evaluations will re-evaluate dependent objects such as Levels, Timings, etc. after re-evaluating the UserVars. Dependent objects will have a dirty bit that represents that it needs re-evaluation. Any time a UserVars collection is programmatically changed, it will also set the dirty bit on all dependent objects. This will trigger re-evaluation of the dependent objects.

In summary, named UserVars collections help contain the re-evaluation impact problem. Re-evaluation is normally limited to a single collection. A simple way of using UserVars would be to only use the default UserVars collection. That way, the ripple effect of making a change can happen to all UserVars. This ripple effect can be limited by having several named UserVars collections.

Multiple collections can refer to variables from one another, but the values bound to the variables are bound at time of use. No dependency is maintained between UserVars collections.

For each elementary type Xxx (UnsignedInteger, Current, Voltage, etc.), a method to get the value:

Status getXxxValue(const String& name, Xxx& value) const;

Note that there is no method to directly set a value, it is done through the call to set the expression, followed by a call to reevaluateCollection( ).

Methods to get and set the expression. The setExpression( ) call can also be used to define a new variable which was not hitherto defined.

```
enum elementaryType
{
    UnsignedIntegerT, IntegerT, DoubleT, VoltageT, ...
};
Status getExpression(const String& name,
                     Expression& expression) const;
Status setExpression(const String& name,
                     const bool isConst,
                     const elementaryType,
                     const Expression& expression);
```

The setExpression( ) call can fail if the expression results in a circular dependency. For instance if the following two calls were made, the second call would fail with a circular dependency failure setExpression("X", true, IntegerT, Expression("Y+1"));
setExpression("Y", true, IntegerT, Expression("X+1"));

This is because the values bound to names are equations and are not assignments. When the value of a variable is changed, a method is provided to re-evaluate all the directly and indirectly dependent names. Equations such as the above pair result in a circular dependency which is not permitted.

Note that this API does not typically support unsolicited re-evaluation. A call to setExpression( ) may not automatically cause the variable, and all other variables that depend on it, to be re-evaluated. The values bound to all variables will stay unchanged until a call to reevaluateCollection( ) (below) occurs.

A method to determine if a particular name is a constant:
Status getIsConst(const String& name, bool& isConst);
A method to get the type:

```
enum ElementaryType
{
    UnsignedIntegerT, IntegerT, DoubleT, VoltageT, ...
};
Status getType(const String& name,
               ElementaryType& elementaryType) const;
```

The UserVars Collection Re-evaluation method.
Status reevaluateCollection( );
The class will maintain equations related to all the variables, and their dependencies. When this method is called, all of the variables will get re-evaluated.

The UserVars Targeted Re-evaluation method.
Status reevaluateTargeted(const String& var);
The class will maintain equations related to all the variables, and their dependencies. When this method is called, the named variable, and all of its dependents will get re-evaluated.

The UserVars Global Re-evaluation method.
   static Status reevaluateAllCollections( );
The class will maintain equations related to all the variables, and their dependencies. When this method is called, reevaluateCollection( ) is called on all UserVars collections in an unspecified order.

A method to determine if a particular name is defined:
Status getIsDefined(const String& name, bool& isDefined) const;
A method to determine all the user variables currently defined:
Status getNames(StringList& names) const;
A method to delete a presently defined variable:
Status deleteName(const String& name);
This operation will fail if the name is used in expressions involving other variables.
A method to get the list of variables and constants that depend on a given variable or constant:
Status getDependents(const String& name, StringList& dependents);

Specification Sets

The Specification Set is used to supply a collection of variables which can take on values based on a Selector. For example, consider the following Specification Set that uses selectors Minnie, Mickey, Goofy and Daisy:

```
# -------------------------------------------------------
# File Aaa.spec
# -------------------------------------------------------
Version 1.0;
Import Limits.usrv;
SpecificationSet Aaa(Minnie, Mickey, Goofy, Daisy)
{
    Double xxx = 1.0, 2.0, 3.0, 4.0;
    Integer yyy = 10, 20, 30, 40;
    Integer zzz = MaxInteger – xxx,
                  MaxInteger – xxx – 1,
                  MaxInteger – xxx – 2,
                  MaxInteger – xxx;
    # The following declaration associates a single
    # value, which will be chosen regardless of the
```

-continued

```
    # selector. It is equivalent to:
    # Integer www = yyy + zzz, yyy + zzz, yyy + zzz, yyy + zzz
    Integer www = yyy + zzz;
}
```

The above Specification Set with the selector Goofy will make the following associations:
xxx=3.0;
yyy=30;
zzz=MaxInteger−xxx−2;
www=yyy+zzz;

The operation of setting the selector on a specification set will be discussed later, when Tests are described.

Syntactically, a specification set a is list of selectors (Minnie, Mickey, Goofy and Daisy in the example above), along with a list of variable definitions (xxx, yyy, zzz and www in the example above). The definition of a variable involves a list of expressions that is either as long as the list of selectors, or comprises a single expression.

Conceptually a specification set can be thought of as a matrix of expressions, whose columns are the Selectors, whose rows are the variables and whose entries are expressions. A particular selector (column) binds each variable (row) to a specific expression (entry). If the list has a single expression, it represents a row with the expression replicated as many times as there are selectors.

Specification sets can appear in two separate contexts. They could be separately declared in a spec file, in which case they appear as shown above. These are named specification sets. Otherwise, local specification sets can be declared within a Test Condition Group. In such a declaration, the specification set will not be provided with a name. It will be a local specification set, of significance only to the enclosing test condition group.

Named specification sets can be modeled after the named user variables collection. The above specification set can be modeled as a UserVars collection named Aaa, which will have expressions for xxx[Minnie], xxx[Mickey], xxx[Goofy], xxx[Daisy], yyy[Minnie], and so on. When a particular selector (say Mickey) is chosen in the context of a test, the values of xxx, yyy and zzz are obtained from the variable name and the specification set name.

A test condition group can have at most one specification set, which is either a local specification set, or a reference to a named specification set. Local specification sets appear only in the context of a test condition group, and have no explicitly specified name. Such a specification set has an implicit name that is defined by the name of the enclosing test condition group. To resolve a name in a test condition group at a point where several specification sets and several UserVars collections are visible, the following rules are applied:

1. If the name is qualified, it must be resolved in a named user variables collection.
  2. If the name is not qualified, the name is resolved in either a local specification set, if it is declared in the test condition group, or in the named specification set, if one is referenced in the test condition group.
  3. If the name is not resolved by the earlier rules, it is resolved in the default user variables collection.

To illustrate these rules, consider the following example using Test Conditions Groups (to be described later)

```
Version 1.2.3;
Import limits.usrv; # Picks up the limits UserVars file above.
Import aaa.spec; # Picks up the Specification Set AAA above.
TestConditionGroup TCG1
{
    SpecificationSet(Min, Max, Typ)
    {
        vcc = 4.9, 5.1, 5.0;
    }
    # Rule 1: Resolution in a named user variables collection.
    # A reference to MyVars.VInLow refers to VInLow from MyVars.
    # Rule 2: Resolution in a local specification set.
    # A reference to "vcc" here will resolve in the context
    # of the local specification set above.
    # Rule 3: Resolution in default user variables collection.
    # A reference to "MaxInteger" here will resolve to limits.usrv.
    # Error: Resolution of xxx
    # A reference to xxx does not resolve because it is neither in
    # the local specification set, nor in limits.usrv.
    # Error: Resolution of Aaa.xxx
    # Looks for a named UserVars collection named Aaa. The named
    # specification set does not qualify.
}
TestConditionGroup TCG2
{
    SpecificationSet Aaa; # References the imported specification set
    # Rule 1: Resolution in a named user variables collection.
    # A reference to MyVars.VInLow refers to VInLow from MyVars.
    # Rule 2: Resolution in a named specification set.
    # A reference to "xxx" here will resolve in the context
    # of the local specification set Aaa above.
    # Rule 3: Resolution in default user variables collection.
    # A reference to "MaxInteger" here will resolve to limits.usrv.
    # Error: Resolution of vcc
    # A reference to vcc does not resolve because it is neither in
    # the named specification set Aaa, nor in limits.usrv.
    # Error: Resolution of Aaa.xxx
    # Looks for a named UserVars collection named Aaa. The named
    # specification set does not qualify.
}
```

Resolution of a name in a specification set (rule above) requires that a selector of the set be enabled at the time the name resolution is required. This will be enforced by the fact that the test condition group will be referenced in a Test by specifying a selector.

C++ for Specification Sets

Using the above rules, Specification sets can be implemented by the C++ SpecificationSet class. The SpecificationSet class has essentially the same API as the UserVars class, except for an extra String parameter for the selector. Consequently, this API is not described in detail.

All named specification sets are preferably associated with a C++ object of that name. A local specification set in the context of a test condition group will have a name that is unique to that test condition group. It is illegal to refer to a variable of a local specification set outside the context of the test condition group that it is defined in.

Levels

The Levels are used to specify parameters of pins and pin groups. It is a collection of declarations of the form:

```
<pin-or-pin-group-name>
{
    <pin-param-1> = xxx;
    <pin-param-2> = yyy;
    ...
}
```

Such a declaration specifies the setting of the various parameters of the named pin or pin-group. For example, such a statement could be used to set the VIL values for all pins in the InputPins group, as shown in the example below:

```
# ---------------------------------------------------------
# File CHIPlevels.lvl
# ---------------------------------------------------------
Version 1.0;
Import CHIP3resources.rsc;
Import CHIP3pins.pin;
Levels CHIP3Levels
{
    #
    # Specifies pin-parameters for various pins and
    # pin groups using globals and values from
    # the specification set.
    #
    # The order of specification is significant.
    # Pin parameters will be set in order from
    # first to last in this Levels section, and
    # from first to last for each pin or pin-group
    # subsection.
    #
    # From the imported pin description file CHIP3pins.pin,
    # the InPins group is in the "dpin" resource. From the
    # imported resource definition file CHIP3resources.rsc,
    # the "dps" resource has parameters named VIL and VIH.
    #
    InPins { VIL = v_il; VIH = v_ih + 1.0; }
    # The following statement requires a delay of 10 uS after
    # the call to set the InPins levels. Actual delay will be
    # a small system defined range around 10.0E-6.
    #           10.0E-6 - delta <= actual <= 10.0E-6 + delta
    Delay 10.0E-6;
    #
    # For the OutPins, the levels for the parameters
    # VOL and VOH are specified.
    #
    OutPins { VOL = v_ol / 2.0; VOH = v_oh; }
    # The clock pin will have special values.
    Clock { VOL = 0.0; VOH = v_ih / 2.0; }
    # A Delay of 10 uS after the call to set Clock levels.
    # This is a minimum delay, that is guaranteed to be for
    # at least 10.0 uS, though it may be a little more:
    #           10.0E-6 <= actual <= 10.0E-6 + delta
    MinDelay 10.0 uS;
    #
    # The PowerPins group is in the "dps" resource. Pins of this
    # pin group have special parameters:
    #       PRE_WAIT specifies the time to wait after voltage
    #           reached its final value to start pattern
    #           generation. Actual wait time will be a small
    #           system defined range around PRE_WAIT (see)
    #       POST_WAIT specifies the time to wait after pattern
    #           generation ends to shut down the power. Actual
    #           wait time will be a small system defined range
    #           around PRE_WAIT (see).
    #
    PowerPins
    {
        PRE_WAIT = 10.0 ms;
        POST_WAIT = 10.0 ms;
        # VCC reaches its final value of 2.0 V from its
        # present value in a ramp with a Voltage Slew Rate
        # of ±.01 Volts per Second.
        VCC = Slew(0.01, 2.0 V);
    }
}
Levels CHIP4Levels
{
    # ...
}
```

As seen above, each Levels block is preferably made up of a number of levels items, each of which specifies parameters for a pin or pin group. Each levels item can specify a number of resource parameters. The runtime semantics for the setting of these levels values is as follows:

The levels items of the Levels block are processed in declaration order. Any pin that occurs in more than one levels item will get processed multiple numbers of times. Multiple specification of values for a single parameter should be maintained and applied in specification order.

The resource parameters in a levels item are processed in the order they are specified.

The Delay statements cause the process of setting levels to pause for approximately the indicated duration, prior to setting the next group of levels. The actual wait time may be in a small system defined range around the specified delay. So if the delay was t seconds, the actual delay would satisfy:

$$t-\Delta t <= \text{actual-wait} <= t+\Delta t$$

The Delay statements divide up the Levels specification into a number of subsequences, each of which will require separate Test Condition Memory settings for processing.

The MinDelay statements cause the process of setting levels to pause for at least the specified duration prior to setting the next group of levels. The actual wait time may be in a small system defined range with a minimum value of the specified minimum delay. So if the minimum delay was t seconds, the actual delay would satisfy:

$$t <= \text{actual-wait} <= t+\Delta t$$

The MinDelay statements divide up the Levels specification into a number of subsequences, each of which will require separate Test Condition Memory settings for processing.

Each pin or pin-group name is specified in exactly one resource in a pin description file (suffix.pin), and therefore has a certain set of viable resource parameters specified in the resource file (suffix.rsc). All the parameters named must be from among this set of viable resource parameters, and must be of the same elementary type as the expression used to set their value. Information about the names and types of resource parameters comes from the resource file.

The resource file Resources.rsc is implicitly imported, providing tester with the names and types for parameters of standard resources such as dpin, and dps.

Resource parameters are assigned expressions that can use UserVars, and values from named specification sets or a currently visible local specification set.

Dps pin resources have special parameters PRE_WAIT and POST_WAIT. The PRE_WAIT parameter specifies the time that needs to elapse from the time the power pin has reached its destination voltage to the time pattern generation can start. The POST_WAIT parameter specifies the time that needs to elapse from the time pattern generation has stopped to the time the power pin shuts off.

Dps pins also specify how the voltage parameter reaches its final value. They could specify it simply by an equation, as all other pin parameters. In that case the value will be reached as the hardware allows it. They could also specify it using a Slew statement. A Slew statement specifies that the power supply voltage reaches its final value from the initial value in a ramp with a specified absolute Voltage Slew Rate.

C++ for Levels

With above rules, a C++ Levels object can be written that supports the following operations:
There is an operation
    Status setparameter(const String& pinOrPinGroupName, const String& parameterName, ElementaryType elementaryType, const Expression& Expression);

This operation binds an expression to a parameter of a pin or a pin group. For instance, the dpin.InPins VIH value is set by:
    setParameter("InPins", "VIH", VoltageT, Expression ("v_ih+1.0"));
This operation will be called several times for all the declarations in the Levels object.
There is an operation
    Status assignLevels(const String& selector);
    which will go through and issue all the pre-determined module level interfaces to assign all the levels of parameters in specification order, as described earlier. The selector parameter is used to resolve names in the expressions according to the rules specified earlier.

Test Condition Groups

The Test Condition Group Sub-language packages together the description of specifications, timings and levels. Timing objects are often specified using parameters. Parameters can be used in timings to specify leading and trailing edges of various pulses. Likewise, Levels can be parameterized by specifying maximum, minimum and typical values of various voltage levels. A Test Condition Group (TCG) object lumps together the specifications and the instantiation of Timings and Levels based on these specifications.

A TestConditionGroup declaration contains an optional SpecificationSet. The SpecificationSet declaration may be an inlined (and unnamed) local SpecificationSet, or it may be a reference to a named SpecificationSet declared elsewhere. The optional SpecificationSet declaration in a TCG declaration is followed by at least one Levels or Timings declaration. It can have both Levels and a Timings, in any order. However, it is disallowed from having more than one Levels and Timings declaration. These restrictions are syntactically enforced.

A specification set declaration in a TCG is identical to the specification set declared separately, except that it does not have a name. Its name is implicitly the name of the enclosing TCG. The Timings declaration comprises a single declaration of a Timings object from a specified timings file. Here is an example of a file with a test condition group:

```
--------------------------------------------------------
# File myTestConditionGroups.tcg
# --------------------------------------------------------
Version 0.1;
Import CHIPlevels.lvl;
Import edges.spec;
Import timing1.tim;
Import timing2.tim;
TestConditionGroup TCG1
{
    # This Local SpecificationSet uses user-defined selectors
    # "min", "max" and "typ". Any number of selectors with any
    # user defined names is allowed.
    #
    # The specification set specifies a table giving values for
    # variables that can be used in expressions to initialize
    # timings and levels. The specification set below defines
    # values for variables as per the following table:
    #            min            max            typ
    #     v_cc       2.9            3.1            3.0
    #     v_ih vInHigh + 0.0   vInHigh + 0.2  vInHigh + 0.1
    #     v_il vInLow + 0.0    vInLow + 0.2   vInLow + 0.1
    # ...
    # A reference such as "vInHigh" must be previously defined
    # in a block of UserVars.
    #
    # Thus, if the "max" selector was selected in a functional
    # test, then the "max" column of values would be bound to
```

```
-continued
# the variables, setting v_cc to 3.1, v_ih to vInHigh+2.0
# and so on.

# Note that this is a local specification set, and has no
# name.
SpecificationSet(min, max, typ)
{
        # Minimum, Maximum and Typical specifications for
        # voltages.
        Voltage v_cc =       2.9, 3.1, 3.0;
        Voltage v_ih =       vInHigh + 0.0,
                             vInHigh + 0.2,
                             vInHigh + 0.1;
        Voltage v_il =       vInLow + 0.0,
                             vInLow + 0.2,
                             vInLow + 0.1;
        # Minimum, Maximum and Typical specifications for
        # leading and trailing timing edges. The base
        # value of 1.0E-6 uS corresponds to 1 picosecond,
        # and is given as an example of using scientific
        # notation for numbers along with units.
        Time t_le =    1.0E-6 uS,
                       1.0E-6 uS + 4.0 * DeltaT,
                       1.0E-6 uS + 2.0 * DeltaT;
        Time t_te =    30ns,
                       30ns + 4.0 * DeltaT,
                       30ns + 2.0 * DeltaT;
}
# Refers to the CHIP3Levels imported earlier. It
# is one of possibly many levels objects that have been
# imported from the above file.
Levels CHIP3Levels;
# Refers to file timing1.tim containing the single
# timing Timing1. The filename should be quoted if
# it has whitespace characters in it.
Timings Timing1;
}
# Another test condition group
TestConditionGroup TCG2
{
        # ClockAndDataEdgesSpecs is a specification set which
        # is available in the edges.specs file. Assume it has
        # the following declaration:
        #       SpecificationSet ClockAndDataEdgesSpecs(min, max, typ)
        #       {
        #             Time clock_le = 10.00 uS, 10.02 uS, 10.01 uS;
        #             Time clock_te = 20.00 uS, 20.02 uS, 20.01 uS;
        #             Time data_le = 10.0 uS, 10.2 uS, 10.1 uS;
        #             Time data_te = 30.0 uS, 30.2 uS, 30.1 uS;
        #       }
        # A SpecificationSet reference to this named set is below:
        SpecificationSet ClockAndDataEdgesSpecs;
        # An inlined levels declaration. Since the associated
        # specification set (above) does not have variables such
        # as VInLow, VInHigh, VOutLow and VOutHigh, they must
        # resolve in the default UserVars collection.
        Levels
        {
#              InPins { VIL = VInLow; VIH = VInHigh + 1.0; }
#              OutPins { VOL = VOutLow / 2.0; VOH = VOutHigh; }
        }
        # This Timing is from the file "timing2.tim". The timings
        # will need the leading and trailing edge timings for clock
        # and data as specified in the above specification set.
        Timings Timing2;
}
```

In the above example, the test condition group TCG1 describes a specification set with three selectors named "min", "typ" and "max". There can be any number of distinct selectors. Within the body of the specification set, variables v_il, v_ih, t_le and t_te are initialized with triples of values, corresponding to the selectors. So in the above example, an instance of TCG1 with the selector "min" will bind the variable v_il with the first numeric value, (vInput-Low+0.0). It bears repetition that the selectors for a specification set are user defined, and any number of them is allowed. The only requirement is that:

The selectors of a specification set be unique identifiers.

Each value specified in the specification set is associated with an array of values that exactly the same number of elements as the set of selectors. Picking the $i^{th}$ selector will cause each value to be bound to the $i^{th}$ value of its associated vector of values.

Subsequent to the specification set in the TCG, there could be a Levels declaration or a Timings declaration or both. The Levels declaration is used to set levels for various pin parameters. The variables identified in the specification set will be used to set these levels, permitting a dynamic binding of different actual values for pin parameters based on the selector used to initialize the TCG.

To exemplify this, consider a Test that enables the selector "min". Referring to the specification set CHIP3Levels given on page, the pin parameter "VIH" for pins in the InPins group will be initialized to the expression (v_ih+1.0) by the declaration:

InPins{VIL=v_il; VIH=v_ih+1.0;}

This resolves to (VInHigh+0.0+1.0) when the selector "min" is enabled. Likewise, the Timings object can be initialized based on the selected values of the specification set variables. It is not necessary to have both a Timings and a Levels declaration. Either can be present by itself, or both in any order, as illustrated by the following example:

```
# ---------------------------------------------------------
# File LevelsOnlyAndTimingsOnly.tcg
# ---------------------------------------------------------
Version 0.1;
# A Levels-only Test Condition Group.
TestConditionGroup LevelsOnlyTCG
{
    SpecificationSet(Min, Max, Typ)
    {
        Voltage v_il = 0.0, 0.2, 0.1;
        Voltage v_ih = 3.9, 4.1, 4.0;
    }
    # An inlined levels declaration. Since the associated
    # specification set (above) does not have variables such
    # as VInLow, VInHigh, VOutLow and VOutHigh, they must
    # resolve in the default UserVars collection.
    Levels
    {
        InPins { VIL = v_il; VIH = v_ih + 1.0; }
        OutPins { VOL = v_il / 2.0; VOH = v_ih; }
    }
}
# A Timings-only Test Condition Group
TestConditionGroup TimingsOnlyTCG
{
    SpecificationSet(Min, Max, Typ)
    {
        Time t_le = 0.9E-3, 1.1E-3, 1.0E-3;
    }
    Timings Timing2;
}
```

Note, however, there should not be more than one Timings and more than one Levels in a TCG. Thus, in summary, there should be at least one of Timings or Levels, and at most one of each.

Test Conditions

A TestCondition object ties a TCG to a specific Selector. Once a TCG has been declared as shown above, it is possible to declare TestCondition objects as shown below:

```
TestCondition TCMin
{
    TestConditionGroup = TCG1;
    Selector = min;
}
TestCondition TCTyp
{
    TestConditionGroup = TCG1;
    Selector = typ;
}
TestCondition TCMax
{
    TestConditionGroup = TCG1;
    Selector = max;
}
```

These Test Conditions would be instantiated in a Test Plan as follows:

```

# Declare a FunctionalTest "MyFunctionalTest" that refers
to three
# Test Condition Group instances.

Test FunctionalTest MyFunctionalTest
{
    # Specify the Pattern List
    PList = pat1Alist;
    # Any number of TestConditions can be specified:
    TestCondition = TCMin;
    TestCondition = TCMax;
    TestCondition = TCTyp;
}
```

Name Resolution in TCGs (Test Condition Groups)

Resolution of names in a test condition group was discussed earlier. However, these rules bear repetition, and are given below again:
1. If the name is qualified (cf. page), it must be resolved in a named user variables collection.
2. If the name is not qualified, the name is resolved in either a local specification set, if it is declared in the test condition group, or in the named specification set, if one is referenced in the test condition group.
3. If the name is not resolved by the earlier rules, it is resolved in the default user variables collection.

TCG Runtime

Test condition groups have the following runtime semantics:

A Test (such as a FunctionalTest) will reference a TCG with a particular selector from its SpecificationSet, using an instantiated TestCondition. This selector will bind each variable in the SpecificationSet to its value associated with the chosen selector. This binding of variables to their values will then be used to determine Levels and Timings.

Parameter Levels in a TestConditionGroup are preferably set sequentially, in the order of presentation in the Levels block. So in the CHIP3Levels block, the order in which parameter levels would be set is as follows (notation: <resource-name>.<resource-parameter>):

InputPins.VIL,
InputPins.VIH,
OutputPins.VIL,
OutputPins.VIH,
Clock.VOL,
Clock.VOH.

This sequencing order enables the test writer to control the explicit power sequencing of power supplies. Furthermore, if a levels item occurs twice, naming the same pin-parameters for a pin, then that pin-parameter gets set twice. This can happen programmatically also.

If a parameter is set by a Slew statement such as $VCC=\text{Slew}(0.01, 2.0\ V)$;

it means that VCC will reach its final value of 2.0 volts from its present value in a ramp with a Voltage Slew Rate of ±0.01 volts per second.

Specification set variables can also be passed into a Timings object in the TCG. The Timings object will then be initialized based on the selected variables. Such a mechanism could be used to customize a Timings object, as, for instance, by specifying leading and trailing edges of waveforms.

C++ for TCGs

With the above rules, the Test Condition Group can be declared in a C++ TestConditionGroup class, and initializing it as follows:

A call is made to the TestConditionGroup member function

Status setSpecificationSet
(SpecificationSet*pSpecificationSet);

which will set the specification set for the TestConditionGroup. This may either be a local specification set, or a named specification set, or null (if there is none).

A call is made to the TestConditionGroup member function

Status setLevels(Levels*pLevels);

which will set the Levels object for the TestConditionGroup. This may either be a locally declared levels object, or an externally declared levels object, or null (if there is none).

A call is made to the TestConditionGroup member function

Status setTimings(Timings*pTimings);

which will set the Timings object for the TestConditionGroup. This will be either an externally declared Timings object, or null (if there is none).

Bin Definitions

The Bin Definitions class defines bins, a collection of counters that summarize the results of testing many DUTs. During the course of testing a DUT, the DUT can be set to any bin, e.g., to indicate the result of a particular test. As testing proceeds, the DUT may be set to another bin. The bin that the DUT is finally set to is the last such setting at the end of the test. The counter for this final bin is incremented at the end of the test of this DUT. A separate file with bin definitions should have the suffix .bdefs.

Bin definitions are preferably hierarchical. For example, at an outermost level, there may be the PassFailBins with two bins named Pass and Fail. Then there could be several HardBins, some of which map to the Pass bin, and others which map to the Fail bin. The HardBins are said to be a refinement of the PassFailBins. Finally, there could be a large number of SoftBins, a refinement of HardBins, many of which map to the same Hard bin. Below is an example illustrating the hierarchy of bins:

```
# ------------------------------------------------------
# File CHIPbins.bdefs
# ------------------------------------------------------
Version 1.2.3;
BinDefs
{
    # The HardBins are an outermost level of
    # bins. They are not a refinement of any other
    # bins.
    BinGroup HardBins
    {
        "3GHzPass":         "DUTs passing 3GHz";
        "2.8GHzPass":       "DUTs passing 2.8GHz";
        "3GHzFail":         "DUTs failing 3GHz";
        "2.8GHzFail":       "DUTs failing 2.8GHz";
        LeakageFail: "DUTs failing leakage";
    }
    # The SoftBins are a next level of refinement.
    # SoftBins are a refinement of HardBins.
    BinGroup SoftBins : HardBins
    {
        "3GHzAllPass":
            "Good DUTs at 3GHz",   "3GHzPass";
        "3GHzCacheFail":
            "Cache Fails at 3GHz", "3GHzFail";
        "3GHzSBFTFail":
            "SBFT Fails at 3GHz",  "3GHzFail";
        "3GHzLeakage":
            "Leakages at 3GHz",    LeakageFail;
        "2.8GHzAllPass":
            "Good DUTs at 2.8GHz","2.8GHzPass";
        "2.8GHzCacheFail":
            "Cache Fails at 2.8GHz","2.8GHzFail";
        "2.8GHzSBFTFail":
            "SBFT Fails at 2.8GHz", "2.8GHzFail";
        "2.8GHzLeakage":
            "Leakages at 2.8GHz",  LeakageFail;
    }
}
```

In the above example, the most base bins are the BinGroup HardBins. A BinGroup X is said to be a group of base bins if some other BinGroup is a refinement of X. Thus, the BinGroup HardBins is a group of base bins since the BinGroup SoftBins is a refinement of HardBins. The bins of SoftBins are referred to as leaf bins. A BinGroup Y is said to be a group of leaf bins if no other BinGroup is a refinement of Y.

The degenerate case of a BinDefs block with a single BinGroup Z in it will have Z to be a group of most base bins, as well as a group of leaf bins. BinGroup names are global in scope. There can be any number of BinDefs blocks, but the declared BinGroups must be distinct. A BinGroup from one BinDefs block is allowed to be a refinement of a BinGroup from another BinDefs block. So in the above example, SoftBins could be in a separate BinDefs block from HardBins. However, it is strongly recommended to have a single BinDefs block with all the BinGroups defined for the sake of readability.

The above hierarchy can now be extended to count how many DUTs passed and failed, by adding another BinGroup.

```
# ------------------------------------------------------
# File CHIPbins.bdefs
# ------------------------------------------------------
Version 1.2.3;
BinDefs
{
    # The PassFailBins are an outermost level of
    # bins. They are not a refinement of any other
    # bins.
    BinGroup PassFailBins
    {
        Pass: "Count of passing DUTS.";
        Fail: "Count of failing DUTS.";
    }
    # The HardBins are a next level of refinement.
    # HardBins are a refinement of the PassFailBins,
    # as indicated by "HardBins : PassFailBins".
    BinGroup HardBins : PassFailBins
    {
        "3GHzPass":       "DUTs passing 3GHz",   Pass;
        "2.8GHzPass":     "DUTs passing 2.8GHz", Pass;
        "3GHzFail":       "DUTs failing 3GHz",   Fail;
        "2.8GHzFail":     "DUTs failing 2.8GHz", Fail;
        LeakageFail: "DUTs failing leakage", Fail;
    }
    # The SoftBins are a next level of refinement.
    # SoftBins are a refinement of HardBins.
    BinGroup SoftBins : HardBins
    {
        "3GHzAllPass":
            "Good DUTs at 3GHz",   "3GHzPass";
        "3GHzCacheFail":
            "Cache Fails at 3GHz", "3GHzFail";
        "3GHzSBFTFail":
            "SBFT Fails at 3GHz",  "3GHzFail";
        "3GHzLeakage":
            "Leakages at 3GHz",    LeakageFail;
        "2.8GHzAllPass":
            "Good DUTs at 2.8GHz","2.8GHzPass";
        "2.8GHzCacheFail":
            "Cache Fails at 2.8GHz","2.8GHzFail";
        "2.8GHzSBFTFail":
            "SBFT Fails at 2.8GHz", "2.8GHzFail";
        "2.8GHzLeakage":
            "Leakages at 2.8GHz",  LeakageFail;
    }
}
```

This time, the most base bins are the BinGroup PassFailBins. They are typically not a refinement of any bins. The BinGroup HardBins are a refinement of the PassFailBins and are also base bins. SoftBins are a refinement of the HardBins, and are a group of leaf bins. The above example had only three BinGroups in the hierarchy. Below is a more complicated hierarchy:

```
BinDefs
{
    # A group of most base bins
    BinGroup A { ... }
    # A group of base bins that is a refinement of A
    BinGroup Ax : A { ... }
    # A group of leaf bins that is a refinement of Ax
    BinGroup Axx : Ax { ... }
    # A group of base bins that is a refinement of A
    BinGroup Ay : A { ... }
    # A group of leaf bins that is a refinement of Ay
    BinGroup Ayy : Ay { ... }
    # A group of most base bins
    BinGroup B { ... }
    # A group of leaf bins that is a refinement of B
    BinGroup Bx : B { ... }
}
```

In this example, Ax and Ay are refinements of A, Axx is a refinement of Ax and Ayy is a refinement of Ay. This example also provides BinGroups B and Bx where Bx is a refinement of B. The BinDefs declaration above with the BinGroups named PassFailBins, HardBins and SoftBins will be used as a continuing example in this section.

Each bin in a BinGroup has:
1. a name which is either an identifier or a string literal
2. a description which describes what this bin summarizes
3. and if this bin is in a refinement BinGroup, the name of the bin it is a refinement of, also known as the base bin.

The two bins in PassFailBins are named "Pass" and "Fail". The five bins in HardBins are named "3 GHzPass", "2.8 GHzPass", "3 GHzFail", "2.8 GHzFail", "LeakageFail". Bin names may be a literal string, or an identifier. Bin names must be unique in a BinGroup, but may be duplicated across BinGroups. BinGroup names, however, are global in scope, and must be unique across a test plan.

Of the five HardBins, the bins "3 GHzPass" and "2.8 GHzPass" both map to the "Pass" bin of the PassFailBins. The rest of the HardBins map to the "Fail" bins of the PassFailBins.

Finally, there are eight SoftBins. The two failures at 3 GHz for SBFT (soft bin functional test) and Cache map to the "3 GHzFail" HardBin. Likewise the two failures at 2.8 GHz for SBFT and Cache map to the "2.8 GHzFail" HardBin. Both the failures due to Leakage map to the same "LeakageFail" HardBin, regardless of the speed at which they occurred. For example, the coarsest test (at the outermost level) is whether a DUT passes or fails a test. A refinement is, for example, whether the DUT passes or fails a test at a particular frequency, e.g., 3 GHz, etc.

Bins are assigned to DUTs in a Test Plan FlowItem, described below. A TestPlan FlowItem has a Result Clause in which the test plan describes the actions and transition to take place as the result of getting a particular result back from executing a test. It is at this point that a SetBin statement can occur:

```
# A FlowItem Result clause. It is described later.
Result 0
{
    # Action to be taken on getting a 0 back from
    # executing a test.
    # Set the bin to SoftBin."3GHZPass" expressing that the
    # DUT was excellent.
    SetBin SoftBins."3GHzPass";
}
```

Many SetBin statements could execute during the course of running a test on a DUT. When the test is finally completed, the runtime will increment counters for the final bin that is set for that DUT, and for all its refinements. Consider a DUT which had the following SetBin statements executed during the course of its test:

SetBin SoftBins."3 GHzSBFTFail";
SetBin SoftBins."2.8 GHzAllPass";

This DUT passed the 3 GHz Cache and Leakage tests, but failed the SBFT test, and so was assigned to the "3 GHzSBFTFail" bin. It was then tested at 2.8 GHz, and all the tests passed. So the final bin assignment is to the "2.8 GHzAllPass" bin, which is in the set of SoftBins. This final assignment will increment the counters of the following bins:
1. SoftBins."2.8 GHzAllPass"
2. which is a refinement of HardBins."2.8 GhzPass"
3. which is a refinement of PassFailBins."Pass"

When the test completes, runtime will increment the counter of the final bin assignment of the DUT, and for all other bins it is a refinement of.

A SetBin statement is allowed only on a leaf bin. It is illegal to set a base bin. The counter incrementing semantics above assures that:
1. If the bin is a leaf bin, it is the number of times a SetBin statement was executed for this bin at the end of testing a DUT.
2. If the bin is a base bin, it is the sum of the counters of the bins that it is a refinement of.

Thus, in the above example, only SoftBins are allowed in a SetBin statement. The counter for HardBins."LeakageFail" is the sum of the counters for SoftBins."3 GHzLeakageFail" and SoftBins."2.8 GHzLeakageFail". Below are some rules regarding bin definitions:
1. A BinDefinitions declaration is comprised of several BinGroup declarations.
2. Each BinGroup declaration has a name, an optional BinGroup name that it is a refinement of, followed by a block of bin declarations.
3. Bin declarations comprise a name, followed by a description, optionally followed by the name of a base bin that this bin is a refinement of.
4. Bin names can be a string literal, or an Id. The empty string should not be a valid bin name. Bin names should be unique among names in the BinGroup declaration, but the same name could be used in other BinGroup declarations.
5. If a BinGroup declaration Xxx is a refinement of another BinGroup declaration Yyy, then all of the bin declarations in Xxx must declare the name of a base bin from Yyy. Thus, each of the bin declarations in SoftBins is a refinement of a bin of HardBins, since the SoftBins are declared to be a refinement of HardBins.
6. A BinGroup declaration that is not a refinement of another BinGroup declaration, such as PassFailBins will preferably have Bin declarations that do not declare base bins.

A bin Bbb has a set of bases which is the entire set of bins that Bbb is a refinement of. It is formally defined as follows:
1. If Aaa is the base bin of Bbb, then Aaa is in the set of bases of Bbb.
2. Any base of Aaa is also in the set of bases of Bbb.

BinGroup names are global in a TestPlan.
Bin names are local to a BinGroup.
A SetBin statement is only allowed for a leaf bin.

C++ for Bin Definitions

With above rules, an object type BinGroup can be constructed for each of the BinGroup declarations in the BinDefs declaration. The class BinGroup will have a subclass LeafBinGroup. The operations of these two classes are the same, except that BinGroup::incrementBin is a C++ protected operation, whereas LeafBinGroup::incrementBin is a C++ public operation.

The following is a default constructor which builds a BinGroup or a LeafBinGroup which is not a refinement of any other BinGroup.

Constructors:
BinGroup(BinGroup& baseBinGroup);
LeafBinGroup(BinGroup& baseBinGroup);

that builds a BinGroup that is a refinement of the given baseBinGroup.

A method
Status addBin(const String& binName, const String& description, const String& baseBinName);

to define a bin and its description. If it is a most base bin, the baseBinName parameter must be the empty string.

Methods to increment bin counters:
Status incrementBin(const String& binName);

This operation will increment the counter for this bin, and for all bins that are bases of this bin. The operation is protected in the class BinGroup, and is public in the class LeafBinGroup.

Methods to reset bin counters
Status resetBin(const String& binName);

This operation will reset the counter for this bin, and for all bins that are the bases of this bin.

Methods to get information about a bin:
Status getBinDescription(const String& binName, String& description);
Status getBaseBin(const String& binName, BinGroup*pBaseBinGroup, String& baseBinName);
Status getBinValue(const String& binName, unsigned int& value);

Iterators will be provided to get at all the currently defined bin names.

TestPlan state will be include number of BinGroup members, one for each BinGroup declaration. The C++ for the above BinDefinitions would be as follows:

```
// TestPlan constructor
TestPlan::TestPlan( )
 : m__PassFailBins( ), // Default Constructor
   m__HardBins(&m__PassFailBins),
   m__SoftBins(&m__HardBins)
{ }
// Bin initializations
m__PassFailBins.addBin("Pass", "Count of passing DUTS.","");
m__PassFailBins.addBin("Fail", "Count of failing DUTS.","");
m__HardBins.addBin("3GHzPass", "Duts passing 3GHz", "Pass");
...
```

State for a TestPlan includes a m_pCurrentBinGroup which is initialized to the undefined BinGroup (NULL) and the m_currentBin undefined bin name (the empty string). Each time a SetBin statement is executed, the m_pCurrentBinGroup is changed to the indicated the named BinGroup and the m_currentBin to the named bin in the group by a call:
//Translation of: SetBin SoftBins."3 GHzAllPass";
pTestPlan->setBin("SoftBins", "3 GHzAllPass");
When the test plan completes execution, it will call
m_pCurrentBinGroup->incrementBin(m_currentBin);
causing this bin and all its base bins to have their counters incremented.

The BinGroup counters are reset when the test plan is elaborated, but are not reinitialized each time a test is run. The counters can be reset by an explicit call to BinGroup::resetBin.

C. The Test Plan

The test plan can be thought of as a main structure of the test program. The Test Plan can import files, as well as define similar constructs inline. Thus, it is possible to import a file given definitions of some globals, as well as declaring additional globals inline.

C1. Test Plan Flows and FlowItems

One of the critical elements of the Test Plan is the Flow. A Flow encapsulates a finite state machine. It comprises several FlowItems which run an IFlowable object and then transition to another flow item. Running an IFlowable involves running an object that implements the IFlowable interface. Typical objects that implement the IFlowable interface are Tests and Flows themselves.

Thus, a Flow has FlowItems which runs Tests and other Flows, and then transition to another FlowItem. It also provides for the opportunity to call user customized routines on various return results from running an IFlowable. Typically, a Flow thus has the following form:

```

# FlowTest1 implements a finite state machine for the
# Min, Typ and Max flavors of MyFunctionalTest1. On
# success it tests Test1Min, Test1Typ, Test1Max
# and then returns to its caller with 0 as a successful
# status. On failure, it returns 1 as a failing status.

# Assume that the tests MyFunctionalTest1Min, ... all
# return a Result of 0 (Pass), 1 and 2 (for a couple
# of levels of failure).
#                     Result 0    Result 1    Result 2
#     Test1Min        Test1Typ    return 1    return 1
#     Test1Typ        Test1Max    return 1    return 1
#     Test1Max        return 0    return 1    return 1

Flow FlowTest1
{
    FlowItem FlowTest1_Min MyFunctionalTest1Min
    {
        Result 0
        {
            Property PassFail = "Pass";
            IncrementCounters PassCount;
            GoTo FlowTest1_Typ;
        }
        Result 1
        {
            Property PassFail = "Fail";
            IncrementCounters FailCount;
            Return 1;
        }
        # This result block will be executed if
        # MyFunctionalTest1Min returns any of
        # 2, 5, 6, 7, -6, -5 or -4
        Result 2, 5:7, -6:-4
        {
            Property PassFail = "Fail";
            IncrementCounters FailCount;
            Return 1;
        }
    }
    FlowItem FlowTest1_Typ { ... }
    FlowItem FlowTest1_Max { ... }
}
```

The operation of the Flow FlowTest1 is as follows:
1. Starts up with executing FlowItem FlowTest1_Min.
2. FlowTest1_Min runs a functional test, MyFunctionalTest1Min. Details of this test are provided when the complete test plan is presented below.
3. Nine results are expected from running this test, 0, 1, 2, 5, 6, 7, −6, −5 or −4. The first two Result clauses handle 0 and 1 respectively, and the third handles all the rest of the result values.
4. If result "0" (pass) occurs, then FlowTest1_Min will increment the counter PassCounter. It will then transition to a new FlowItem FlowTest1_Typ.
5. If result "1" or result "2" occurs, then FlowTest1_Min will increment the counter FailCounter, and return from the flow.
6. FlowTest1_Typ will operate in the same way, and on success call FlowTest1_Max.

7. FlowTest1_Max will operate in the same way, and on success return from FlowTest1 with a successful result ("0").

Thus, FlowTest1 will, on a successful run, run a device through the minimum, typical and maximum versions of Test1, and then return. FlowTest2 will operate in a like manner.

A Flow as described above basically describes a Finite State Machine with states and transitions. The FlowItems are basically states, which will do the following:
1. Execute an IFlowable (it could be a previously defined Flow, or a Test, or a user defined Flow that can be implemented in C++ with the above rules).
2. Execution of the IFlowable return a numeric result. Based on the result, certain actions occur (updating some counters), and then one of two things happen:
   a. The Flow returns to the caller with a numeric result.
   b. The Flow continues by transitioning to another state (FlowItem).

Thus, a FlowItem has the following components:
A FlowItem has a name.
A FlowItem has an IFlowable to be executed.
A FlowItem has a number or Result clauses.
Each Result clause of a FlowItem provides actions and ends with a transition and is associated with one or more result values.

These items are syntactically as follows in a FlowItem.

```
FlowItem <name> <IFlowable to be executed>
{
    Result <one or more result values>
    {
        <actions for these result values>
        <transition for these result values>
    }
    Result <one or more other result values>
    {
        ...
    }
    ...
}
```

The IFlowable to be executed could be either a Test, or a User-defined IFlowable, or a Flow. The actions for a result could be any of the following:

A Property Action to set string valued entities that are used by GUI tools to attribute results. This can be seen in the above FlowTest1 example with:
   Property PassFail="Pass";

Properties are basically named string or integer valued entities that are associated with a Result clause. There can be any number of them, and they are preferably used by tools such as GUIs which a user would use to display information associated with this result. They have no effect on the actual result of the test, or the flow of the test.

A Counters Action to increment some number of counters. This can be seen in the above example with:
   IncrementCounters PassCount;

A Routine Call Action to call an arbitrary or user routine. This is discussed later.

Finally, a FlowItem has a Transition which could either be a GoTo statement to transfer control to another FlowItem, or a Return statement to transfer control back to the caller (either a calling flow, or the system routine which initiated the test plan).

Predefined Flows

The typical use of Flow objects is to define a sequence of Tests. This sequence is then executed as a result of an event occurring in a Test Plan Server (TPS), i.e. the Execute Test Plan event. A test plan server on each site controller executes the user's test plan. However, Flow objects are also executed in response to other events. The name in parentheses is the name used in assigning Flows to these events.

1. System Load Flow (SysLoadFlow). This Flow is executed on the System Controller when a Test Plan is loaded onto one or more Site Controllers. It is executed prior to the actual loading of the Test Plan on any Site Controller. This flow allows the Test Plan developer to define actions that should originate from the System Controller. Such actions include broadcast load of Pattern files, Calibration actions, etc.
2. Site Load Flow (SiteLoadFlow). This Flow is executed on the Site Controller after a Test Plan has been loaded onto the Site and initialized. This allows any Site-specific initialization to occur.
3. Lot Start/End Flows (LotStartFlow/LotEndFlow). These Flows execute on the Site Controllers when the Test Plan Server is notified of a start of a new lot. This is typically used in production environments to annotate datalog streams with lot-specific information.
4. DUT Change Flow (DutChangeFlow). This Flow executes on the Site Controller when its DUT information changes. Again, this is typically used in production environments to update datalog streams.
5. TestPlan Start/End Flows (TestPlanStartFlow/TestPlanEndFlow). These Flows execute on the Site Controller when the Test Plan Server is instructed to start executing the current Test Flow and when that flow finishes its execution.
6. Test Start/End Flows (TestStartFlow/TestEndFlow). These Flows execute on the Site Controller when the Test Flow is starting to run a new Test and when that Test finishes its execution.
7. Test Flow (TestFlow). This Flow is the main Flow object executed when the Test Plan Server receives an "Execute Test Plan" message.

Note that if a user defines a Flow in the user's Test Plan that is not the TestFlow or one of the other pre-defined flows, the preferred way to have it executed is to include it in the transition states of one of these pre-defined flows.

A Test Plan Example

In the example below, Flows are given along with comments that describe the finite state machine implemented by the flow. The finite state machine is given as a transition matrix. Rows of the matrix correspond to FlowItems, and columns to the result. The entries of a row of the matrix indicate the FlowItem that is transitioned to from the FlowItem of the row when the returned Result is the value specified in the column.

A Test Plan with three flows, FlowTest1, FlowTest2 and FlowMain, is shown below. FlowTest1 will operate as described above. It will run a test named MyFunctionalTest1 in each of the "min", "typ" and "max" configurations. Likewise, FlowTest2 will run MyFunctionalTest2 in each of these configurations. Finally, FlowMain will run FlowTest1 and FlowTest2. The finite state machine transition matrix is provided in comments at the start of each of these flows.

```
--------------------------------------------------------
# File mySimpleTestPlan.tpl
# --------------------------------------------------------
Version 0.1;
Import xxx.pin;      # Pins
# Constants and variables giving limiting values.
Import limits.usrv;
# Import test condition groups
Import myTestConditionGroups.tcg;
# Import some bin definitions.
Import bins.bdefs;
# --------------------------------------------------------
# Start of the test plan
# --------------------------------------------------------
TestPlan Sample;
# This block defines Pattern Lists file-qualified names and
# Pattern List variables that are used in Test declarations.
# Pattern list variables are deferred till customization is
# examined.
PListDefs
{
    # File qualified pattern list names
    pl1A.plist:pat1Alist,
    pl2A.plist:pat2AList
}
# The socket for the tests in this test plan (this is not imported,
# but resolved at activation time):
SocketDef = mytest.soc;
# Declare some user variables inline
UserVars
{
    # String name for current test
    String CurrentTest = "MyTest";
}
TestCondition TC1Min
{
    TestConditionGroup = TCG1;
    Selector = min;
}
TestCondition TC1Typ
{
    TestConditionGroup = TCG1;
    Selector = typ;
    }
}
TestCondition TC1Max
{
    TestConditionGroup = TCG1;
    Selector = max;
}
# Likewise for TC2Min, TC2Typ, TC2Max ...

# Declare a FunctionalTest. "FunctionalTest" refers to a C++
# test class that runs the test, and returns a 0, 1 or 2 as
# a Result. The Test Condition Group TCG1 is selected with
# the "min" selector by referring to the TC1Min TestCondition.

Test FunctionalTest MyFunctionalTest1Min
{
    PListParam = pat1AList;
    TestConditionParam = TC1Min;
}
# Another FunctionalTest selecting TCG1 with "typ"
Test FunctionalTest MyFunctionalTest1Typ
{
    PListParam = pat1AList;
    TestConditionParam = TC1Typ;
}
# Another FunctionalTest selecting TCG1 with "max"
Test FunctionalTest MyFunctionalTest1Max
{
    PListParam = pat1AList;
    TestConditionParam = TC1Max;
}
# Now select TCG2 with "min"
Test FunctionalTest MyFunctionalTest2Min
{
```

-continued

```
        PListParam = pat2AList;
        TestConditionParam = TC2Min;
}
# Likewise for TCG2 with "typ" and TCG2 with "max"
Test FunctionalTest MyFunctionalTest2Typ
{
        PListParam = pat1AList;
        TestConditionParam = TC2Typ;
}
Test FunctionalTest MyFunctionalTest2Max
{
        PListParam = pat1AList;
        TestConditionParam = TC2Max;
}

# At this time the following Test objects have been defined
#           MyFunctionalTest1Min
#           MyFunctionalTest1Typ
#           MyFunctionalTest1Max
#           MyFunctionalTest2Min
#           MyFunctionalTest2Typ
#           MyFunctionalTest2Max

# Counters are variables that are incremented during the
# execution of a test. They are UnsignedIntegers that are
# initialized to zero.

Counters {PassCount, FailCount}

# Flows can now be presented. A Flow is an object that
# essentially represents a finite state machine which
# can execute "Flowables", and transition to other flowables based
# on the Result returned from executing a Flowable. A Flow can also
# call another flow.

# A Flow consists of a number of FlowItems and transitions
# between them. FlowItems have names which are unique in
# the enclosing Flow, execute a "Flowable" object, and then
# transition to another FlowItem in the same enclosing Flow.

# Flowable objects include Tests and other Flows. When
# a Flowable object executes, it returns a numeric Result
# which is used by the FlowItem to transition to another
# FlowItem. As a result of this, both Tests and Flows
# terminate by returning a numeric Result value.

# FlowTest1 implements a finite state machine for the
# Min, Typ and Max flavors of MyFunctionalTest1. On
# success it tests Test1Min, Test1Typ, Test1Max
# and then returns to its caller with 0 as a successful
# Result. On failure, it returns 1 as a failing Result.

# Assume that the tests MyFunctionalTest1Min, ... all
# return a Result of 0 (Pass), 1 and 2 (for a couple
# of levels of failure). The Transition Matrix of the
# finite state machine implemented by FlowTest1 is:
# ----------------------------------------------------------
#                              Result 0         Result 1       Result 2
# ----------------------------------------------------------
#        FlowTest1_Min          FlowTest1_Typ     return 1       return 1
#        FlowTest1_Typ          FlowTest1_Max     return 1       return 1
#        FlowTest1_Max          return 0          return 1       return 1

# where the IFlowables run by each FlowItem are:
#           FlowItem                IFlowable that is run
#           FlowTest1_Min           MyFunctionalTest1Min
#           FlowTest1_Typ           MyFunctionalTest1Typ
#           FlowTest1_Max           MyFunctionalTest1Max

Flow FlowTest1
{
    FlowItem FlowTest1_Min MyFunctionalTest1Min
    {
```

-continued

```
        Result 0
        {
            Property PassFail = "Pass";
            IncrementCounters PassCount;
            GoTo FlowTest1_Typ;
        }
        Result 1,2
        {
            Property PassFail = "Fail";
            IncrementCounters FailCount;
            Return 1;
        }
    }
    FlowItem FlowTest1_Typ MyFunctionalTest1Typ
    {
        Result 0
        {
            Property PassFail = "Pass";
            IncrementCounters PassCount;
            GoTo FlowTest1_Max;
        }
        Result 1,2
        {
            Property PassFail = "Fail";
            IncrementCounters FailCount;
            Return 1;
        }
    }
    # Likewise for FlowTest1_Max
    FlowItem FlowTest1_Max MyFunctionalTest1Max
    {
        Result 0
        {
            Property PassFail = "Pass";
            IncrementCounters PassCount;
            Return 0;
        }
        Result 1,2
        {
            Property PassFail = "Fail";
            IncrementCounters FailCount;
            Return 1;
        }
    }
}

# FlowTest2 is similar to FlowTest1. It implements a
# finite state machine for the Min, Typ and Max flavors
# of MyFunctionalTest2. On success it tests Test2Min,
# Test2Typ, Test2Max and then returns to its caller with
# 0 as a successful Result. On failure, it returns 1 as
# a failing Result.

# Assume that the tests MyFunctionalTest2Min, ... all
# return a Result of 0 (Pass), 1 and 2 (for a couple
# of levels of failure). The Transition Matrix of the
# finite state machine implemented by FlowTest2 is:
# ----------------------------------------------------------
#                              Result 0           Result 1      Result 2
# ----------------------------------------------------------
#       FlowTest2_Min          FlowTest2_Typ      return 1      return 1
#       FlowTest2_Typ          FlowTest2_Max      return 1      return 1
#       FlowTest2_Max          return 0           return 1      return 1

# Where the IFlowables run by each FlowItem are:
#           FlowItem                IFlowable that is run
#           FlowTest2_Min           MyFunctionalTest2Min
#           FlowTest2_Typ           MyFunctionalTest2Typ
#           FlowTest2_Max           MyFunctionalTest2Max

Flow FlowTest2
{
    # ...
}

# Now the FlowMain, the main test flow, can be presented. It
# implements a finite state machine that calls FlowTest1
```

```
# and FlowTest2 as below:
# ----------------------------------
#                                                 Result 0              Result 1
# ----------------------------------
#        FlowMain_1                               FlowMain_2            return 1
#        FlowMain_2                               return 0              return 1

# Where the IFlowables run by each FlowItem are:
#           FlowItem                IFlowable that is run
#           FlowMain_1              FlowTest1
#           FlowMain_2              FlowTest2
Flow FlowMain
{
    # The first declared flow is the initial flow to be
    # executed. It goes to FlowMain_2 on success, and
    # returns 1 on failure.
    FlowItem FlowMain_1 FlowTest1
    {
        Result 0
        {
            Property PassFail = "Pass";
            IncrementCounters PassCount;
            GoTo FlowMain_2;
        }
        Result 1
        {
            # Sorry ... FlowTest1 failed
            Property PassFail = "Fail";
            IncrementCounters FailCount;
            # Add to the right soft bin
            SetBin SoftBins."3GHzSBFTFail";
            Return 1;
        }
    }
    FlowItem FlowMain_2 FlowTest2
    {
        Result 0
        {
            # All passed!
            Property PassFail = "Pass";
            IncrementCounters PassCount;
            # Add to the right soft bin
            SetBin SoftBins."3GHzAllPass";
            Return 0;
        }
        Result 1
        {
            # FlowTest1 passed, but FlowTest2 failed
            Property PassFail = "Fail";
            IncrementCounters FailCount;
            # Add to the right soft bin
            SetBin SoftBins."3GHzCacheFail";
            Return 1;
        }
    }
}
TestFlow = FlowMain;
```

The above test plan is structured as follows in a preferred order:
1. First, a version number is provided. This number is used to ensure compatibility with the compiler version.
2. Then, a number of imports are declared. These are various files with declarations needed in order to resolve names used in the test plan.
3. Next, the Test Plan name is declared, after which come the inline declarations of the test plan.
4. Next a set of PListDefs are declared. These include file-qualified names naming GlobalPLists from the named files. They also include Pattern List variables. Pattern List variables are variables that can be initialized in custom flowables at execution time. They provide a means of delaying binding tests to actual pattern lists until runtime.
5. Next, a set of UserVars is declared. These include a string.
6. Some Counters are then declared, to determine the number of tests passed and failed. Counters are simply variables that are initialized to zero, and incremented at IncrementCounter statements. They are different from Bins described earlier which have the semantics that only the currently set bin is incremented at the end of the test of a DUT.
7. Next, a series of Test Conditions is declared. Each of these specifies a Test Condition Group and a selector. In this example, the Test Condition Groups come from mytestconditionsgroups.tcg. However, they could have been inline in the test plan.
8. Next, a series of Flowables or Tests is declared. Each of this is known Test FunctionalTest which selects a Pattern List and a test condition. Thus for instance, MyFunctionalTest IMax selects the test condition TCI-Max and a pattern list.

9. Following this, three flows are declared, FlowTest1, FlowTest2 and FlowMain. Flows run Flowables. Flowables include Tests (such as MyFunctionalTest1Max) and other flows (such as FlowTest1 and FlowTest2). Each of FlowTest1 and FlowTest2 run through the minimum, typical and maximum versions of Test1 and Test2 respectively. The flow FlowMain calls the earlier declared flows, FlowTest1 and then FlowTest2.

10. Finally, the TestFlow event is assigned to the FlowMain Flow. Thus the flow FlowMain is the one that will be executed by this test plan when a user chooses to Execute this plan.

C++ for Flows

With the above rules, a C++ implementation can be done for most of the elements, with the exception of the Flows themselves.

C++ for FlowItems

The C++ class to represent a FlowItem may have the following interface:

An operation
    Status setFlowable(IFlowable* pIFlowable);

which will set the IFlowable that will be executed for this FlowItem.

Once the FlowItem returns from the set of calls needed to execute this IFlowable, it will need to increment a list of counters depending on the Result value. To this end, the FlowItem needs to have a vector of counters that is to be incremented. This is initialized by a call:

Status setCounterRefs(unsigned int result, CounterRefList counterRefs);

Calling this sets up a vector of references to counters into the FlowItem, so that it can increment them once the IFlowable completes execution. For example, the statement IncrementCounters A, B, C;

would preferably use the above call as follows:

```
// Somewhere earlier
CounterRefList counters;
...
// Code for Result clause
//   Result 2, 3 {...}
// of flowObject.
counters.reset( );
counters.add(&A);
counters.add(&B);
counters.add(&C);
flowObject.setCounterRefs(2, counters);
flowObject.setCounterRefs(3, counters);
```

A temporary CounterRefList object named counters is used. Initially counters.reset( ) is called, followed by a number of counters.add( ) calls to set up the counters list. This is then used to setup the vector of counter addresses to be updated for result values 2 and 3.

The FlowItem may then need to transition to another FlowItem on a particular result:

Status setTransition(unsigned int result, FlowItem* pFlowItem);

Several such calls will naturally need to be made in the case that a certain Result clause deals with many result values.

The FlowItem may need to return a result. This is done by:
    Status setReturnResult(unsigned int result, unsigned int returnResult);

For example, for the FlowItem FirstFlowItem in the previous example, the above would be called with the value "2" for "result" and "1" for "returnResult".

Finally, the FlowItem needs an operation to execute:
    Status execute(unsigned int& result, FlowItem* pNextFlowItem);

This operation will execute the IFlowable, then update the indicated counters, and then either return a Result, or a pointer to the next FlowItem. If this pointer is NULL, then the result is the returned value.

The code that would be generated for FlowItem FlowMain_1 is as follows:

```
FlowItem FlowMain_1;
FlowItem FlowMain_2;
CounterRefList counters;
FlowMain_1.setFlowable(FlowTest1);
// Result 0
counters.reset( );
counters.add(&PassCount);
FlowMain_1.setCounterRefs(0, counters);
FlowMain_1.setTransition(0, &FlowMain_2);
// Result 1
counters.reset( );
counters.add(&FailCount);
FlowMain_1.setCounterRefs(1, counters);
// The following call from ITestPlan will set the
// current bin group and bin name.
pTestPlan->setBin("SoftBins", "3GHzSBFTFail");
FlowMain_1.setReturnResult(1, 1);
```

The code generated above sets up FlowMain_1 to run the IFlowable "FlowTest1", and then sets it up to increment the appropriate list of counters for each result, and finally to take the necessary actions. The necessary action in the case of result "0" is a transition to FlowMain_1, and in the case of result "1" is a return.

C2. Counter Support in a TestPlan

Counters are variables that are initialized to zero, and can be incremented by an IncrementCounter statement at various points during a test run. They are different from Bins, which are incremented only at the end of the test. Furthermore, bins are hierarchical while counters are simple variables. Thus, counters are a much simpler and more limited facility than bins.

Counters can be supported in a TestPlan via a member of a Counters class that maintains a set of named counters which are unsigned integers. Objects will be defined in this class via a Counters declaration. Counters will not be automatically reset when a test starts, thus allowing a TestPlan to gather counts over testing many DUTs. Methods will be provided to reset, increment and query the value of a counter. This enables an alternative to binning in order to determine counts as a result of running a test.

The TestPlan preferably contains a member variable, m_modifiedCounters, which is the set of counters modified by running the test on a DUT. This set is initialized to the empty set at the start of the test. At each place an IncrementCounters call is made, code will be generated to add the named counters to the m_modifiedCounters member. Thus, this member gathers together all the counters that were modified during the execution of a test on a DUT.

C++ for the Flow Object

Once all the FlowItems have been created, the Flow object can be created as a C++ object as shown below:

An operation to add a FlowItem

Status addFlowItem(FlowItem* pFlowItem, bool isInitalFlowItem);

which will add the indicated FlowItem to the Flow. The boolean is set to True if this is the initial FlowItem of the Flow.

An operation to execute the Flow

Status executeFlow(unsigned int& result);

This will preferably return when the Flow returns, with the result of executing the flow. The action of this is to start executing the flow with the initial FlowItem. It will keep executing FlowItems as long as the current FlowItem returns a next FlowItem to execute. When the current FlowItem returns a Result, then this operation completes with that Result.

Hence, the C++ code generated for a Flow has several repeated calls to addFlowItem( ) in order to add FlowItems to the Flow. The executeFlow( ) operation will occur when this Flow in the Test Plan is selected for execution.

C3. Test Classes

In general majority of the program code is data for device test, and the rest is the code of test program, which realizes the test methodology. This data is DUT-dependent (e.g., power supply conditions, signal voltage conditions, timing conditions, etc.). The test code consists of methods to load the specified device conditions on to ATE hardware, and also those needed to realize the user specified objectives (such datalogging, etc).

As explained above, to increase the reusability of test code, such code should be independent of any device-specific data (e.g., pin name, stimulus data, etc.), or device-test-specific data (e.g., conditions for DC units, measurement pins, number of target pins, name of pattern file, addresses of pattern programs, etc.). If code for a test is compiled with data of these types, the reusability of the test code would decrease. Therefore, any device-specific data or device-test-specific data should be made available to the test code externally, as inputs during code execution time.

In the open architecture test system, a Test Class, which is an implementation of the ITest interface, realizes the separation of test data and code (and hence, the reusability of code) for a particular type of test. Such a test class could be regarded as a "template" for separate instances of it, which differ from each other only on the basis of device-specific and/or device-test-specific data. Test classes are specified in the test plan file. Each Test class typically implements a specific type of device test or setup for device test. For example, Functional, AC and DC Parametric tests are preferably implemented by separate Test classes. However, custom test classes can also be used in test plans.

Test classes allow the user to configure class behavior by providing parameters that are used to specify the options for a particular instance of that test. For example, a Functional Test will take parameters PList and TestConditions, to specify the Pattern List to execute, and the Level and Timing conditions for the test, respectively. Specifying different values for these parameters (through the use of different "Test" blocks in the test plan description file) allows the user to create different instances of a Functional Test. FIG. 5 shows how different test instances 502 would be derived from a single test class 504.

These classes should be designed to allow the compiler 400 to take the description of the tests and their parameters from the test plan file and generate correct C++ code, which can be compiled and linked to generate the test program. Test class instances may be added to objects describing test flow to create a complex execution sequence of device tests C4. Derivation from ITest and IFlowable As mentioned above, Test classes derive from ITest. With the above rules, these can be implemented in C++ classes that implement the ITest interface. In addition to the methods specified for the ITest interface, these classes provide the Test-specific intelligence and logic required to perform specific classes of device test. Test classes also implement the IFlowable interface. As a consequence of this, instances of Test classes can be used in FlowItems to run tests.

Customization

Customization mechanisms are provided to allow users to call C functions, and develop their own classes implementing the ITest and IFlowable interfaces.

Introspection Capability

If an object of a Test class could be interrogated regarding its methods and signatures, then it could be verified that the appropriate parameters are available for inclusion in the generated source code. Such a feature would be very useful for error checking and validation during the translation phase. If the test engineer made a mistake in the names of parameters, or the number (or possibly the types) of arguments to these parameters, the translation phase could catch it and provide a meaningful error message at translation time instead of waiting for a compile-time error message from the C++ compiler. This would be more useful to the test engineer.

Introspection refers to the ability to ask an object to look within itself and return information regarding its attributes and methods. Some languages, such as Java, provide this ability as a part of the language. Other languages, such as Visual Basic, impose such a requirement on objects intended to be used with it. C++ makes no provisions for this feature.

This method also lends well to providing for default parameter values, as well as indications of optional parameters. In addition, if this capability is provided as a part of the implementation of all Test classes, then GUI applications could also use this information to dynamically build up dialogs and other user interface elements to help engineers make effective use of these classes.

These complexities are offset in an embodiment of the invention through a mechanism that provides, in lieu of full introspection, a method that allows the Test class developer to fully specify, in a single text-based source file (per Test class), the public methods/attributes of the Test class that the developer has designated as the ones required to parameterize the class.

A single source is preferred: one would not want to have the description of the parameterization interface of a Test class in one file, and the C++ interface description in another independent (header) file, and then be burdened with the need to keep both sources synchronized. Towards this end, the "text-based" description is embedded in a pre-header file for the Test class, which is used by the compiler for limited introspection, as well for generating the C++ header for the Test class. The generated C++ header file is the one used to finally compile the Test class C++ code.

The Pre-Headers

The use of headers in C++ is well known. Because C++ is difficult to parse and read, however, an embodiment of the invention defines a syntax allowing the compiler to create a C++ output which can be used as a header by a test class developer. According to this embodiment, the test class developer writes a pre-header, which is output by the compiler 400 as a header file, allowing visibility into the corresponding test classes or other test entities.

The following example illustrates the concept of the pre-header file for a Test class in accordance with the preferred embodiment of the present invention. Consider the following excerpt from a source file, with a test FuncTest1:

```
...
TestCondition TC1
{
    TestConditionGroup = TCG1;    # Previously defined TCG for Levels
    Selector = min;
}
TestCondition TC2
{
    TestConditionGroup = TCG2;    # Previously defined TCG for Timing
    Selector = min;
}
...
Test FunctionalTest FuncTest1
{
    PListParam = patList1;         # Previously defined pattern list
    TestConditionParam = TC1;
    TestConditionParam = TC2;
}
```

The compiler needs to know what a FunctionalTest entails in order to determine whether the declaration of FuncTest1 above is legal. Rather than building in the knowledge of a FunctionalTest into the compiler, the definition of what a FunctionalTest entails can be specified in the Pre-Header.

Assume that FunctionalTest is a C++ class having base classes Test1 and Test2, and having members which are a PList, and an array of TestConditions. The compiler needs to know about the types of the members of FunctionalTest in order to recognize that the above declaration of FuncTest1 is legal.

Furthermore, in order to generate a C++ object declaration for FuncTest1, a C++ header for the class FunctionalTest needs to be constructed. This requires compiler to also know about the base classes of the FunctionalTest class, the names of its members and other such information.

The pre-header sub-language of an embodiment of the invention provides the compiler with the information it needs to both recognize the legality of declarations, and to generate C++ headers and object declarations that correspond to declaration.

Note that a FunctionalTest is a simple type (as far as parameterization is concerned), and thus, would use quite a simple description for parameterization. One could thus write a pre-header, FunctionalTest.ph, that supports the above parameterization as follows (assume that pre-headers are available for the base test classes Test1 and Test2):

```
 1  Version 1.0;
 2  #
 3  # Parameterization specification pre-header for FunctionalTest
 4  #
 5  Import Test1.ph;         # For base class Test1
 6  Import Test2.ph;         # For base class Test2
 7  TestClass = FunctionalTest; # The name of this test class
 8  PublicBases = Test1, Test2; # List of public base classes
 9  # The parameters list or "parameter block":
10  Parameters
11  {
12      # The following declaration specifies that a FunctionalTest has
13      #  - a parameter of type PList
14      #  - [represented by C++ type Tester::PatternTree]
15      #  - stored in a member named m_pPatList
16      #  - a function to set it named setPatternTree.
17      #  - a parameter description for the GUI to use as a tool tip
18      PList PListParam
19      {
20          Cardinality = 1 ;
21          Attribute = m_pPatList;
22          SetFunction = setPatternTree;
23          Description = "The PList parameter for a FunctionalTest";
24      }
25      #
26      # The following declaration specifies that a FunctionalTest has
27      #  - 1 or more parameters of type TestCondition
28      #  - [represented by C++ type Tester::TestCondition]
29      #  - stored in a member named m_testCondnsArray
30      #  - a function to set it named addTestCondition.
31      #  - a parameter description for the GUI to use as a tool tip
32      # The [implement] clause causes the translation phase of to
33      # generate a default implementation of this function.
34      #
35      TestCondition TestConditionParam
36      {
37          Cardinality = 1–n;
38          Attribute = m_testCondnsArray;
39          SetFunction = addTestCondition [Implement];
40          Description = "The TestCondition parameter for a FunctionalTest";
41      }
42  }
43  #
44  # The section below is part of the Pre-Header which is an escape
45  # into C++ code. This will be referred to as a "template block."
46  #
47  # Everything in this section will be reproduced verbatim in the
48  # generated header file, except for "$Class", "$Inc",
49  # "$ParamAryTypes", "$ParamAttrs", "$ParamFns" and "$ParamImpls".
50  #
51  # Note that no comments beginning with the '#' character are supported
52  # within the following section.
53  #
54  CPlusPlusBegin
55  $Inc
56  namespace
57  {
58  class $Class
59  {
60  // Array types for parameters storage:
61  $ParamAryTypes
62  public:
63      virtual void preExec( );
64      virtual void exec( );
65      virtual void postExec( );
66  $ParamFns
67      ...
68  private:
69      double m_someVar;
70  $ParamAttrs
71      ...
72  };
73  ...
74  $ParamImpls
75  } // End namespace
76  CPlusPlusEnd
```

C++ Parameterized Test Classes

As the compiler processes a pre-header file, it builds up the values of the compiler variables such as $Inc, $Class, $ParamAryTypes and others. This enables it to then create following C++ header by generating the C++ code above verbatim, and expanding in the values of the compiler variables $Inc, $Class, etc. at the indicated places. For FunctionalTest.ph, it creates the following C++ header file FunctionalTest.h for the FunctionalTest class.

```
1    #line 7 "./FunctionalTest.ph"
2    #include <ITest.h>
3    #line 5 "./FunctionalTest.ph"
4    #include <Test1.h>
5    #line 6 "./FunctionalTest.ph"
6    #include <Test2.h>
7    #line 55 "./FunctionalTest.ph"
8    #include <vector>
9    #line 55 "./FunctionalTest.ph"
10   #include <Levels.h>
11   #line 55 "./FunctionalTest.ph"
12   #include <TestCondnGrp.h>
13   ...
14   #line 56 "./FunctionalTest.ph"
15   namespace
16   {
17   #line 7 "./FunctionalTest.ph"
18   class FunctionalTest : public ITest,
19   #line 8 "./FunctionalTest.ph"
20                          public Test 1,
21   #line 8 "./FunctionalTest.ph"
22                          public Test2
23   #line 59 "./FunctionalTest.ph"
24   {
25   // Array types for parameters storage:
26   #line 61 "./FunctionalTest.ph"
27   public:
28   #line 37 "./FunctionalTest.ph"
29       typedef std::vector<Tester::TestCondition *>
         TestConditionPtrsAry_t;
30   #line 62 "./FunctionalTest.ph"
31   public:
32       virtual void preExec( );
33       virtual void exec( );
34       virtual void postExec( );
35   public:
36   #line 7 "./FunctionalTest.ph"
37       void setName(OFCString &name); # Automatic for all tests
38   #line 22 "./FunctionalTest.ph"
39       void setPatternTree(PatternTree *);
40   #line 23 "./FunctionalTest.ph"
41       String getPListParamDescription( ) const;
42   #line 39 "./FunctionalTest.ph"
43       void addTestCondition(TestCondition *);
44   #line 40 "./FunctionalTest.ph"
45       void getTestConditionParamDescription( ) const;
46   #line 67 "./FunctionalTest.ph"
47       ...
48   private:
49       double m_someVar;
50   #line 70 "./FunctionalTest.ph"
51   private:
52   #line 7 "./FunctionalTest.ph"
53       OFCString m_name; # Automatic for all tests
54   #line 21 "./FunctionalTest.ph"
55       Tester::PatternTree *m_pPatList;
56   #line 38 "./FunctionalTest.ph"
57       TestConditionPtrsAry_t m_testCondnsArray;
58   #line 71 "./FunctionalTest.ph"
59       ...
60   };
61   ...
62   #line 7 "./FunctionalTest.ph"
63   inline void
64   #line 7 "./FunctionalTest.ph"
65   FunctionalTest::setName(OFCString &name)
66   #line 74 "./FunctionalTest.h"
67   {
68       m_name = name;
69       return;
70   }
71   #line 39 "./FunctionalTest.ph"
72   inline void
73   #line 39 "./FunctionalTest.ph"
74   FunctionalTest::addTestCondition(TestCondition *arg)
75   #line 74 "./FunctionalTest.ph"
76   {
77       m_testCondnsArray.push_back(arg);
78       return;
79   }
80   #line 23 "./FunctionalTest.ph"
81   inline void
82   Tester::String FunctionalTest::getPListParamDescription( )
83   {
84       return "The PList parameter for a FunctionalTest";
85   }
86   #line 40 "./FunctionalTest.ph"
87   inline void
88   Tester::String
         FunctionalTest::getTestConditionParamDescription( )
89   {
90       return "The TestCondition parameter for a FunctionalTest";
91   }
92   #line 75 "./FunctionalTest.ph"
93   } // End namespace
```

As described earlier, this pre-header enables the compiler to check the validity of a FunctionalTest declaration, to generate code for it, and to generate a C++ header that would be needed by it.

As an Example, consider the FunctionalTest declaration given earlier, for convenience:

```
Test FunctionalTest FuncTest1
{
    PListParam = patList1;       # Previously defined pattern list
    TestConditionParam = TC1;
    TestConditionParam = TC2;
}
```

The C++ header that would be generated for this by the compiler is given above. The compiler would generate the following code for the above FunctionalTest construct:

```
FunctionalTest FuncTest1;
FuncTest1.setName("FuncTest1 ");
FuncTest1.setPatternTree(&patList1);
FuncTest1.addTestCondition(&TC1);
FuncTest1.addTestCondition(&TC2);
```

Notice also the name that is generated for the Description function. Each parameter named Xxx is associated with a member function:

Status getxxDescription( ) const;

that returns the string with a description for the tool tip that the GUI can use.

Other Pre-Header Features

The pre-header supports some other user defined enumerations as an additional type. This allows the GUI to provide a drop down list of possible choices that could be used for setting the value of a particular parameter. Furthermore, the pre-header provides a feature to associate a number of parameters that can be thought of as a table. For example, it may be convenient to implement an array of "properties" as an associated set of an array of strings for the names, and an array of integers for the values. One easy way of implementing this feature is to use an array of custom types (discussed later). However, that requires the user to write a custom type pre-header to use. Both of these features are illustrated in the following example:

```
# ----------------------------------------------------------
# File FooBarTest.ph

# Parameterization specification pre-header for
# custom test class FoobarTest
# ----------------------------------------------------------
Version 1.0;
Import Test1.ph;          # For base class Test1
TestClass = FoobarTest; # The name of this test class
PublicBases = Test1; # List of public base classes
# The parameters list:
Parameters
{
    # An enumerated type
    Enum WishyWashy = Yes, Perhaps, Possibly, Maybe, MaybeNot, No;
    # Define a WishyWashy parameter.
    WishyWashy WW
    {
        Cardinality = 1;
        Attribute = m__ww;
        SetFunction = setWw;
        Description = "The WW parameter for a Foobar Test";
    }
    # This class has an array of name-number pairs that is
    # interpreted in the class.
    ParamGroup
    {
        Cardinality = 0–n;
        # The Name field in this array is:
        #  - of type String
        #  - [represented by C++ type Tester::String]
        #  - stored in a member named m__NameArray
        #  - a function to set it named addName.
        #  - a parameter description for the GUI to use as a tool tip
        String Name
        {
            Attribute = m__NameArray;
            SetFunction = addName;
            Description = "A Name with a Value";
        }
        # The Number field in this array is:
        #  - of type Integer
        #  - [represented by C++ type int]
        #  - stored in a member named m__NumberArray
        #  - a function to set it named addNumber.
        #  - a parameter description for the GUI to use as a tool tip
        Integer Number
        {
            Attribute = m__NumberArray;
            SetFunction = addNumber,
            Description = "The value of the Name";
        }
    }
    # The following declaration specifies that a FunctionalTest has
    #  - a parameter of type PList
    #  - [represented by C++ type Tester::PatternTree]
    #  - stored in a member named m__pPatList
    #  - a function to set it named setPatternTree.
    #  - a parameter description for the GUI to use as a tool tip
    PList PListParam
    {
        Cardinality = 1;
        Attribute = m__pPatList;
        SetFunction = setPatternTree;
        Description = "The PList parameter for a FunctionalTest";
    }
    #
    # The following declaration specifies that a FunctionalTest has
    #  - 1 or more parameters of type TestCondition
    #  - [represented by C++ type Tester::TestCondition]
    #  - stored in a member named m__testCondnsArray
    #  - a function to set it named addTestCondition.
```

```
    # The [implement] clause causes the translation phase of to
    # generate a default implementation of this function.
    #
    TestCondition TestConditionParam
    {
        Cardinality = 1–n;
        Attribute = m__testCondnsArray;
        SetFunction = addTestCondition [Implement];
        Description = "The TestCondition parameter for a FunctionalTest";
    }
}
CPlusPlusBegin
$Inc
namespace
{
class $Class
{
// Array types for parameters storage:
$ParamAryTypes
public:
    virtual void preExec( );
    virtual void exec( );
    virtual void postExec( );
    $ParamFns
    // ...
private:
    double m__someVar;
    $ParamAttrs
    // ...
};
// ...
$ParamImpls
} // End namespace
CPlusPlusEnd
```

It must be noted that a custom type name-number pairs could have been declared, and a single array parameter of that custom type could have been used to have the same effect as the above ParamGroup of parameters. The technique presented above is a convenience that avoids the necessity of declaring a custom type.

C5. Custom Function Declarations

This allows the user to call custom functions when a flow transition takes place. Custom functions are declared through pre-header as follows:

```
# ----------------------------------------------------------
# File MyFunctions.ph

# Parameterization specification pre-header for MyFunctions
# ----------------------------------------------------------
Version 1.0;
Functions = MyFunctions;    # The name of this group of functions
# Declare the following C++ function in the
# MyFunctions namespace to determine the minimum
# of two values.
#       // Return the minimum of x, y
#       double MyRoutines::Min
#           (ITestPlan* pITestPlan,int& x, int& y);
Integer Min(Integer x, Integer y);
# Declare the following C++ function in the
# UserRoutines namespace to return the average of
# an array.
#       // Return the average of the array
#       double MyRoutines::Avg
#           (ITestPlan* pITestPlan, double* a, const int a__size);
# The C++ function will be called with a and a'Length
Double Avg(Double a[ ]);
# Declare the following C++ function in the
# UserRoutines namespace to print the dut id
# and a message
```

-continued

```
#      // Return the average of the array
#      double MyRoutines::Print
#         (ITestPlan* pITestPlan, String* msg, unsigned int&
dutId);
# The C++ function will be called with a and a'Length
Void Print(String msg, UnsignedInteger dutId);
```

Typically a C++ section needs to be provided for the above declarations, as the compiler will expand these declarations in a standard way. The user is of course responsible for the C++ implementation of these functions. Note that all of the above functions will presumably take an ITestPlan pointer as an implicit first parameter. This pointer provides the function writer access to stateS in the TestPlan. For instance, the function writer could use the ITestPlan interface to access the current Flow, the current FlowItem in the flow, the current Result clause, values of UserVars, and other such information. Certain tester defined functions are available for use in the file Functions.ph:

```
Version 1.2.3;

# File Functions.ph

Functions = Functions;       # The name of this group of functions
# Declare the following C++ function in the
# Functions namespace
# Returns the ID of the current DUT being tested by the
# caller.
UnsignedInteger GetDUTID( );
```

C++ for Custom Function Declarations

The C++ code that would be generated by compiler for MyFunctions above is to simply declare some functions in the MyFunctions namespace:

```
namespace MyFunctions
{
    double Min(ITestPlan* pITestPlan, int& x, int& y);
    double Avg(ITestPlan* pITestPlan, double* a, const int a_size);
    void Print(ITestPlan* pITestPlan, char* Msg, unsigned int dutID);
}
```

These functions will be callable from a flow.

C6. Custom Flowables

It is also possible to create a pre-header implementing the C++ IFlowable interface using the pre-header. This enables a user to define custom flowables that can be run in a FlowItem. Shown below is a pre-header for the user-defined Flowable MyFlowable:

```
--------------------------------------------------------
# File MyFlowable.ph

# Parameterization specification pre-header for MyFlowable
# --------------------------------------------------------
Version 1.2.4;
FlowableClass = MyFlowable;      # The name of this custom class
# The parameters list:
Parameters
{
# The following declaration specifies that a MyFlowable has
#  - 1 optional parameter Int1 of type Integer
#  - [represented by C++ type int]
#  - stored in a member named m_int1Val
#  - a function to set it named setInt1Val.
Integer Int1
{
    Cardinality = 0–1;
    Attribute = m_int1Val;
    SetFunction = setInt1Val;
}
# The following declaration specifies that a MyFlowable has
#  - 1 mandatory parameter Int2 of type Integer
#  - [represented by C++ type int]
#  - stored in a member named m_int2Val
#  - a function to set it named setInt2Val.
Integer Int2
{
    Cardinality = 1;
    Attribute = m_int2Val;
    SetFunction = setInt2Val;
}
# The following declaration specifies that a MyFlowable has
#  - one or more parameters of type String
#  - [represented by C++ type Tester::String]
#  - stored in a member named m_stringArrVal
#  - a function to set it named addStringVal.
String StringItem
{
    Cardinality = 1–n;
    Attribute = m_stringArrVal;
    SetFunction = addStringVal;
}
# The following declaration specifies that a MyFlowable has
#  - A single PList parameter
#  - [represented by the C++ type Tester::PList]
#  - stored in a member named m_plist
#  - a function to set it named setPListParam
PList PListParam
{
    Cardinality = 1;
    Attribute = m_plist;
    SetFunction = setPListParam;
}
}

# The section below is part of the Pre-Header which is an escape
# into C++ code.

# Everything in this section will be reproduced verbatim in the
# generated header file, except for "$Class", "$Inc",
# "$ParamAryTypes", "$ParamAttrs", "$ParamFns" and
# "$ParamImpls".

# Note that no comments beginning with the '#' character are
supported
# within the following section.

CPlusPlusBegin
$Inc
namespace
{
class $Class
{
// Array types for parameters storage:
$ParamAryTypes
public:
    virtual void preExec( );
    virtual void exec( );
    virtual void postExec( );
    $ParamFns
    // ...
private:
    double m_someVar;
    $ParamAttrs
    // ...
};
// ...
```

```
$ParamImpls
} // End namespace
CPlusPlusEnd
```

There are several classes implementing the IFlowable interface. These include:

1. Flows for program loading which will check whether a test plan can be executed within the current tester configuration.
2. Flows for pattern loading which will load specific patterns and pattern lists.
3. Flows for initialization which will put hardware and software in a known state, load global variables, and do other initialization and validation functions.
4. Other generally useful test flows.

C7. Custom Types

The discussion on Test class parameterization earlier only allowed for test class parameters to be of known types, viz., elementary types and tester-defined types such as PLists, and TestConditions. For user flexibility, it is important to provide type extensibility, whereby types (that are unknown a-priori to the compiler) can be created and used. Custom types (CTS) will be defined in the Custom Types. These can be used to define types corresponding to C-language structs (also referred to as Plain Old Data types, or PODs, which are quite different from their namesakes in C++) as well as for types corresponding to C-language typedefs for function signatures. A separate file with user types will have the extension .ctyp. Here is an example of a user types declaration in accordance with the preferred embodiment of the present invention:

```
--------------------------------------------------------
# File MyCustomTypes.ctyp
#--------------------------------------------------------
Version 1.0.0;
CustomTypes
{
    # A structured Plain-Old-Data type
    Pod Foo
    {
        String      S1;     # String is a standard type
        Integer I1;         # ... and so is Integer
        String      S2;
    }
    # Another structured type using Foo
    Pod Bar
    {
        Foo             Foo1;
        String      S1;
        Foo             Foo2;
    }
    #
    # A pointer to a function.
    #       Return type:        Integer
    #       Parameters:         Integer, Integer
    #
    Routine BinaryOp(Integer, Integer) Returns Integer;
    #
    # Another pointer to a function.
    #       Return type:        Void
    #       Parameter: Integer
    #
    Routine UnaryOp(Integer) Returns Void;
    #
    # A pointer to a function that takes
    # no parameters and does not return a value.
    #
    Routine NullaryOp( ) Returns Void;
}
```

C++ for Custom Types

The CustomTypes declaration presented above will be translated by the compiler into the following C++ code:

```
namespace CustomTypes
{
    struct Foo
    {
        Tester::String          S1;
        int                     I1;
        Tester::String          S2
    };
    struct Bar
    {
        Foo                             Foo1
        Tester::String          S1;
        Foo                             Foo2;
    };
    typedef int (*BinaryOp) (int&, int&);
    typedef void (*UnaryOp)(int);
    typedef void (*NullaryOp)( );
}
```

Objects of these types can be passed to Test classes as parameters, as shown next.

Using Custom Types as Test Class Parameters

Consider the case where the user has an extension to a test, which needs to be initialized with—in addition to pattern lists and test conditions—other class objects, as well as arbitrary (i.e., user-defined) objects that are defined within a file containing Custom Types (i.e., a .ctyp file). For example, suppose the user wants to use the CTs defined in the file MyTestCTs.ctyp:

```
# File MyTesetCTs.ctyp
Version 1.0;
CustomTypes
{
    Pod Foo
    {
        String      name;
        PList       patternList;
    }
    Pod Bar
    {
        Foo         someFoo;
        Double      dVal;
    }
    Routine BinaryOp(Integer, Integer) return Integer;
}
```

All that the user needs to do to use the above types is import the above file in his test class pre-header. Since the compiler interprets CTs that are so defined, the definitions for Foo and Bar are therefore available to it when it is processing the test class pre-header. Moreover, the compiler defines two C-language structs, struct Foo and struct Bar, corresponding respectively to the types Foo and Bar above, the definitions for which are placed in the file myTestCTs.h.

The Import statement for myTestCTs.ctt causes the file myTestCTs.h to be #include-d in the generated test class C++ header. The following example illustrates this process. First, consider the declaration for the test in the test plan (the declarations for pattern lists and test conditions have been omitted for clarity):

```
...
Import MyFunctions.ph;
Import MyCustomTypes.ctyp;
...
# The CustomVars block defines variables of the Custom
# types defined earlier.
CustomVars
{
    ...
    Bar bar1 =
    {
        { "This is a Foo", somePatList },    # someFoo
        3.14159                              # dVal
    }
    #
    # A function object that is a binary operator.
    # The name on the right hand side of the assignment
    # is a routine declared in MyFunctions, for which,
    # of course, the user has to provide an implementation.
    #
    BinaryOp bop1 = MyFunctions.Min;
}
...
Test MyFancyTest MyTest1
{
    ...
    BarParam = bar1;
    BinaryOpParam = bop1;
}
...
```

In the above example, a CustomVars block is included in a test plan. A separate file with customization variables will have the extension .cvar. The user would write a pre-header for MyFancyTest that supports the above parameterization as follows (the parameterization declarations for pattern lists and test conditions have been omitted for clarity):

```
# ---------------------------------------------------------
# File MyFancyTest.ph

# Parameterization specification pre-header for MyFancyTest
# ---------------------------------------------------------
Version 1.0.2;
Import MyCustomTypes.ctyp;     # For CTs used in MyFancyTest
Import FunctionalTest.ph;      # For base class FunctionalTest
TestClass = MyFancyTest;       # The name of this test class
PublicBases = FunctionalTest;  # List of public base classes
# The parameters list:
Parameters
{
    # The following declaration specifies that a MyFancyTest has
    #   - an optional array of parameters of custom type Bar
    #   - [represented by C++ type CustomTypes::Bar]
    #   - stored in a member named m_barsArray
    #   - a function to set it named addBarParam.
    # An implementation will be generated for addBarParam.
    Bar BarParam
    {
        Cardinality = 0-n;
        Attribute = m_barsArray;
        SetFunction = addBarParam [Implement];
    }
    # The following declaration specifies that a MyFancyTest has
    #   - an optional parameter of custom type BinaryOp
    #   - [represented by C++ type CustomTypes::BinaryOp]
    #   - stored in a member named m_binaryOp
    #   - a function to set it named setBinaryOpParam.
    # An implementation will be generated for setBinaryOpParam.
    BinaryOp BinaryOpParam
    {
        Cardinality = 0-1;
        Attribute = m_binaryOp;
        SetFunction = setBinaryOpParam [Implement];
    }
}
CPlusPlusBegin
$Inc
namespace
{
class $Class
{
$ParamAryTypes
public:
    virtual void preExec( );
    virtual void exec( );
    virtual void postExec( );
    $ParamFns
    // ...
private:
    double m_someVar;
    $ParamAttrs
    // ...
};
// ...
$ParamImpls
} // End namespace
CPlusPlusEnd
```

C++ for Custom Test Classes using Custom Types

Finally, once the compiler has processed this pre-header file, it will create the following C++ header file for the MyFancyTest class, MyFancyTest.h:

```
#include <MyCustomTypes.h>
#include <ITest.h>
#include <FunctionalTest.h>
...
namespace
{
class MyFancyTest : public ITest,
                    public FunctionalTest
{
public:
    typedef std::vector<CustomTypes::Bar *> BarAry_t;
public:
    virtual void preExec( );
    virtual void exec( );
    virtual void postExec( );
public:
    void setName(OFCString &name); # Automatic for all tests
    void setPatternTree(PatternTree *);
    void addTestCondition(TestCondition *);
    void addBarParam(CustomTypes::Bar *);
    void setBinaryOpParam(CustomTypes::BinaryOp *);
    ...
private:
    double m_someVar;
private:
    OFCString m_name; # Automatic for all tests
    PatternTree *m_pPatList;
    TestConditionPtrsAry_t m_testCondnsArray;
    BarAry_t m_barsArray;
    BinaryOp *m_binaryOp;
    ...
}; // End class MyFancyTest
...
inline void
```

-continued

```
MyFancyTest::addBarParam(CustomTypes::Bar *arg)
{
    m_barsArray.push_back(arg);
    return;
}
inline void
MyFancyTest::setBinaryOpParam(CustomTypes::BinaryOp
*arg)
{
    m_binaryOp = arg;
    return;
}
} // End namespace
```

C8. Parameterization

As seen above, a pre-header for a Test class, custom Flowable class, or custom function definitions offers limited introspection into the class/functions through a parameterization specification section. The compiler uses this section to generate the parameterization interface for the class/function (and generate the class/function header itself). For Test classes and Flowable classes, it also uses this section to subsequently generate the calls in the Test Plan code to initialize an instance of that class. The following points concerning pre-headers and corresponding declaration should be noted:

1. Every Test or custom Flowable class definition is preferably specified in a pre-header. The Parameters block in the pre-header is preferably the only place where the parameters list for such a class can be specified. (Thus, as a corollary, the "standard" parameters for a Test, such as pattern list and test condition specifications, also need to be included in the pre-header's Parameters block; this allows all parameters, standard and CTs, to be treated uniformly.)
2. All parameters defined as non-optional (i.e., with a non-zero cardinality) in the pre-header for a Test or Flowable class should be initialized in the Test block or Flowable block declaration for an instance of that class.
3. The objects used for initialization of parameters in the Test/Flowable block should have been defined previously.
4. The replacement indicators $Class, $Inc, $ParamAry-Types, $ParamFns, $ParamAttrs and $ParamImpls must appear at the exact locations within the user code section of the pre-header that the user intends the corresponding generated code to be inserted at in the generated class header file. These should appear exactly once, since specific code is generated for each.
5. The name of a parameter specification in the Parameters block of the pre-header (such as PListParam, TestConditionParam or BarParam in the examples above) is the name of the parameter to be used in the declaration of an instance of that class.
6. The following are the semantics of the descriptors used in a parameter specification:
    a. Cardinality: This indicates the number of parameters of this type that will be supported. The following are the possible values in one embodiment:
        i. 1: This parameter is mandatory, and should be specified exactly once. This parameter will be maintained as a pointer to an object of the type of the parameter.
        ii 0-1: This parameter is optional; if specified, it must be specified only once. This parameter will be maintained as a pointer to an object of the type of the parameter.
        iii 1-n: This parameter is mandatory. Moreover, multiple values can be specified for this. The values will be stored in the order of specification.
        iv 0-n: This parameter is optional. Multiple values can be specified for this. The values will be stored in the order of specification.
            Note that for ( ) and ( ) above, all specified values will be stored in an STL vector< >, templated on a pointer to the type of the parameter. The type of this vector will be defined and inserted at the point indicated by $ParamAryTypes. The access level for these type definitions is always public.
    b. Attribute: The name of the C++ variable to use as the store for parameter value(s) of this type. The name will be reproduced verbatim, as a private data member of the C++ class, and must conform to the requirements for a C++ identifier. Note that the type of this attribute is:
        i. A pointer to the type of the parameter, if only single values are permitted;
        ii. An STL vector< >, templated on a pointer to the type of the parameter, if multiple values are permitted (see ( ) above).
            Note that the attributes hold references to objects created and populated by the Test Plan, and do not own these objects. The lifetime of the objects are always managed by the Test Plan itself.
    c. SetFunction: The name of the function to use for setting a value for this parameter. The following points should be noted:
        i. The name will be reproduced verbatim, and hence, must conform to C++ language requirements.
        ii. The access level of the function is always public.
        iii. The return type is always void.
        iv. The function always takes only a single argument, of type pointer-to-parameter-type.
    Note that a value is always set singly; i.e., for parameters that allow specification of multiple values, the generated code in the Test Plan will call this function repeatedly, once for every value specified, each of which will be added to an STL vector (as described above).
    The optional keyword "[implement]" following the function name indicates that a trivial implementation for this function will be made available as an inline method in the class header (inserted at the point indicated by $ParamIm-pls). Otherwise, the user is responsible for providing an implementation of the function.
    d. Description: A string literal that is a tooltip which will be used by a GUI tool to provide help during runtime modification of this parameter. The C++ member function generated in the custom class for a parameter named Xxx will be
    String getXxxDescription ( ) const;
    The function will return the specified string.

Test Plan Example with Customization

Shown below is the test plan example embellished with some customization:

```
# ----------------------------------------------------------
# File MyCustomizedTestPlan.tpl
# ----------------------------------------------------------
Version 0.1;

# Imports as before ...
# The following import is implicit, but can be explicitly
# provided.
Import FunctionalTest.ph;
# Import for MyFlowables, MyFunctions and Functions
Import MyFlowables.ph;
Import MyFunctions.ph;
Import Functions.ph;
#----------------------------------------------------------
# Start of the test plan
#----------------------------------------------------------
TestPlan Sample;
# This block defines Pattern Lists file-qualified names and
# Pattern List variables that are used in Test declarations.
# The file-qualified names refer to pattern lists in the named
# files. The variables refer to String variables which will
# hold the pattern list names at run time. User defined Flowable
# objects could set the values of these variables through an
# API.
PListDefs
{
    # File qualified pattern list names
    pl1A.plist:pat1Alist,
    pl2A.plist:pat2AList,
    # Pattern list variables
    plistXxx,
    plistYyy,
    plistZzz
}
# SocketDef, UserVars declaration as before ...
# Declarations of TestConditions TC1Min, TC1Typ, TC1Max,
# TC2Min, TC2Typ, TC2Max as before ...

# Declare a FunctionalTest. "FunctionalTest" refers to a C++
# test class that runs the test, and returns a 0, 1 or 2 as
# a Result. The Test Condition Group TCG1 is selected with
# the "min" selector by referring to the TC1Min TestCondition.

# Note that compiler can compile this because of the imported
# FunctionalTest.ph file.

Test FunctionalTest MyFunctionalTest1Min
{
    PListParam = pat1AList;
    TestConditionParam = TC1Min;
}

# Additional FunctionalTest declarations for the following, as before
#           MyFunctionalTest1Typ
#           MyFunctionalTest1Max
#           MyFunctionalTest2Min
#           MyFunctionalTest2Typ
#           MyFunctionalTest2Max

# Here is a declaration of MyFlowable. It uses a PatternList variable
# plistXxx which is initialized by the flowable prior to use here.

# Compiler can compile this because of the imported MyFlowables.ph
file:
Flowable MyFlowable MyFlowable1
{
    Int1 = 10;
    Int2 = 20;
    StringItem = "Hello World";
    PListParam = plistXxx;
}
```

-continued

```
# Counters for PassCount and FailCount as before ...
# Flows as before. Flows FlowTest1 and FlowTest2 are
# unchanged from the previous example.
Flow FlowTest1
{
    # ...
}
Flow FlowTest2
{
    # ...
}

# Now FlowMain, a main flow, can be presented. It
# implements a finite state machine that calls FlowTest1
# and FlowTest2 as below:
# ----------------------------------
#                                           Result 0            Result 1
# ----------------------------------
#           FlowMain_1                      FlowMain_2          return 1
#           FlowMain_2                      FlowMain_3          return 1
#           FlowMain_3                      FlowMain_4          return 1
#           FlowMain_4                      FlowMain_5          return 1
#           FlowMain_5                      return 0            return 1

# Where the IFlowables run by each FlowItem are:
# ----------------------------------------
#           FlowItem                        IFlowable that is run
# ----------------------------------------
#           FlowMain_1                      MyFlowable1
#           FlowMain_2                      DatalogStartFlow
#           FlowMain_3                      FlowTest1
#           FlowMain_4                      FlowTest2
#           FlowMain_5                      DatalogStopFlow

Flow FlowMain
{
    #
    # The first declared flow is the initial flow to be
    # executed. It goes to FlowMain_InitializationFlow
    # on success, and returns 1 on failure.
    #
    FlowItem FlowMain_1 MyFlowable1
    {
        Result 0
        {
            Property PassFail = "Pass";
            IncrementCounters PassCount;
            # A user function call
            MyFunctions.Print ("Passed MyFlowable1",
                                        Functions.GetDUTID( ));
            GoTo FlowMain_2;
        }
        Result 1
        {
            Property PassFail = "Fail";
            IncrementCounters FailCount;
            # A user function call
            MyFunctions.Print("Failed MyFlowable1",
                                        Functions.GetDUTID( ));
            SetBin SoftBins."3GHzLeakage";
            Return 1;
        }
    }
    #
    # Goes to FlowMain_3 on success
    # and returns 1 on failure.
    #
    FlowItem FlowMain_2 DatalogStartFlow
    {
        Result 0
        {
            Property PassFail = "Pass";
            IncrementCounters PassCount;
            # A user function call
            MyFunctions.Print("Passed DatalogStartFlow",
                                        Functions.GetDUTID( ));
            GoTo FlowMain_3;
        }
```

```
        Result 1
        {
            Property PassFail = "Fail";
            IncrementCounters FailCount;
            MyFunctions.Print("Failed DatalogStartFlow",
                              Functions.GetDUTID( ));
            Return 1;
        }
    }
}
# This FlowItem calls the previously defined FlowTest1
FlowItem FlowMain_3 FlowTest1
{
    Result 0
    {
        Property PassFail = "Pass";
        IncrementCounters PassCount;
        # A user function call
        MyFunctions.Print("Passed FlowTest1",
                          Functions.GetDUTID( ));
        GoTo FlowMain_4;
    }
    Result 1
    {
        Property PassFail = "Fail";
        IncrementCounters FailCount;
        # A user function call
        MyFunctions.Print("Failed FlowTest1",
                          Functions.GetDUTID( ));
        SetBin SoftBins."3GHzCacheFail";
        Return 1;
    }
}
# This FlowItem calls the previously defined FlowTest2
FlowItem FlowMain_4 FlowTest2
{
    Result 0
    {
        Property PassFail = "Pass";
        IncrementCounters PassCount;
        # A user function call
        MyFunctions.Print("Passed FlowTest2",
                          Functions.GetDUTID( ));
        GoTo FlowMain_5;
    }
    Result 1
    {
        # FlowTest1 passed, but FlowTest2 failed
        Property PassFail = "Fail";
        IncrementCounters FailCount;
        # A user function call
        MyFunctions.Print("Failed FlowTest2",
                          Functions.GetDUTID( ));
        SetBin SoftBins."3GHzSBFTFail";
        Return 1;
    }
}
FlowItem FlowMain_5 DatalogStopFlow
{
    Result 0
    {
        # All Passed!
        Property PassFail = "Pass";
        IncrementCounters PassCount;
        # A user function call
        MyFunctions.Print("Passed all!",
                          Functions.GetDUTID( ));
        SetBin SoftBins."3GHzAllPass";
        Return 0;
    }
    Result 1
    {
        # FlowTest1 and FlowTest2 passed,
        # but DatalogStopFlow failed
        Property PassFail = "Fail";
        IncrementCounters FailCount;
        # A user function call
        MyFunctions.Print("Failed DatalogStopFlow",
                          Functions.GetDUTID( ));
            Return 1;
        }
    }
}
```

The following points need to be noted about the above code:

1. The PListDefs section here has some PList names and also some PList variables. The PList names are names that can directly be used in tests. The PList variables are variables which can be used in tests, and whose value is bound at runtime to actual PLists by code in a customized Flowable.
2. The PListDefs section is optional. If not present, its contents will be inferred by compiler from the various Test declarations. If present, it must declare all of the used PList parameters of Tests, though it may declare more.
3. A runtime API will be available to assign values to PList variables. The TestPlan class will have a function:
   Status SetPListVariable(const Tester::String& varName, const Tester::String& fileQualifiedPListName);
   The Flowable will be able to use the above function to bind a PListVariable to a particular PList.
4. User functions and functions can be called in FlowItems just prior to a transition, which is either a transfer of control to another FlowItem, or a return.

C++ for User Function Calls

With the exception of invoking custom function calls in flows, C++ code that would be generated by the compiler has been shown for the various customization techniques presented earlier. User function calls in a FlowItem are preferably handled by an IUserCalls member of each Flow. Each Flow preferably has a member of the interface IUserCalls which exports a single virtual member function, as shown below:

```
class IUserCalls
{
public:
    virtual void exec(const String& flowItemName,
                     unsigned int result) = 0;
};
```

When a Flow with user function calls is encountered, the Flow gets populated with an instance of a class that implements the above interface. For example, in FlowMain in the example in the flow will be populated with an instance of the following class:

```
class FlowMain_UserCalls : public IUserCalls
{
public:
    virtual void exec(const String& flowItemName,
                     unsigned int result)
    {
        if (flowItemName == "FlowMain_1")
        {
            // ...
        } else if (flowItemName == "FlowMain_2")
        {
            // ...
        } else if (flowItemName == "FlowMain_3")
        {
```

```
            switch (result)
            {
            case 0:
                    MyFunctions::Print("Passed FlowTest1",
                                            Functions::GetDUTID( ));
                    return;
            case 1:
                    MyFunctions::Print("Failed FlowTest1",
                                            Functions::GetDUTID( ));
                    return;
            default:
                    return;
            }
        }
        else if (flowItemName == "FlowMain_4")
        {
            // ...
        }
        else if (flowItemName == "FlowMain_5")
        {
            // ...
        }
    }
};
```

The FlowItem::execute( ) operation knows the name of the flow item. Before it returns with the pointer to the next flow, it will call IUserCalls::exec( ) for the enclosing flow, passing its own flow item name, and the value of the current result. This will cause the above code to be executed, invoking the needed user defined functions.

C9. Test Program Compilation

As explained above, the Test Plan description file specifies the objects used in a test plan and their relationships to one another. In one embodiment, this file is translated to the C++ code that will be executed on the Site Controller in the form of an implementation of a standard interface ITestPlan. This code can be packaged into a Windows dynamic link library (DLL) which can be loaded onto the Site Controller. The Test Program DLL is generated to have standard known entry points that the Site Controller software can use to generate and return the TestPlan object it contains.

Construction from a Test Plan Description

The process of conversion from a test plan description to an implementation of ITestPlan is accomplished by the test program compiler 400. This process occurs in two phases: translation and compilation.

In the translation phase 402, the compiler 400 processes a test plan file (and the various other files it imports), as well as the pre-headers for all the test types used in the test plan. In this phase, it creates the C++ code for the Test Plan object and the C++ headers for the test types encountered, along with all other supporting files, such as MSVC++ (Microsoft Visual C++) workspace and project files, DLL "boilerplate" code, etc. The compiler 400 inserts file and line directives into the generated code to ensure that compile-time error messages refer back to the appropriate location in the description file instead of pointing into the generated code.

In the compilation phase, which occurs after the compiler has created the necessary files, a standard compiler 404, such as an MSVC++ compiler, is invoked to compile the files and link them into a DLL.

The compiler takes, as input, a valid test plan file (and all related files), and generates, as necessary, a TestPlan file and all other files represented by "Import" directives in the test plan file. In addition, it generates a MSVC++ "Solution" to build the Test Plan DLL. For example, if the main file (MyTestPlan.tpl) included Timing1.time to incorporate timing information, then the compiler would create (among others) the following files:

MyTestPlan.h
MyTestPlan.cpp
Timing1.cpp
MyTestPlan.sln (MSVC++ "Solution" file)
MyTestPlan.vcproj (MSVC++ "Project" file)

After all files are created (or updated), the compiler invokes the MSVC++ application, specifying the "Solution" it created, and builds the DLL. Any errors and/or warnings would be shown to the user.

If, after building the Test Plan, the user made a change to Timing1.tim, the user would then invoke the compiler, passing it MyTestPlan.tpl. The compiler would recognize (by timestamp information) that the main test plan file is unchanged, so that MyTestPlan.h/.cpp would not be recreated. However, while processing the main test plan file, it would see that the Timing.tim file has changed. Therefore, it would recreate the Timing1.cpp file, and invoke the MSVC++ application to rebuild the DLL. This avoids recompiling MyTestPlan.cpp, and only compiles Timing1.cpp and re-links the DLL. This approach will be especially useful in cutting down re-compile and re-link times for large test plans that take a significant amount of time to compile.

D. Running the Test Program

The Site Controller software loads the Test Program DLL into its process space and calls a "factory" function within the DLL to create an instance of the Test Plan object. Once the Test Plan object has been created, the Site Controller software can then execute the test plan or interact with it in any other way necessary.

Non-Interactive Builds

To most C++ software developers in the Windows environment building an application (or a DLL, or Library, etc) means bringing up a development environment (MS Visual C++, Borland C++, or similar), editing code, and (often) pressing a button to build the product.

The test environment of an embodiment of the invention will have a similar set of activities. Test Plan developers will need to edit code and build their Test Plans. However, tester will not require the Test Plan developer to bring up a C++ development environment in order to produce the resulting Test Plan DLL.

In order to accomplish this the present invention employs the concept of a non-interactive build. A non-interactive build is defined as a build that uses MS Visual C++ in a non-interactive mode. Note that this still allows other tools to be used interactively to manage such a build. The only implication is that Visual C++ is used non-interactively.

Assumed Environment

Certain assumptions are made about the user's environment. The assumptions are:

1. The Test Plan developer will be developing his Test Plan according to above methods and rules.
2. The Test Plan developer may not have a expert level knowledge of C++.
3. The Test Plan developer will have access to command-line tools or GUI tools to convert file(s) to a Test Plan DLL.

Building Applications Without Buttons

Working with MS Visual Studio non-interactively requires one of two approaches. The first (and simplest) is to use the command-line interface. The second (and more flexible) is to use the Automation interface. This section describes both approaches.

Creating the Project

In order to use Visual Studio non-interactively one should start with a working Solution which contains one or more valid Projects. Unfortunately, this is the one task that cannot be accomplished from either a command-line or Automation approach. Neither method provides a mechanism for project creation. However, projects and solutions for Visual Studio can be created from a template. Therefore, given a project name and a template to start from we can create a solution/project for Visual Studio.

Populating the Project

Adding new files to the produced project uses the Visual Studio Automation model since the command-line does not support this. We provides two Visual Studio macros to add new and existing files to a project. Similar code could be used by an external script using an ActiveScript Engine (such as VBScript, JScript, ActivePerl, ActivePython, etc) to perform the same tasks. Therefore, our code generation tools could create new files and, using the Automation Model, add them to the existing Visual Studio project. After the files are created they can be updated as necessary by the tools.

Building the Project

Once we have a solution and project in place there are several options to using Visual Studio non-interactively to build the Test Plan. The simplest option is to invoke it from the command-line. Such a command-line would look like:

devenv solutionFile/build solutionCfg where solutionFile is a Visual Studio solution file and solutionCfg is a specific configuration applicable to the projects within the solution. Another solution is to use the Visual Studio Object Model for Automation. This allows a finer grain of control over the build and configuration process. As mentioned above, it contains a listing of a Perl script to build a project from the command line. This program reads a configuration file which specifies projects and configurations to build (as well as other information about the projects) and builds them all using the Automation Model. Look at the uses of the $msdev object in this script for examples of how to use Automation objects in a script.

Debugger Support

In order for developers of Test classes to verify and debug their work, they need access to a debugger that allows them to break into the Site Controller and step through their code. Since the code generated by the compiler is C++ which is compiled by MSVC++, we use the MSVC++ debugger to debug Test class implementations. Note that this feature is meant only for Test class developers or others who work directly in C++. Other mechanisms will be provided to test engineers who wish to debug or step through the operation of a Test Program without referring directly to the generated C++ code.

System Software Environment

This section describes the general software environment for the Tester: the locations for the files required by user test plans, mechanisms for specifying alternate locations for such files, and the methods for specifying the locations of the test plans and module control software.

Environment Required by Test Plans

System standard locations, as well as the runtime configuration of the search paths for
1. pattern lists,
2. patterns,
3. timing data, and
4. test class DLLs required by a test plan, may be configured by "environment" variables, as specified by environment configuration files. These are text files, with a simple syntax such as:
   Tester_PATOBJ_PATH="patterns\data;D:
      \projects\SC23\patterns\data"

The advantage of having such "environments" defined in text files instead of through native OS-supported environment variables is that the implementation is then not limited by the common restrictions that OS-supported environment variables have, such as maximum string lengths, etc. The following "environment" (setup) variables will be used for the entities listed above:
   Pattern lists: Tester_PATLIST_PATH.
   Pattern object files: Tester_PATOBJ_PATH.
   Pattern source files: Tester_PATSRC_PATH (this is optional; please see).
   Timing data files: Tester_TIMING_PATH.
   Test class DLLs: Tester_TEST_CLASS_LIBPATH.

In order to support special cases, while maintaining useful default behavior, we provide three levels of configuration. These are described in increasing order of precedence:
   First, a system environment setup file, $Tester_INSTALLATION_ROOT\cfg\setups\Setup.env, will specify the default values of "environment" variables. If no other configuration mechanism is available, this file will be required. In general, it will be available for all test plans run on the system. This file is created by the Installation and Configuration Management (ICM) system during installation, with input from the installer to assign the default values for the three variables mentioned above. (Note that besides the system defaults for the above three variables, this file will also contain the system defaults for certain other tester "environment" variables, as described in the following subsection.)

Second, an environment setup file may be specified by the user as a runtime argument to the test plan. The variables in this runtime configuration will take precedence over default definitions.

Finally, a test plan may use a special block to specify the environment variables to be used in its execution. Variables defined in the test plan will take precedence over those in the default system file or the user-defined file.

In general, all necessary variables should be defined through one of the mechanisms described above. If a variable is not defined, a runtime error will occur.

Other Environment Setups

Besides the "environment" variables that are required by user test plans, the following two "environment" variables are required by the test environment:
1. Tester_TEST_PLAN_LIBPATH: This specifies the search path that the System Controller will use for finding a user test plan DLL that should be loaded. Note that the same search path will also be used for finding user pin description and socket files. The default value for this variable, specified during installation time to the ICM, is stored by the ICM in the file $Tester_INSTALLATION_ROOT\cfg\setups\Setup.env.
2. Tester_MODULE_LIBPATH: This specifies the search path that the system will use to load vendor-provided hardware module control software DLLs. This information, extracted from the Configuration Management Database (CMD), is also stored in the file $Tester_INSTALLATION_ROOT\cfg\setups\Setup.env by the ICM.

Note that while a user can override the value given in the Setup.env file for the Tester_TEST_PLAN_LIBPATH variable, the value given in the Setup.env file for the Tester_MODULE_LIBPATH should not be changed by the user unless the user wants to explicitly change the search path for the vendor-provided hardware module control software DLLs.

Search Path Specification Semantics

The following points should be noted about the "environment" variables that specify search paths:
1. Each should be a semicolon(";")—separated list of directory names that the system will search to find a referenced file of a particular type.
2. After initial system lookup of the value of such an "environment" variable, any changes made by the user to its value (for example, by editing an environment configuration file) will only be registered by the system when the user explicitly "informs" the system of the need to do so.
3. Relative pathnames in the search paths will be interpreted as being relative to a particular setting of a related environment variable (that provides the functionality of defining a root), as paths relative to the "current working directory" (CWD) could lead to ambiguous results, since the notion of a CWD in a distributed environment—such as the one in which the tester works—might not be what the user intuitively expects it to be. This related environment variable, which designates the root that all relative pathnames in the search paths will be assumed to be relative to, is the "Tester_INSTALLATION_ROOT" variable, which gives the location of the top-level (i.e., "root") directory of the tester installation on a user's system.
4. The directory entries cannot contain the characters in the set [\:*?"< >|;]; note that except for the semicolon (";"), all the other characters in this set are illegal in Windows file names. The semicolon (";") should not be used in search path entries, since it is used to demarcate entries in the search path. Note that pathnames can have embedded whitespaces, but all whitespaces occurring immediately before and after a pathname (i.e., before the first and after the last non-whitespace character in the pathname) will not be considered to be part of the pathname, and will be ignored.
5. The search path directories will be searched in the order they are encountered in the definition. The first occurrence of a file will be the one chosen.

E. Test Patterns

The efficient management, handling and loading of a very large set of test pattern files is an important architectural aspect of the framework of an embodiment of the invention. The idea of hierarchical pattern lists is regarded as being an effective tool in providing tractable conceptualization and ease of use of the system to the end user.

The stimulus to a DUT is made available to the test system through test vectors. Vectors can generally be categorized as sequential (or linear), scan or Algorithmic Pattern Generator (APG)-derived. In the system of an embodiment of the invention, test vectors are organized in terms of patterns that are applied to the DUT at test time. A pattern is represented by a Pattern object in the user's test program.

In the system, patterns are organized in pattern lists, represented programmatically by pattern list objects. A Pattern List object represents an ordered list of patterns or other pattern lists. The ordering is implicit in the order of declaration of the list components. Note that if only a single pattern is needed, it is required to be encapsulated in a list by itself.

A pattern list object in the user's test program is associated with a pattern listfile on disk, which contains the actual definition of the pattern list. The contents of a pattern list are thus dynamically determined by the contents of the associated disk file (more will be said about this later).

The definition of a pattern list provides an explicit name for the pattern list, and identifies an ordered list of patterns and/or other pattern lists through file name associations. It also provides for the specification of execution options, which will be described in detail after the pattern objects have been described, since the options can be applied to both pattern lists and patterns. The pattern list should follow the following rules:

```
file-contents :
    version-info global-pattern-list-definitions
version-info :
    Version version-identifier ;
global-pattern-list-definitions :
    global-pattern-list-definition
    global-pattern-list-definitions global-pattern-list-definition
global-pattern-list-definition :
    global-pattern-list-declaration { list-block }
global-pattern-list-declaration :
    GlobalPList pattern-list-name options_opt
list-block :
    list-entry
    list-block list-entry
list-entry :
    pattern-entry ;
    pattern-list-entry ;
    global-pattern-list-definition ;
    local-pattern-list-definition ;
pattern-entry :
    Pat pattern-name options_opt
pattern-list-entry :
    PList pattern-list-reference options_opt
pattern-list-reference :
    pattern-list-qualified-name
    file-name ':' pattern-list-qualified-name
pattern-list-qualified-name :
    pattern-list-name
    pattern-list-qualified-name '.' pattern-list-name
local-pattern-list-definition :
    local-pattern-list-declaration { list-block }
local-pattern-list-declaration :
    LocalPList pattern-list-name options_opt
options :
    option
    options option
option :
    [ option-definition ]
option-definition :
    option-name option-parameters_opt
option-parameters :
    option-parameter
    option-parameters ',' option-parameter
```

The following are the descriptions of undefined non-terminals used above:
1. version-identifier: A sequence of one or more characters from the set [0-9.], where the first character must be a digit.
2. name: A sequence of one or more characters from the set [a-zA-Z_0-9], where the first character must be from the set [a-zA-Z_].

3. pattern-list-name : A sequence of one or more characters from the set [a-zA-Z_0-9], where the first character must be from the set [a-zA-Z_].
4. file-name :A valid Windows file name (must be enclosed in double quotes if any white-spaces are contained in the file name). Note that this should be a simple file name, i.e., it should not have a directory component. A pattern-list-reference can be either internal referring to a pattern list in the same file, or external referring to one in another file. External references need to be qualified by a file-name.
5. option-name: A sequence of one or more characters from the set [a-zA-Z_0-9], where the first character must be from the set [a-zA-Z_].
6. option-parameter: A sequence of one or more characters from the set [a-zA-Z_0-9].

Pattern list files support comments, which are meant to be ignored by a pattern list file parser. Comments start with the '#' character, and extend to the end of the line.

E1. Rules for Pattern List

The static or compile-time rules for pattern lists govern the declaration and resolution of names. Names in the pattern list language are declared by global-pattern-list-definitions and local-pattern-list-definitions. They are referenced by pattern-list-references. Below are some rules governing these declarations and references.

1. A global-pattern-list-definition or a local-pattern-list-definition declares the name of a pattern list. A pattern-list-reference references the name of a declared pattern list. The names of global pattern lists are globally known. The names of local pattern lists are known only in the list-block in which they are declared. They can be referred to without qualification directly in that list block. In a more deeply nested declaration, a local pattern list will need to be referred to by a qualified name.
2. Local pattern list names are known within the scope of an enclosing pattern list, and global pattern list names known within the scope of the system. For example:

```
GlobalPList G1
{
    LocalPList L1
    {
        LocalPList L2
        {
            ...
        }
        GlobalPList G2
        {
            ...
        }
        PList L2;         # OK. Name L2 is known in this scope
        PList G2          # OK. Name G2 is global
    }
    PList L2;             # Error. Name L2 is not known here.
    PList L1.L2;          # OK. Name L1 is known here. L2 is known by
                          #     qualification.
    PList G1.L1.L2;       # OK. Qualification by G1 is not needed but
                          # is allowed.
    PList G2;             # OK. Name G2 is global
}
```

3. Global pattern lists may be defined at an outermost level in a pattern list file, or may be defined as nested within an enclosing pattern list. The nesting is merely a convenience, however. They are conceptually defined as global pattern lists at the outermost level in the file.

A nested global pattern list is semantically equivalent to an outermost (non-nested) global pattern list of the same name. So for example:

```
GlobalPList G1
{
    GlobalPList G2 ...
}
is semantically equivalent to:
GlobalPList G1
{
    PList G2; # References G2
}
GlobalPList G2 ...
```

4. All global pattern lists are uniquely named.

```
GlobalPList G1
{
    # Note that this is as if declared at the outermost level
    # with a reference to it right here.
    GlobalPList G2
    {
        ...
    }
}
# This declaration will be an error in this or any other file,
# as the name G2 is already taken.
GlobalPList G2 # Error. Global name G2 is taken.
{
    ...
}
```

5. Local pattern lists are always have their definitions nested within an enclosing pattern list which also determines the scope of the name of the local pattern list. Local pattern lists are uniquely named within their enclosing pattern list. Local pattern lists are syntactically disallowed from occurring at the outermost level in a pattern list file.

```
GlobalPList G1
{
    LocalPList L1
    {
    }
    LocalPList L2
    {
        LocalPList L1 # OK. No local name L1 is declared
        directly
            # in the enclosing scope defined by L2.
        {
        }
        PList L1 ; # OK. Refers to L1 declared in L2
        PList G1.L1; # OK. Refers to L1 declared in G1.
    }
    # Error. Redeclaring name L1 when the enclosing
    scope
    # defined by G1 already has an L1 declared in it.
    LocalPList L1;
    {
    }
}
```

6. Each pattern list file contains the definition for one or more global pattern lists. This follows directly from the syntax. The outermost level is a global-pattern-list-definition, and there must be at least one of them.

7. The pattern-name is a reference to a pattern, following the Pat keyword. It references a pattern that is in a pattern file whose name is obtained by concatenating a suffix .pat to the pattern name. The file denotes a file that will be obtained along a search path defined for patterns.

8. A pattern-list-reference is a reference to a pattern list following the PList keyword. The reference consists of an optional filename followed by a qualified pattern list name which is just a list of names separated by dots. So, for instance, the following could be a pattern-list-reference:

PList foo.plist:G1.L1.L2.L3;

referring to a local pattern list L3 nested in L2 nested in L1 nested in a global pattern list G1 that is in a file foo.plist. The leftmost name segment in the above name is G1.

The leftmost name segment must resolve to either a global pattern list, or else to a local pattern list that is visible from the point of reference.

Name resolution of a pattern-list-reference proceeds as follows:

1. Each name segment resolves to a name declared in the context of the prefix before it.
2. If there is a file qualification, the leftmost name segment resolves to a global pattern list declared in the named file.
3. If there is no file qualification, the leftmost name could resolve to a local pattern list within the enclosing scope and if that fails then the next enclosing scope, and so on, up to an enclosing global scope.
4. Limiting the searching of scopes to the closest enclosing global scope is needed in order to preserve the semantics of global scopes as if they were declared at the outermost level in the pattern list file. If the nested global scope was (equivalently) textually declared at the outermost level, the name resolution search would terminate after examining its scope.
5. If the reference has not been resolved by the prior steps, then the leftmost name segment can be resolved to a global pattern list within this same file.
6. If the reference has not been resolved by the prior steps, then the leftmost name segment can be resolved to a global pattern list named in the file by adding the plist suffix to the leftmost name segment.
7. If the reference has not been resolved by the prior steps, then the reference is in error.

As mentioned earlier, the above rules dictate that the leftmost name segment resolves to either a local pattern list that is visible from the point of reference, or else to a global pattern list.

The following example illustrates some of these ideas.

```
GlobalPlist G1
{
    PList G3; # OK. Refers to a pattern list later in this
    file.
    PList G4; # OK. Refers to a pattern list in file
    "G4.plist"
    # OK. Refers to G1 in the file "my_plists.plist".
    PList my_plists.plist:G1;
    # OK. Refers to a pattern list in file "my_plists.plist".
    The
    # qualified name refers to a local pattern list named L2
    declared
```

```
# in the scope of a local pattern list named L1 declared
in the
# scope of a global pattern list named G1.
PList my_plists.plist:G1.L1.L2;
LocalPList L1
{
    LocalPList L2
    {
    }
}
PList L1; # OK. Refers to L1 declared in the
          # enclosing scope of G1
}
GlobalPlist G2
{
    LocalPList L2
    {
    }
    GlobalPList G3
    {
    LocalPList L3
{
}
}
PList L1; # Error. No L1 declared in this or any enclosing
        # scope;
# Error. The name L2 is not declared in this scope. Also
# though L2 is declared in the enclosing scope, this scope
# is global, and so no further enclosing scope is examined.

# Contrast with reference to name L2 in LocalPList L3 below.
    PList L2;
    PList G1.L1; # OK. Refers to L1 in G1.
    # Error. G3 is not really nested inside G1. Since G3
    # is global, it is really declared at an outermost level,
    # and so G1.G3 is meaningless.
    PList G2.G3.L3;
}
LocalPList L3
{
    # OK. Refers to G2.L2. The enclosing global scope is G2
    # and the name L2 is declared in G2.
    PList L2;
}
}
```

All pattern list file names and pattern file names are required to be unique across the test plan using them.

A pattern list reference can refer to a pattern list defined either before or after the reference in the same file.

Recursive and mutually recursive pattern list definitions are not permitted. While there is nothing in the pattern list file syntax to prevent the user from creating such definitions, the parser will flag an error when it detects such conditions. Note that there is some cost associated with the detection of such conditions. The user will be able to switch off the check if s/he can assume the responsibility of guaranteeing that the input space is free from mutually recursive definitions.

```
GlobalPList G1
{
    LocalPList L2
    {
        LocalPList L3
        {
            # Error. L2 runs L3 which runs L2.
            # This is a recursive reference to L2
            PList L2;
            PList G2;
        }
    }
}
```

-continued

```
GlobalPList G2
{
    # Error. G1.L2 runs L3 which runs G2 which runs G1.L2.
    # This is a mutually recursive reference to G1.L2.
    PList G1.L2;
}
```

The syntactic description of patterns and pattern lists allows for options to be specified on them. In general options are vendor specific. The syntax allows for any pattern or pattern list to have a number of options specified, each with a number of parameters. In we describe some supported options that will be recognized by most vendors.

The dynamic (i.e., execution) semantics of pattern trees is described in after defining a pattern execution sequence.

E2. Patterns

Figure 6:
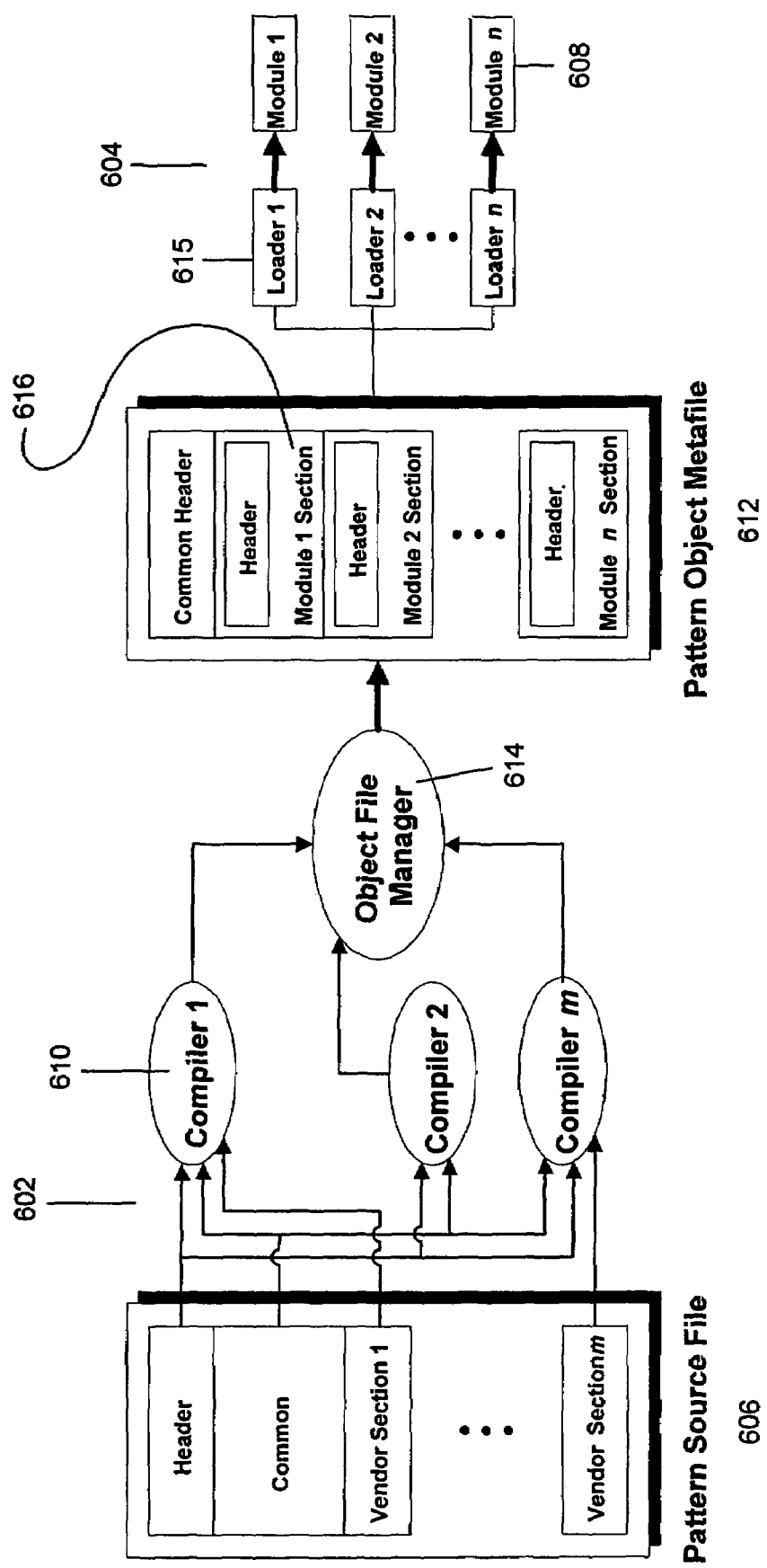
FIG. 6 illustrates a pattern compiler according to an embodiment of the present invention.

FIG. 6 illustrates a pattern compiler 602 and a pattern loader 604 according to an embodiment of the present invention. The user-defined contents of a pattern are available in a pattern source file 606, which is a plain text file. A pattern compiler will be responsible for compiling a source file into a module-specific format suitable for loading on the tester hardware; this latter file will be referred to as the pattern object file. The following are the general attributes:

1. A Pattern object is not creatable by the user; rather, the user always deals with pattern lists, which are collections of other pattern lists and/or patterns. A pattern list object creates, owns and maintains the pattern objects contained within it, while making them accessible to the user if necessary.
2. A pattern is uniquely named within a test plan, i.e., no two patterns within the test plan can have the same name. The name of a pattern is distinct from the name of the file containing it. The pattern file name is the one used in the pattern list file to refer to a pattern, while the actual name of the pattern is defined in the pattern file.

In an embodiment of the invention, in general, a single DUT (device-under-test) might be connected to tester modules from different vendors. This has implications for the entire pattern compile-load-execute chain. The main ones are described in this section.

E3. Pattern Compilation

A pattern compiler 602 thus needs to target a specific site configuration (in terms of the vendor-specific digital modules used). For the rest of this discussion, the term "module" will be used to refer to a digital module, as an example. In order to allow the integration of modules 608 from different vendors into the system, the following procedures are preferred:

1. Each module vendor will be responsible for providing its own module-specific pattern compiler 610, in the form of a dynamically loadable library or separate executable. This compiler library/executable will provide, at the very least, a compile( ) method.
2. The pattern source file will accommodate two different types of sections for each type of pattern block it contains:
    a. a "common" section that will contain information accessible to (but not necessarily used by) all compilers, and
    b. one or more optional vendor-specific sections, each identified by unique vendor codes, for information usable by specific vendors' compilers.
3. A vendor's compiler will not directly create a pattern object file. Instead, the tester will provide for a pattern object "metafile" 612, managed by an Object File Manager (OFM) 614, which is part of the pattern compiler. The pattern compiler may be located on the computer acting as the system controller, or offline, e.g., on a network to which the system controller is connected. The "pattern objectfile" referred to so far in abstract terms is actually this object metafile. The object metafile will be named the same as the pattern source file, with the source file extension replaced by the object file extension. The OFM will provide an application programming interface (APIs) to read and write this file. The object metafile will have provisions for storing
    a. common header information,
    b. module-specific header information, including information identifying the corresponding module and the location of pattern data for the module,
    c. module-specific pattern data, organized as required by the module vendor, and capable of being interpreted by the module vendor.

The OFM APIs will allow a module vendor's compiler to write module-specific header information and data into the object metafile. Note that this layout of the object metafile allows the pattern data to be organized on a per-module basis, even in the case where two or more modules in the targeted site are identical.

Note that additional vendor-supplied configuration information might be needed by pattern compilers to facilitate the generation of module-specific hardware loading information that can take advantage of efficient data communications such as direct memory access (DMA).

E4. Object File Manager (OFM) Framework

An open architecture test system provides a solution that is scaleable and flexible. In an open architecture test system of an embodiment of the present invention, a single device under test (DUT) may be connected to tester modules from different vendors. A test module in this context refers to a functional unit in the open architecture test system, and may include both hardware and software components. The distributed, re-configurable, modular open architecture test system of this embodiment is also referred to herein as the test system or the system.

A user of the test system writes a pattern for testing the DUT, possibly without the knowledge that this pattern may be compiled with multiple tester modules developed by different hardware vendors. This assumes that each of these modules is capable of providing the features specified in the pattern, and that vendor-specific pattern formats may be included within the pattern file.

The stimulus to a DUT is made available to the test system through test vectors. Test vectors within the test system framework are organized in terms of patterns that are applied to the DUT during testing. A pattern is represented by a pattern object in the user's test program. The following paragraph introduces some of the key terms of the OFM framework of the test system.

A pattern block object represents a collection of pattern data (cyclized or non-cyclized) of a given type and which share a common syntax for the description of the pattern data within the pattern block. In one embodiment, the types of pattern blocks supported are cyclized pattern blocks (e.g. MainPattern, SubrPattern, algorithmic pattern generator pattern (ALPG Pattern)), and non-cyclized pattern types identified by the type in the pattern source (e.g. pattern [type]).

The SubrPattern and ALPGPattern blocks are exemplary blocks of auxiliary pattern object metafiles. A pattern block may accommodate two different types of sections: 1) a common section that contains information accessible to (but not necessarily used by) all compilers, and 2) one or more optional vendor-specific sections, each vendor-specific section is identified by unique vendor codes, for storing information usable by vendors compilers. A pattern object represents a collection of pattern blocks with the restriction that no two blocks within the pattern object are of the same type. A cyclized pattern block represents a collection of test vectors used in a sequential cyclized digital tester, which provides a standard syntax to be followed by vendors. A pattern source file may accommodate one or more pattern blocks.

Figure 13:
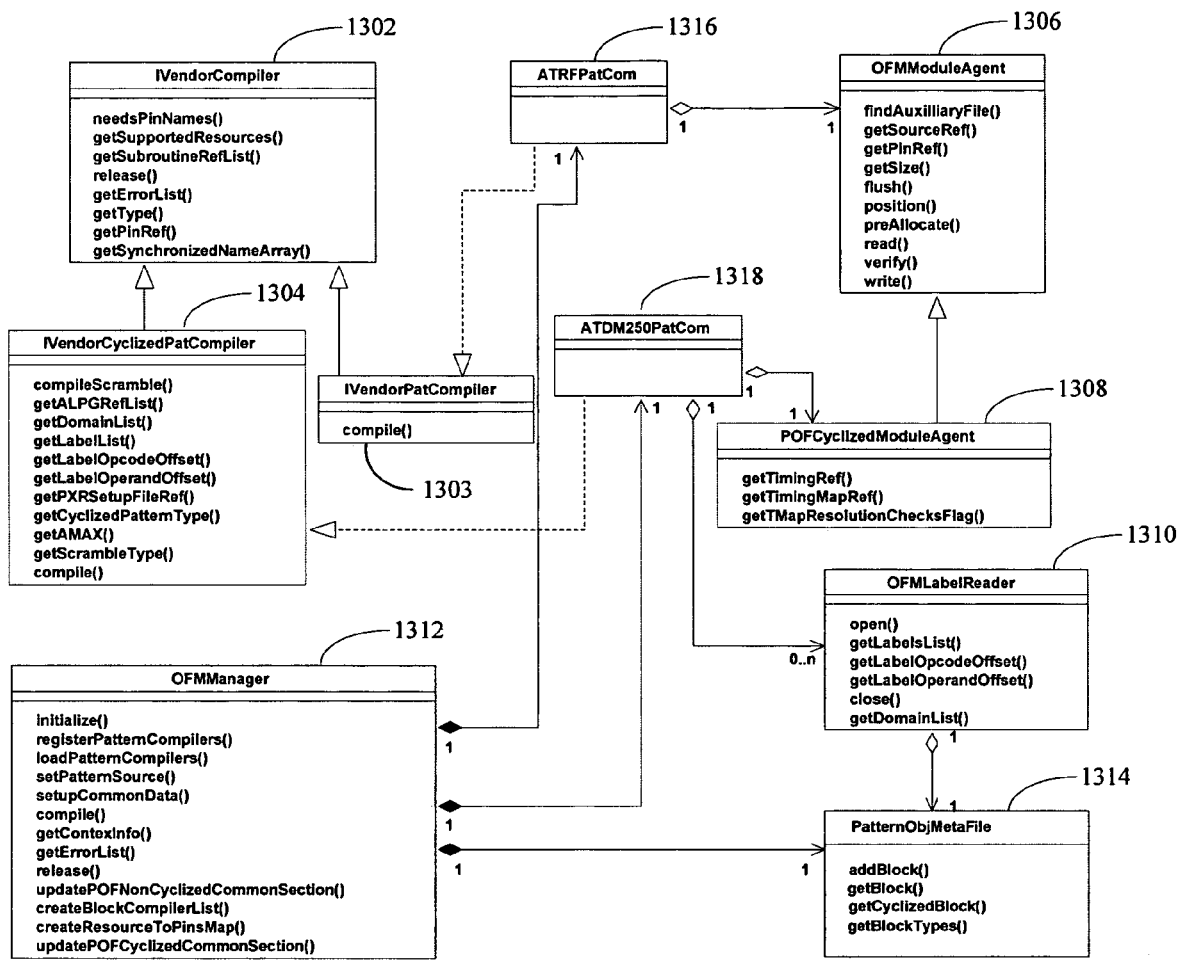
FIG. 13 illustrates an OFM framework for managing pattern object files in a modular test system according to an embodiment of the present invention.

FIG. 13 illustrates an OFM framework for managing pattern object files in a modular test system according to an embodiment of the present invention. The OFM framework includes a vendor compiler interface (IVendorCompiler) 1302, a vendor pattern compiler interface (IVendorPatCompiler) 1303, and a vendor cyclized pattern compiler interface (IVendorCyclizedPatCompiler) 1304. Module vendors are responsible for providing their own pattern compilers, which implement either the IVendorPatCompiler interface 1303 or the IVendorCyclizedPatCompiler interface 1304 or both. The OFM framework further includes an OFM module agent (OFMModuleAgent) class 1306, an OFM cyclized pattern module agent (POFCyclizedModuleAgent) class 1308, an OFM label reader (OFMLabelReader) class 1310, an object file manager (OFMManager) class 1312, and a pattern object metafile (PatternObjMetaFile) class 1314. A first vendor pattern compiler (ATRFPatCom) class 1316 for handling non-cyclized pattern blocks and a second vendor pattern compiler (ATDM250PatCom) class 1318 for handling cyclized pattern blocks are examples of vendor provided classes that implement the IVendorPatCompiler 1303 and IVendorCyclizedPatCompiler 1304 interfaces respectively. A description of the interfaces and classes are provided below.

IVendorPatCompiler Interface

The IVendorPatCompiler interface 1303 supports two groups of functions. The first group of functions supports the compilation of a non-cyclized pattern block within a pattern source file and the updating of the pattern object metafile with module data. The second group of functions supports the updating of the common block section of the pattern object metafile.

The OFM invokes a group of pattern compilation methods if the vendor compilers match the module type IDs set in the module configuration file and support the block type. The pattern compilation methods are invoked to cause the vendor compilers to store the compiled pattern object data in a metafile for the corresponding module pattern loader. The first group of pattern compilation methods is described below.

compile( ): The compile( ) method is invoked by the OFM to compile a pattern source file. The OFM passes to the vendor compiler a POFCyclizedModuleAgent object. This object provides protection/access control such that the vendor compiler is granted read access to both the common section and the module-specific section of the pattern source file, and write access to vendor module-specific section. An OFMResourcePinMapper instance is also passed to the vendor compiler as an argument to provide information about the mapping between the pins and the resources.

needsPinNames( ): The needsPinNames( ) method is invoked by the OFM to query whether the module compiler requires a list of pin names to be provided when the compile( ) method is invoked.

getSupportedResources( ): The getSupportedResources( ) method is invoked by the OFM to query the module compiler for the names of the resources that it supports. This is used to create a list of pins when the vendor compiler needs a pin-list for the pattern compilation process on a per resource level.

release( ): The release( ) method is invoked by the OFM to allow the vendor pattern compiler to perform a clean-up operation before the derived IVendorPatCompiler object is deleted.

getErrorList( ): The getErrorList( ) method is invoked by the OFM to retrieve an array of OFCStatus objects. This array contains both errors as well as warnings that the pattern compiler may have encountered during compilation of the pattern source. An OFCStatus is an entity that contains information about the error. It can be in a simple form of an integral value, representing a particular error code. It is useful to have the OFCStatus be an object with information that includes an error code, where the error occurred, and some specific data related to the particular instance of the error.

The OFM uses the "getter" methods of the IVendorPatCompiler interface 1303 to query the vendor compiler for various settings of the common section. It is the responsibility of the vendor compiler to provide the details regarding the settings of the common section from the pattern source file being compiled. The common section methods used to compile pattern source files are described below.

getPinRef( ): The Object File Manager invokes the getPinRef( ) method if it requires the vendor pattern compiler to parse the pattern source file and to provide the OFM with the name of a pin reference setup file.

getSubReferences( ): The Object File Manager invokes the getSubReferences( ) method if it requires the vendor pattern compiler to parse the pattern source file and provide the OFM with an array of Subroutines that are referenced by this pattern source file.

getSynchronizedNameArray( ): The OFM invokes the getSynchronizedNameArray( ) method if it requires the vendor pattern compiler to parse the pattern source file and provide OFM with an array of synchronized blocks that exist in this pattern source file. The OFM framework uses these names (which are declared in the pin description file) to orchestrate the executions of these blocks.

IVendorCyclizedPatCompiler Interface

The IVendorCyclizedPatCompiler interface 1304 inherits from the IVendorCompiler interface 1302. It also requires module vendors to support two groups of functions. The first group of functions supports the compilation of a cyclized pattern block within a pattern source file and updates the pattern object metafile. The second group of functions supports the updating of the common block section of the pattern object metafile.

The OFM invokes the pattern compilation methods if the vendor compilers match the module type IDs set in the module configuration file and support the block type. The methods are invoked to cause the vendor compilers to store the compiled pattern object data in a metafile for the corresponding module pattern loader. The first group of pattern compilation methods is described as follows.

The compile( ) method is invoked by the OFM to compile a pattern source block. The OFM passes to the vendor compiler a POFCyclizedModuleAgent object. This object provides protection/access control such that the vendor compiler is granted read access to both the common section and the module section, and write access to the module section. An OFMResourcePinMapper instance is also passed to the vendor compiler as an argument to provide information about the mapping between the pins and the resources.

The OFM uses the "getter" methods of the IVendorCyclizedPatCompiler interface 1304 to query the vendor compiler for various (cyclized tester specific) settings of the common section. It is the responsibility of the vendor compiler to provide the details from the pattern source file being compiled. The common section methods used to compile pattern source files are described below.

getALPGReferences( ): The OFM invokes the getALPGReferences( ) method if it requires the vendor pattern compiler to parse the pattern source file and provide the OFM with a list of ALPG patterns referenced within the pattern source file.

getDomainList( ): The OFM invokes the getDomainList( ) method if it requires the vendor pattern compiler to parse the pattern source file and provide the OFM with a list of Domains used by the pattern. Note that this list of domains can be a subset of the list of domains specified in the pin description file, as a pattern may not be used for all domains of a device.

getLabelList( ): The OFM invokes the getLabelList( ) method if it requires the vendor pattern compiler to parse the pattern source file and provide the OFM with a list of Labels used in the pattern source for a given Domain. Note that a label has a scope within a domain and the same label can be used in multiple domains.

getLabelOpcodeOffset( ): The OFM invokes the getLabelOpcodeOffset( ) method if it requires the vendor pattern compiler to parse the pattern source file and provide the OFM with the Opcode offset for a label within a given Domain.

getLabelOperandOffset( ): The OFM invokes the getLabelOperandOffset( ) method if it requires the vendor pattern compiler to parse the pattern source file and provide the OFM with the Operand offset for a label within a given Domain.

getPxRSetupFileRef( ): The OFM invokes the getPXRSetupFileRef( ) method if it requires the vendor pattern compiler to parse the pattern source file and provide the OFM with the name of the Pattern Cross Reference Setup file imported.

getCyclizedPatternType( ): The OFM invokes the getCyclizedPatternType( ) method if it requires the vendor pattern compiler to parse the pattern source file and provide the OFM with the type of the cyclized pattern block specified (SQPG, ALPG, SUBR, SCAN, ESCAN).

getAMAX( ): The OFM invokes the getAMAX( ) method if it requires the vendor pattern compiler to parse the source file and provide the OFM with the maximum address size data belonging to the common section.

OFMModuleAgent

The OFMModuleAgent 1306 is a base class which may be extended by the POFCyclizedModuleAgent class. This class provides the implementation of the group of methods required to access the binary opaque data of each module. The OFMModuleAgent class 1306 includes the following methods.

flush( ): The vendor compiler invokes the flush( ) method if the buffered binary data is required to be flushed.

position( ): The vendor compiler invokes the position( ) method to determine the current position of the binary data within a pattern block.

preAllocate( ): The vendor compiler invokes the preAllocate( ) method if it requires the OFM to pre-allocate a block in the pattern-object-metafile of a given size for improving efficiency. The default size allocated for the binary blocks is 0x4000.

getSize( ): The vendor compiler invokes the getSize( ) method if it requires the OFM to query the metafile to determine the size of the binary data for the module.

read( ): The vendor compiler invokes the read( ) method if it requires the OFM to read data of a given size and at a given offset from the metafile for the module. The offset and size are relative to the block for the module and not the entire metafile.

verify( ): The vendor compiler invokes the verify( ) method if it requires the OFM to verify that valid data of a given size and at a given offset of this metafile for the module exists. The offset and size are relative to the block for the module and not the entire metafile.

write( ): The vendor compiler invokes the write( ) method if it requires the OFM to write data of a given size and at a given offset to the metafile for this module. The offset and size are relative to the block for this module and not the entire metafile.

getSocketRef( ): The vendor compiler invokes the getSocketRef( ) method if it requires the OFM to create an object of type Socketinfo. This class provides the compiler with access to the settings of the system socket file without the need to parse the file.

getSourceRef( ): The vendor compiler invokes the getSourceRef( ) method if it requires the OFM to provide the name of the pattern source file.

getSourceVersion( ): The Vendor compiler invokes the getSourceVersion( ) method if it requires the OFM to supply the version string representing the Pattern source file language version.

POFCyclizedModuleAgent

The POFCyclizedModuleAgent class 1308 is a shallow handle to the PatternObjMetaFile class 1314 that is opened by the OFM when it starts compiling a pattern. It extends the OFMModuleAgent with additional methods specific to cyclized tester modules. It provides the vendor pattern compilers with a limited access to the pattern object metafile by allowing them to read from both the common section as well as the module section. It also provides write access to the module section of the vendor compiler. This interface is used by vendor pattern compilers during the compilation of the pattern when the OFM invokes the compile( ) method. The POFCyclizedModuleAgent class 1308 includes the following methods.

getALPGRefList( ): The vendor compiler invokes the getALPGRefList( ) method if it requires the OFM to provide an array of ALPG patterns referenced within this pattern source.

getDomainList( ): The vendor compiler invokes the getDomainList( ) method if it requires the OFM to provide an array of domains used by the pattern. Note that the array of domains may be a subset of the array of domains specified in the pin description file as a pattern may not be used for all domains of a device.

getLabelList( ): The vendor compiler invokes the getLabelList( ) method if it requires the OFM to provide an array of Labels used in the pattern source for a given Domain.

Note that a label has a scope within a domain and the same label may be used in multiple domains.

getLabelOpcodeOffset( ): The vendor compiler invokes the getLabelOpcodeOffset( ) method if it requires OFM to provide the Opcode offset for a label within a given domain.

getLabelOperandOffset( ): The vendor compiler invokes the getLabelOperandOffset( ) method if it requires OFM to provide the Operand offset for a label within a given domain.

getPXRSetupFileRef( ): The vendor compiler invokes the getPXRSetupFileRef( ) method if it requires OFM to provide the name of the Pattern Cross Reference Setup file imported.

getTimingRef( ): The vendor compiler invokes the getTimingRef( ) method if it requires OFM to provide an object that implements the ITimFile interface. This class provides the compiler with access to the settings of the system test program language timing file without the need to parse this file.

getTimingMapRef( ): The vendor compiler invokes the getTimingMapRef( ) method if it requires OFM to provide an object that implements the ITMapFile interface. This class provides the compiler with access to the settings of the test system timing map file without the need to parse this file.

getCyclizedPatternType( ): The vendor compiler invokes the getCyclizedPatternType( ) method if it requires OFM to provide the type of the pattern specified (SQPG, ALPG, SUBR, SCAN, ESCAN).

getTMapResolutionChecksFlag( ): The vendor compiler invokes the getTMapResolutionChecksFlag( ) method to query whether the test system variable TMAP_RESOLUTION_CHECKS is set within the system environment configuration file.

OFMLabelReader

Vendor pattern compilers need to access the labels and offsets of subroutine pattern object metafiles and ALPG pattern object metafiles when compiling cyclized pattern blocks. This access is provided by the OFMLabelReader class 1310. This class functions in a similar manner as the POFCyclizedModuleAgent class and provides read-only access to the subroutine and ALPG label/offset data of the metafiles on a per domain basis. The vendor compilers may instantiate this object for each subroutine/ALPG pattern referenced and delete the object when the task is completed. In this embodiment, this is specific to cyclized digital module pattern compilers. The OFMLabelReader class 1310 includes the following methods.

OFMLabelReader( ): The Vendor compiler invokes the OFMLabelReader( ) method to construct an OFMLabelReader object for a specified subroutine or ALPG pattern object metafile.

open( ): The Vendor compiler invokes the open( ) method to cause the OFMLabelReader object to open the file.

close( ): The Vendor compiler invokes the close( ) method to cause the OFMLabelReader object to close the file.

getLabelsList( ): The Vendor compiler invokes the getLabelsList( ) method if it requires the OFM to get the array of labels for a given domain of the OFMLabelReader instance.

getLabelOpcodeOffset( ): The Vendor compiler invokes the getLabelOpcodeOffset( ) method if it requires the OFM to read the Opcode offset for a label within a given domain of the OFMLabelReader instance.

getLabelOperandOffset( ): The Vendor compiler invokes the getLabelOperandOffset( ) method if it requires the OFM to read the Operand offset for a label within a given domain of the OFMLabelReader instance.

getSourceVersion( ): The Vendor compiler invokes the getSourceVersion( ) method if it requires the OFM to read the Version of the source file used to generate the subroutine pattern object file represented by this OFMLabelReader instance.

In one embodiment, the pattern block is the highest-level object that encapsulates a type of Pattern Block. One or more of pattern blocks may exist within a pattern source file. Each pattern block contains a single CommonSection and zero or more VendorSections (also referred to as module sections). The OFM framework supports the following types of pattern blocks: MainPattern, SubrPattern, ALPGPattern and Pattern. The MainPattern, SubrPattern and ALPGPattern are specific blocks for handling cyclized patterns. The generic Pattern type is expandable to allow the OFM framework to enable other tester pattern languages in a transparent manner.

The following is an example of a pattern source file. It includes a MainPattern for a cyclized digital module as well as a hypothetical generic pattern (type FOO). Note that the reason for putting the cyclized and FOO type pattern in the same source file is that the cyclized MainPattern block and the FOO pattern block are sufficiently closely related so that they can be used together as a single entity. In this example, it is assumed that the syntax within the CommonSection of Pattern FOO is one that has been standardized for all patterns of type FOO within the test system. In case no standard exists, the CommonSection may be empty.

```

# Filename : main1.pat (produces object file main1.pobj)

Version 1.0 ;
#-----------------------------------------------------------
# Main Pattern definition:
#-----------------------------------------------------------
MainPattern
{
    CommonSection
    {
        $define     ALL_H       (H*)
        $define     ALL_L       (L*)
        $define     ALL_0       (0*)
        $define     ALL_1       (1*)
        #-----------------------------------------------------
        # Timing Specifications
        #-----------------------------------------------------
        Timing      "productionTiming.tim:ProductionTiming";
        #-----------------------------------------------------
        # Pin Description file Specifications
        #-----------------------------------------------------
        PinDescription "Pin.pin";
        #-----------------------------------------------------
        # Setup file Specifications
        #-----------------------------------------------------
        Pxr         "setup.pxr";
        #-----------------------------------------------------
        # Default Domain Cycles
        #-----------------------------------------------------
        Domain default
        {
            #---------------------------------------------
            # label : instruction {Vector/Waveform Data}
            #---------------------------------------------
            NOP         { V { DIR=1; APins=${ALL_1};
                          BPins=${ALL_H}; OE_=0;
                        } W {AllPins=wfs1; } }
```

```
            NOP         { V { APins=${ALL__0};
                              BPins=${ALL__L; } }
            NOP         { V { APins=10000000;
                              BPins=HLLLLLLL; } }
            NOP         { V { APins=${ALL__1};
                              BPins=${ALL__H}; } }
            EXIT        { V { APins=${ALL__0};
                              BPins=${ALL__L}; } }
        }
    }
}
#----------------------------------------------------------------
# FOO Pattern definition:
#----------------------------------------------------------------
Pattern FOO
{
    CommonSection
    {
        NumberOfData = 192;
        DataFormat
        {
            float, int;
        }
        Data
        {
            0.0E+00, 1;
            5.21E+00, 0;
            . . .;
        }
    }
    VendorSection 1
    {
        Compression = ENABLED;
    }
```

Multiple instances of the same type are not allowed. This means that only one of MainPattern, SubrPattern or ALPG-Pattern blocks is treated as the same cyclized pattern type. The following example produces an error as it includes two pattern blocks of the same type (cyclized):

```
#----------------------------------------------------
# File twoCyclizedTypes.pat
#----------------------------------------------------
Version 1.0;

# This is the main cyclized pattern block

MainPattern
{
    CommonSection
    {
        . . .
    }
}

# This is the subroutine cyclized pattern block

SubrPattern
{
    CommonSection
    {
        . . .
    }
}
```

In the case of Pattern, a single instance of the declared type is allowed. For other different declared types, multiple instances of Pattern may be allowed. The example below includes the two instances of Pattern FOO1 and FOO2 and a Pattern Block instance of type MainPattern.

```
#----------------------------------------------------
# File threeTypes.pat
#----------------------------------------------------
Version 1.0;

# This is the main cyclized pattern block

MainPattern
{
    CommonSection
    {
        . . .
    }
}

# This is a pattern block of generic type FOO1

Pattern FOO1
{
    CommonSection
    {
        . . .
    }
}

# This is a pattern block of generic type FOO2

Pattern FOO2
{
    CommonSection
    {
        . . .
    }
}
```

The CommonSection block includes the description of a pattern type that is standardized for the test system. The contents of this section follow this standard syntax and are interpreted by the various compilers in a similar manner. An example of one such standard is the syntax defined for the MainPattern for Cyclized digital modules. In case no standard exists for this type within the test system, an empty CommonSection is defined.

The OFM framework allows each module compiler to determine the contents of the corresponding module section within each Pattern block. Other vendor compilers do not have permission to access the contents established in a vendor-specific Pattern block.

Pattern Object Metafille

Summary information and other common configuration information are stored in the main common header of the pattern object metafile. The summary consists of information necessary for accessing the various pattern blocks within the pattern object. The following information is stored in the main common header:

1. The pattern source file name.
2. The version information from the source file.
3. References to the Socket file, Utility Configuration File and Module Configuration File to be used during pattern compilation.
4. The collection of types of pattern blocks contained in the pattern object metafile.

Each pattern block has a header section, which includes information required for handling pre-load resolution of addresses, etc., or handling datalogging. Since the semantics of the common section of each pattern block are substantially the same for a particular block type, each compiler is capable of providing the same summary information. Thus, the first compiler writing the metafile stores this information. The following information is stored in the common section header of a non-cyclized block:
1. The type of the pattern as declared in the source file.
2. A map of subroutine references in the pattern source file's common section.
3. A reference to a Pin setup file if one is required for this type of pattern block.
4. A map of the synchronized blocks defined in this pattern. This corresponds to names defined with the keyword Synchronized in the system pin description file.

The following information is stored in the common section header of a cyclized block:
1. The type of the pattern as declared in the source file.
2. A map of subroutine references in the pattern source file's common section.
3. A map of the domain blocks defined in this pattern. This corresponds to names defined with the keyword Domain in the system pin description file. These names are treated by the OFM framework in the same manner as the Synchronized blocks for non-cyclized patterns.
4. A list of the waveform and timing names used in the common section of the pattern source file.
5. A map of the label references to vector opcode and operand addresses in the common section of the pattern source file.
6. References to Pin, Timing, Timing Map and other setups specified in the pattern source file.

Figure 14:
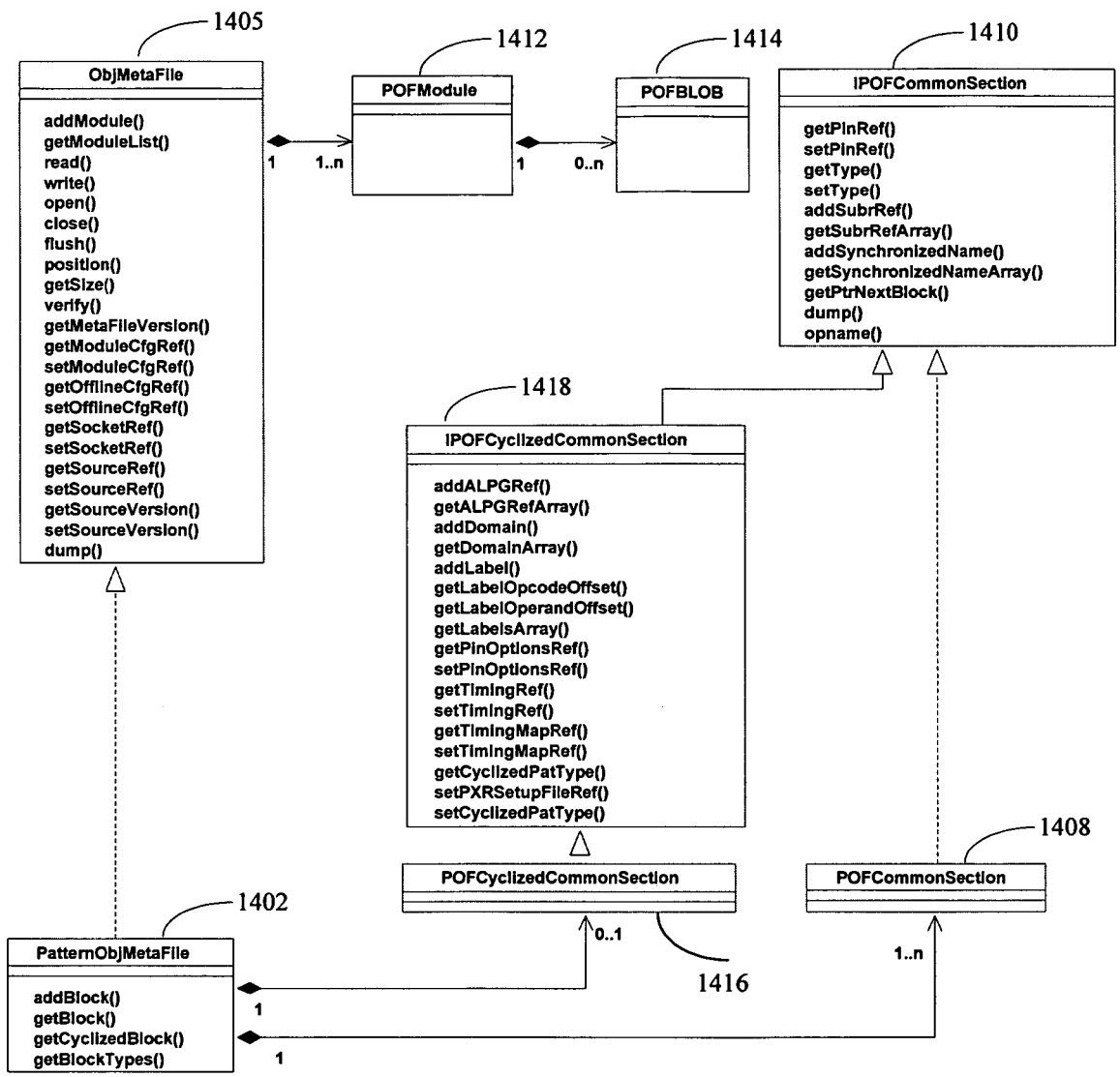
FIG. 14 illustrates the interactions between the pattern object metafile with its supporting classes.

FIG. 14 illustrates the interactions between the pattern object metafile (PatternObjMetaFile) and its supporting classes. The PatternObjMetaFile class 1402 includes an instance of a cyclized pattern object block (POFCyclized-CommonSection) class 1416 and zero or more instances of non-cyclized pattern object block (POFCommonSection) class 1408. The pattern object metafile (PatternObjMetaFile) class 1402 encapsulates the functionality of the pattern object metafile and provides the OFM framework with an API for interacting with the metafile.

The POFCommonSection class 1408 encapsulates the functionality of a non-cyclized pattern object within the metafile. This class implements the POF common section interface (IPOFCommonSection) 1410. The ObjMetaFile class 1405 provides clients access to the proprietary vendor sections of the pattern object metafile. The proprietary vendor module sections are encapsulated within POFModule objects 1412 and their corresponding POFBLOB objects 1414. Each of the POFModule object is associated with a particular module of a vendor. A single vendor may provide more than one module and thus have more than one module section within a pattern object metafile.

The POFCyclizedCommonSection class 1416 encapsulates the functionality of the cycle-based digital pattern object block. This class implements the POF cyclized common section interface (IPOFCyclizedCommonSection) 1418. It differs from the POFCommonSection class because it provides access to both cycle-based common section data and to the non-cycle-based common data provided for all pattern block types.

Interaction between OFM Framework and Vendor Module Compilers

In one embodiment, the test system pattern compiler targets a specific site configuration (in terms of the vendor-specific digital modules used). In order to support the integration of modules from different vendors into the test system, the following approaches are implemented.
1. A vendor compiler does not directly create a pattern object file. Instead, the test system provides for a pattern object metafile, managed by the OFM. The term pattern object metafile is also referred to as the object metafile. The OFM framework manages the storing of common pattern data into the metafile, but relies on plug-ins from various module vendors to invoke the compilation of vendor specific data. The model for the pattern compilation process may be visualized as shown in FIG. 6. The pattern object metafile has the same name as the pattern source file, with the source file extension replaced by the pattern object file extension. The OFM provides an application programming interface (APIs) to read and write to these files. The pattern object metafile has provisions for storing
   a. common header information,
   b. module-specific header information, and
   c. module-specific pattern data, organized by the module vendor, and capable of being interpreted by the module vendor.
2. Each module vendor is responsible for providing its own pattern compiler, in the form of a dynamically loadable library. This library provides the ability to retrieve a complete implementation of the standard interfaces defined by the OFM framework, such as the IVendorPatCompiler or IVendorCyclizedPatCompiler or both. The function of providing the IVendorPatCompiler interface is furnished by the library:
OFCStatus create VendorPatCompiler ( IVendorPatCompiler*& pCompiler, const OFCString& type);
In addition, the function of providing the IVendorCyclizedPatCompiler interface is furnished by the vendors:
OFCStatus create VendorCyclizedPatCompiler ( IVendorCyclizedPatCompiler*& pCompiler);
In case a vendor does not support either a compiler for Cyclized digital patterns or for a particular type of generic pattern, the above functions return a pre-defined OFCStatus informing the OFM framework that the requested compiler type is not supported.
3. The OFM framework includes a set of interfaces for providing vendor compilers access to common data, required for supporting the task of pattern compilation. This includes access to run-time objects that encapsulate the description of DUT pins, DUT sockets and DUT timings. It also includes the capability for accessing other referenced pattern metafiles, such as pattern subroutines.
4. The OFM framework also includes a set of interfaces for enabling a module vendor's compiler to write module-specific header information and data into the pattern object metafile. Note that this layout of the object metafile allows the pattern data to be organized on a per-module basis, even when two or more modules in the targeted site are identical.

The approaches described above enable multiple vendors to continue to use their proprietary formats as well as enable modules from multiple vendors to co-exist in the open architecture test system. The vendor specific sections of the metafile are treated as "black-box", which the OFM framework does not need to have specific knowledge about and the other vendors do not have access to.

In another embodiment, the interaction of the Vendor Module Compilers with the OFM framework during pattern compilation are illustrated in the sequence of steps described below:
1. The OFM framework instantiates an instance of OFMManager to manage the compilation of one or more patterns specified on the command-line of the SYSTEM pattern compiler.
2. The OFMManager gets initialized. This involves using a system utilities configuration file to register all the pattern compiler dynamically linked libraries (DLLs) that are specified (on a per vendor and per module basis). The system utilities configuration file specifies the utility setups of a particular system configuration. This file includes the name(s) of the pattern compiler DLL(s) and shared libraries that are registered for each vendor's module(s). This information is used by the OFM framework to invoke various vendor compilers to compile the corresponding sections of the pattern source file. As part of the registration, each DLL is queried to find out the types of pattern blocks that it supports.

3. The OFMManager then uses the PatternObjectMetaFile class to save the data common to the entire pattern source file. As part of this step, the framework reads the pattern source file to retrieve the types of pattern blocks that comprise this pattern source file. The various types of pattern blocks found are stored in the common section. Note that the framework distinguishes between two broad types of pattern blocks—Cyclized and Regular (non-Cyclized). The regular pattern blocks can have arbitrary names defining their type. The OFM framework does not need to be informed of these names in advance, thus enabling the system to have an open architecture.

4. For each type of pattern block contained within the pattern source being compiled, the OFMManager then queries the vendor pattern compiler DLL to instantiate an object that implements the IVendorPatCompiler interface. In case a cyclized pattern block is being compiled, the OFMManager queries the DLL to instantiate an object that implements the ICyclizedVendorPatCompiler interface (which is a sub-type of the IVendorCompiler interface) instead.

5. For each IVendorCompiler derived object obtained in step 4 above, the OFMManager calls the getSupportedResources( ) method to get a list of the system resources that-are supported by this module. The list of system resources is used (in conjunction with the Socket file and the system Module Configuration File (MCF)) to create a collection of resources that need to be compiled. The list of system resources is also used to create a list of pins for the device under test (DUT), in case the vendor compiler needs to be provided with such a list for pattern compilation purposes. Note that the OFM framework does not make this mandatory, as there may be cases where the pattern being compiled is not described in a pin-oriented manner, and thus, the compiler does not require a pin list. In that case, the IVendorPatCompiler interface supports a needsPinNames( ) method to allow the OFMManager to find out if a particular vendor compiler requires the list of DUT pins.

6. The OFMManager invokes the compile( ) method of each IVendorPatCompiler interface that supports the type of pattern blocks being compiled. It provides the following arguments to this method.
   a. A list of resource types referred to in the pattern source, with (optionally) a list of pin names for each such resource type. In case pins are not required, the list of pins is empty.
   b. An instance of OFMModuleAgent derived object (or POFCyclizedModuleAgent for cyclized patterns) to provide the vendor pattern compilers certain read and write accesses to the pattern object metafile.

7. After the compilation of each block of pattern source, the OFMManager queries the first-used compiler for common section data, which is then used to update the pattern object metafile.

8. The OFMManager then queries each vendor pattern compiler for a list of errors/warnings encountered. This list of errors/warnings is consolidated and provided to the user.

9. Steps 3 to 8 are repeated for each pattern source file being compiled and the corresponding pattern object metafiles are generated.

10. Finally, the OFMManager releases all the vendor pattern compilers registered in step 2 of this sequence of steps. This allows the various vendor compilers to clean up before the compilation process exits.

Loading Pattern Data

In the test system of an embodiment of the invention, each module vendor is responsible for providing its own specific pattern loading mechanism. As discussed above, the pattern object metafile stores module-specific data in different sections. The vendor implementation uses the system application programming interfaces (APIs) for accessing the relevant sections from the pattern object metafile. The OFM framework in turn is responsible for calling each module's load pattern method to load module-specific data to a module from the appropriate section of the metafile.

The sequence of steps illustrating the interaction between the OFM framework and the vendor module for pattern loading is described below.

1. A PatternMgr object is responsible for the loading of a collection of patterns that comprise a pattern execution sequence. This object instantiates a PatternLoader instance for each pattern being loaded.

2. The PatternLoader instantiates an instance of the PatternObjMetaFile class for the pattern being loaded and queries it for the list of types of pattern blocks in the pattern object metafile. The PatternLoader further queries the PatternObjMetaFile class for the types of modules that are contained within each pattern block type.

3. The PatternLoader then invokes a loadpattern( ) method of the corresponding derived IModule class provided by the vendor to load the pattern data for each type of block and module.

4. The loadpattern( ) method of the corresponding IModule interface uses the passed-in reference to the PatternLoader class. Then, it uses the load( ) method of the PatternLoader class to access the PatternObjMetaFile class and read the module-specific data from it, thus accomplishing the loading of the pattern.

E5. Pattern Files

It is possible to have each compiler vendor specify entirely different plain text formats for patterns, which, in fact, might indeed be necessary in most cases. However, in general, for a cycle-based testing environment, where coherent and identical semantics across modules are necessary for every vector, a shared, generalized syntax for the pattern file is not only desirable, but may be necessary. This shared syntax is what will be specified for the "common" section in the pattern source file. In fact, for the majority of cases, it is envisioned that the "common" section is the only section (besides header information) that will be required in the pattern file, and every vendor's compiler will work with only that section. This section presents rules for the pattern file that all compilers should be able to interpret. The pattern file will be organized as follows:

```
file_con-     :
tents
              version_info pattern_definitions
version_      :
info
        Version version-identifier ';'
pattern_definitions    :
        pattern_definition
        pattern_definitions pattern_definition
pattern_definition     :
        main_header '{' main_section '}'
        main_header '{' main_section vendor_sections '}'
        subr_header '{' subr_section '}'
        subr_header '{' subr_section vendor _sections '}'
main_header   :
        MainPattern identifier
main_section  :
        CommonSection '{' common_contents
main_section_domains '}'
common_contents        :
        timing_reference timing _map_reference
timing_reference       :
        Timing file-name ';'
timing_map_reference   :
        TimingMap file-name ';'
main_section_domains   :
        main_section _domains main_section_domain
        main_section_domain
main_section_domain    :
        Domain domain_name '{' main_section_contents '}'
domain_name   :
        identifier
main_section_contents  :
        main_section_contents main_section_content
        main_section_content
main_section_content   :
        label_spec main_pattern_spec
        main_pattern_spec
label_spec    :
        label ':'
label         :
        identifier
main_pattern_spec      :
        main_operation capture_mask_flag '{'
vectors_and_waveforms '}'
main_operation    : /* empty */
        common_operation
        jal_op
        jsr_op
        jsrc_op
        jsc_op
        exit_op
common_operation       :
        idxi_op
        idxin_op
        jec_op
        jech_op
        jff_op
        jffi_op
        jni_op
        ldin_op
        nop_op
        pause_op
        sndc_op
        sndt_op
        stfi_op
        sti_op
        stps_op
        wait_op
/*
* Instructions specific to the MAIN Patterns
*/
jsr_op        :
        JSR identifier
jsrc_op       :
        JSRC identifier
jsc_op        :
        JSC identifier
```

-continued

```
jal_op        :
        JAL identifier
exit_op       :
        EXIT
/*
* Instructions common to both MAIN and SUBR Patterns
*/
idxi_op       :
        IDXI 24-bit number
idxin_op      :
        IDXIn index-register
jec_op        :
        JEC identifier
jech_op       :
        JECH identifier
jff_op        :
        JFF identifier
jffi_op       :
        JFFI identifier
jni_op        :
        JNI identifier
ldin_op       :
        LDIN index-register
nop_op        :
        NOP
pause_op      :
        PAUSE
sndc_op       :
        SNDC 8-bit number
sndt_op       :
        SNDT 8-bit number
stfi_op       :
        STFI 24-bit number
sti_op        :
        STI 24-bit number
stps_op       :
        STPS
wait_op       :
        WAIT
capture_mask_flag      : /* empty */
        capture _mask_flag CTV
        capture _mask_flag MTV
        capture _mask_flag MATCH
vectors_and_waveforms  : /* empty */
        vectors_and_waveforms vector
        vectors_and_waveforms waveform
vector        :
        vector_declaration '{' vector_data '}'
vector_declaration     :
        Vector
        V
vector_data   :
        vector_datum
        vector_data vector_datum
vector_datum  :
        pin_name '=' vector-value ';'
        pin_name '=' identifier ';'
waveform      :
        waveform_declaration '{'waveform_data '}'
waveform_declaration   :
        Waveform
        W
waveform_data :
        waveform_datum
        waveform_data waveform_datum
waveform_datum         :
        waveform-table-pin-group-name '=' identifier ';'
pin_name      :
        identifier
vendor_sections        :
        vendor_sections vendor_section { }
        vendor_section { }
vendor_section         :
        VendorSection '{' vendor_section_contents '}'
subr_header   :
        SubrPattern
subr_section  :
        CommonSection '{' common_contents
```

-continued

```
source_selection_table subr_section_domains '}'
        CommonSection '{' common_contents
subr_section_domains '}'
subr_section_domains    :
        subr_section_domains subr_section_domain
        subr_section_domain
subr_section_domain    :
        Domain domain_name '{' subr_section_contents '}'
source_selection_table    :
        SourceSelectionTable '{' source_selector_definitions '}'
source_selector_definitions:
        source_selector_definitions source_selector_definition
        source_selector_definition
source_selector_definition:
        SourceSelector source_selector_name '{'
source_mappings '}'
source_selector_name    :
        identifier
source_mappings        :
        source_mappings source_mapping
        source_mapping
source_mapping        :
        pin_name '=' source ';'
source            :
            MAIN
    INVERT_MAIN
        SUBR
    INVERT_SUBR
subr_section_contents    :
        subr_section_contents subr_section_content
        subr_section_content
subr_section_content    :
        label_spec subr_pattern_spec
        subr_pattern_spec
subr_pattern_spec    :
        subr_operation capture_mask_flag '{'
vectors_and_waveforms '}'
subr_operation        : /* empty */
        common_operation
        rtn_op
        stss_op
/*
 * Instructions specific to the SUBR Patterns
 */
rtn_op    :
        RTN
stss_op    :
        STSS identifier
```

The following are the descriptions of undefined non-terminals used above:

1. version-identifier: A sequence of one or more characters from the set [0-9.], where the first character must be a digit.
2. identifier: A sequence of one or more characters from the set [a-zA-Z_0-9], where the first character must be from the set [a-zA-Z_].
3. vendor-section-contents: Arbitrary text that is meaningful only to a vendor-specific compiler.
4. file-name: A valid Windows file name (must be enclosed in double quotes if any white-spaces are contained in the file name). Note that this should be a simple file name, i.e., it should not have a directory component.
5. waveform-table-pin-group-name: A sequence of one or more characters from the set [a-zA-Z_0-9], where the first character must be from the set [a-zA-Z_]. This variable is declared elsewhere and holds the name of the waveform-table that is common to a group of pins.
6. 24-bit number: A valid decimal number up to a maximum of 16777215.
7. 8-bit number: A valid decimal number up to a maximum of 256.
8. index-register: A valid decimal number. In one embodiment of a module this can have a value [1-8].
9. vector: This is similar to the Vector statement in STIL. Note that this refers to signal names and signal groups names, making it necessary for the compiler to have access to the Pin Description file.
10. waveform-time-reference : A sequence of one or more characters from the set [a-zA-Z_0-9], where the first character must be from the set [a-zA-Z_].

Pattern files will support comments, which are meant to be ignored by a pattern file compiler. Comments will start with the '#' character, and extend to the end of the line.

The following points should be noted with reference to the constructs in the pattern file's header and "common" sections:

1. The pattern-name item specifies the name that will be associated with the Pattern object that the pattern file contains the data for. This gets carried over to the header in the corresponding pattern object metafile.
2. The waveform-time-reference is the name for a particular waveform-and-timing definition that would be defined externally to the pattern file, in the Timing file. The specification of a waveform-time-reference in the pattern file would bind that particular name (for a waveform-and-timing) to all subsequent vectors, until another waveform-time-reference were encountered.
3. The operand for a subroutine call (e.g., JSR and JSRC) is a string that should either be a pattern-spec label previously encountered in the same pattern file, or a pattern-spec label in an externally defined subroutine pattern. This operand will ultimately be resolved for the purposes of loading/handling subroutines. The labels for subroutine call operands are required to be unique across the system. Note that while waveform-time-reference names could be anything that is syntactically correct, due to specific hardware implications the waveform-time-reference names may need to be restricted to a previously known, well-defined set (which, for added readability, can be optionally mapped by the user to user-chosen names, the mapping presented in an optional file).

Also note that the pattern and waveform-time-reference source files should provide initial configuration data for all DUT channels which have connections to physical tester channels. If subsequent data is omitted for any DUT channel, the pattern compiler will "pad" the pattern data to hold output from the initial level.

Pattern File Example

A simple example of a MAIN Pattern source file will help illustrate the usage.

```

# Filename : good1.pat

Version 1.0 ;
#------------------------------------------------------------------
```

-continued

```
# Main Pattern definition:
#-------------------------------------------------------------------
MainPattern good1
{
    CommonSection
    {
      MacroDef      defaultDataVal     (XXXXXXXX)
      MacroDef      nopInstr           (NOP)
      MacroDef      label1             (Label1 : )
      MacroDef      jniInst            (JNI)
      #-------------------------------------------------------------
      #       Timing Specifications
      #-------------------------------------------------------------
          Timing "productionTiming.tim";
          TimingMap "productionTimingOpenSTARMap.tmap";
      #-------------------------------------------------------------
      #       Default Domain Cycles
      #-------------------------------------------------------------
      Domain default
      {
        #-----------------------------------------------------------
        #label: instruction {Vector/Waveform Data}
        #-----------------------------------------------------------
              NOP                       { V { DATA = $defaultDataVal; CLK = 1;} W {
DATA = wfs1; CLK = wfs1; } }
              JAL       myAPG           { V { DATA = 00000000; } }
              JSC       mySCAN          { V { DATA = 10101010; } }
              JSRC      mySubroutine {   V { DATA = 01010101; } }
              JSR       myAPG           { V { DATA = 00110011; } }
              STI       100        { }
      labZero: NOP                      { V { DATA = 00000011; } }
              JNI       labZero         { V { DATA= 11111100; } }
              IDXI      3000            { V { DATA = 10101010; } }
              IDXIn     3               { V { DATA = 01010101; } }
      $label1 NOP                       { V { DATA = $defaultDataVal; } }
              IDXI      2000            { V { DATA = 10101010; } }
              NOP              { }
              EXIT            { V { DATA = LLHHLLHH; } }
      }
        }
    }
```

Another example illustrating a SUBROUTINE pattern source file is illustrated below.

```
#-------------------------------------------------------------------
# Subroutine Pattern mySubrPat1 definition:
#-------------------------------------------------------------------
SubrPattern mySubrPat1
{
    CommonSection
    {
        #-------------------------------------------------------------
        #       Timing Specifications
        #-------------------------------------------------------------
        Timing "productionTiming.tim";
        TimingMap "productionTimingOpenSTARMap.tmap";
        #-------------------------------------------------------------
        #       Source Selection Specifications
        #-------------------------------------------------------------
                SourceSelectionTable
                {
        SourceSelector SrcSelDef
                {
                        DATA=SUBR; CLK=SUBR; DATA=SUBR;
                }
                SourceSelector SrcSelOne
                {
                        DATA=MAIN; CLK=MAIN;
                }
        }
        #-------------------------------------------------------------
```

```
#           Default Domain Cycles
#---------------------------------------------------------------
Domain default
{
#---------------------------------------------------------------
#label :         instruction      { Vector and Waveform Data setups }
#---------------------------------------------------------------
             STI 100         { Vector { DATA = 00000000; } }
             IDXI 3000       { Vector { DATA = 00001111; } }
             IDXIn 3         { Vector { DATA = 00110011; } }
     $label1 NOP             { Vector { DATA = LLHHLLHH; } }
             NOP             { Vector { DATA = LLXXXXXX; } }
             NOP             { Vector { DATA = LLHHXXXX; } }
             JNI Label1      { Vector { DATA = LLHHLLHH; } }
             STSS SrcSelOne { Vector { DATA = LHLHLHLH; } }
             RTN             { Vector { DATA = LLXXXXXX; } }
     }
  }
}
```

Summary information from the main header and common section in the pattern source file is stored in the main header in the object metafile. The summary consists of information that is typically required for quick extraction to aid pre-load resolution of addresses, etc., or to aid in datalogging. Since the semantics of the common section are exactly the same for all compilers, every compiler will be capable of providing the same summary information, and the first compiler writing the metafile will store this information. The following is the information that will be stored:

1. The pattern source file name.
2. The type of the pattern as declared in the source file.
3. The version information from the source file.
4. A list of all the waveform-and-timing names used in the pattern source file's common section.
5. A map of all subroutine references to (relative) vector addresses in the pattern source file's common section.
6. A map of all label references to (relative) vector addresses in the pattern source file's common section.
7. General bookkeeping information: vector count, instruction count, etc.

The open architecture test system requires both pattern and pattern list files to have explicit, and different, extensions. For pattern files, this applies to both plain text source and compiled object files. This is viewed as a convenience to the user to quickly identify the file type visually in a directory listing, etc., as well as allow associations to be made on the basis of extensions. The pattern list file parser will expect filenames with these extensions:

Plain text pattern source file: .pat
Compiled pattern object metafile: .pobj
Pattern list file: .plst The user can override these default values, e.g., through tester environment variables or setup options.

The tester will require the definition of the following "environment" variables for file search paths in at least one of the environment configuration files described in:
Tester_PATLIST_PATH: For pattern list files.
Tester_PATSRC_PATH: For pattern source files (optional).
Tester_PATOBJ_PATH: For pattern object metafiles.

Note that if the optional environment/setup variable Tester_PATSRC_PATH is not defined, it will be assumed to be the same as Tester_PATOBJ_PATH. In general, it would be more efficient to not define Tester_PATSRC_PATH rather than define it with the same value as Tester_PATOBJ_PATH.

E6. Software Representation

A Pattern object is not created by the user; rather, the user always deals with Pattern List objects, which are collections of other pattern lists and/or patterns. A Pattern List object creates, owns and maintains the pattern objects contained within it, while making them accessible to the user. A pattern list object in the user's test program is associated with a pattern list file on disk, which contains the actual definition of the pattern list. The definition of a pattern list provides an explicit name for the pattern list, and identifies an ordered list of patterns and/or other pattern lists through file name associations. This section describes the software representation of pattern lists and patterns, as a prelude to understanding how they are manipulated in the tester framework.

Pattern List Associations

A single test site in the test system (and, by extension, the test plans in it) can be associated with multiple top-level pattern lists. However, there is only a single execution context for test plans at any given time. Since a top-level pattern list defines an execution sequence for the patterns referred to (hierarchically) by it, the active execution context is the one corresponding to the currently selected top-level pattern list. Note that this does not imply that only the patterns contained in a single pattern list can be loaded on the hardware at one time; rather, the set of patterns that are required to be loaded on the hardware to make an execution sequence viable must always be a subset of all the currently loaded patterns.

Pattern Trees

Figure 7:
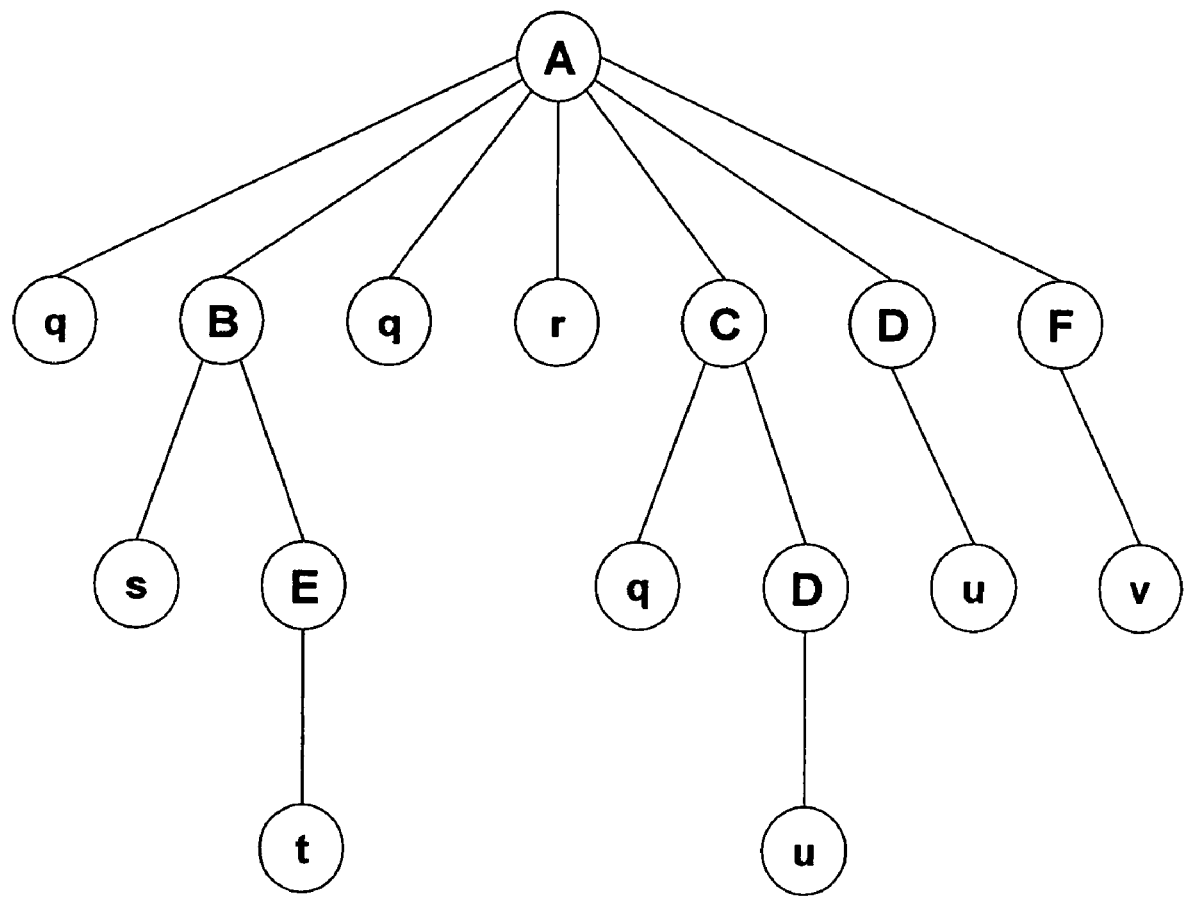
FIG. 7 illustrates an ordered pattern tree example according to an embodiment of the present invention.

Intuitively, it is felt that a way to represent a top-level pattern list is by some sort of a tree data structure. FIG. 7 illustrates an embodiment of an ordered pattern tree of the invention, assuming that the pattern list A is the top-level pattern list Pattern Tree Information Content The following information will be stored at every node of the pattern tree:
1. The name of the entity (pattern-list or pattern) associated with that node.
2. The type of the definition source. For a leaf (pattern node), this will always be a pattern file; for an intermediate (pattern list) node, this could be either "top-level file" (for top-level pattern list definitions) or "embedded in file" (for nested pattern-list definitions).

3. The last modification timestamp of the file on disk the node is associated with.

The following additional information will be stored only in intermediate (pattern list) nodes:
1. Execution options (if any) set on the pattern-list object represented by that node—i.e., its object options.
2. The execution options (if any), set on each child reference inside the pattern list definition represented by that node—i.e., the reference options, for each of its children.

Thus, the collection of nodes encountered on the unique path from the root to an intermediate node, and the sequence in which they are encountered, contain all the information necessary to determine the combined, effective, execution options represented by that node. The execution options of a pattern are determined by the effective execution options of its immediate parent, combined with the reference options its immediate parent might have for it.

It should be noted here that while the pattern list parser is in the process of creating the pattern tree, certain execution options might require initial storage of values simply as strings, since the context of their use might not be resolved until later. An example of such an option is a "mask" option, which specifies pin mask information: pattern lists are not associated with Socket information, and hence, pin mask options (pin and group names) are stored as strings, to be resolved prior to loading.

The following additional information will be stored only in leaf (pattern) nodes:
1. All (possibly transitive) references to subroutines called by that pattern, both external and internal, organized as an execution tree.

Of course, all pattern nodes will additionally have access to—and might choose to cache—all the pattern file summary information available in the object metafile common header.

Handling Pattern List Modifications

Changes made to the contents of a pattern list conceptually affect all references to that pattern list. The following rules, which apply as appropriate to pattern objects as well as pattern list objects, will be used to manage such changes:
1. A change made to the contents of a pattern list file on disk will be propagated through the test system only on a load( ) command being executed on that pattern list (or on any other pattern list that references that one). In other words, the pattern list hierarchy in software will always reflect the one currently loaded on the hardware.
2. The user will be able to set a mode that will defeat the checks made during load time to synchronize pattern lists with their disk file sources; this will allow quicker/safer operation in production mode.

Pattern Tree Navigation

The top-level pattern lists associated with a test site (and, by extension, with a test plan for that site) have public (global) scope. The system provides APIs to navigate the pattern tree representing a top-level pattern list so that users can get access to individual nodes and sub-trees.

E7. Pattern List Dynamics

Earlier the static rules of Pattern Lists were described. A description of the dynamic (execution) rules of pattern lists is now presented.

The pattern tree is essential for general pattern management. For example, the starting point for a pattern load sequence is a call to the load( ) method on the pattern tree currently associated with the site or test plan. However, a pattern tree does not operate in isolation. A fully initialized pattern tree will be used to create the following two framework objects:
1. A top-level pattern list defines a Pattern Execution Sequence for the patterns. It describes how such an execution sequence can be derived from the pattern tree corresponding to that top-level pattern list. For example, the pattern execution sequence corresponding to the pattern tree A shown in FIG. 7 is {q, s, t, q, r, q, u, u, v}. The Pattern Execution Sequence is conceptually an ordered list reflecting the execution sequence described through the pattern tree. The framework establishes and maintains any necessary navigation links between pattern tree nodes and corresponding entries in the Pattern Execution Sequence.
2. The Pattern Set, which is simply a list of all the unique patterns (including subroutines) in the pattern tree. This is thus the list that will be used to determine the individual patterns that should be loaded on the hardware. The framework establishes and maintains any necessary navigation links between pattern tree nodes and corresponding entries in the Pattern Set. The Pattern Set for the pattern tree of FIG. 7 is (q, s, t, r, u, v) (it is assumed that none of the patterns in pattern list A contain any subroutine calls):

Note that both the Pattern Execution Sequence and the Pattern Set can always be derived from the pattern tree; however, it would often make sense to cache them, after initial construction, for as long was viable.

Pattern List Execution Options

As shown above, each pattern list declaration (preceding its definition) or pattern list/pattern reference entry can be followed by a number of execution options. Pattern list execution options modify the runtime execution of pattern lists. To allow future extensions, the names (and optional values) for these options will be treated simply as strings by the pattern list file parser of the pattern compiler, to be interpreted by a particular version as appropriate. Tester prescribes a set of options and their interpretations, described below. However, vendors can extend the set of options. In order to allow a parse-time validation of option syntax, the pattern list file parser could read an information file for a particular version. Such an information file could also be used to specify whether a particular version at all supports the specification of execution options.

For versions that support a set of execution options, the following general rules will govern their use. In order to understand these rules, it is useful to visualize the hierarchical collection of pattern lists/patterns as an ordered tree.
1. Intrinsic options set on pattern list definitions (i.e., in the "local-pattern-list-declaration, global-pattern-list-declaration" productions in the file are, in effect, direct option settings on the corresponding Pattern List object in the user's test program. They thus apply to all references to that pattern list object, and are referred to as object options.
2. Referential options set on references to pattern lists/patterns (i.e., in the "pattern-entry" and "pattern-list-entry" productions in the file limits the scope of the options to a specific path in the hierarchy—the path (established by the declaration order of pattern lists/patterns) that leads from the root of the tree to the reference under consideration. These are thus options on specific object references (and not on the objects themselves), and are referred to as reference options.

3. The effective option settings for any list/pattern in the collection hierarchy (established by the declaration order of pattern lists/patterns) are a combination of the object and reference options encountered along the path from the root of the tree to that list/pattern. The specific combination mechanism (e.g., set union, set intersection, or any other conflict resolution algorithm) is a property of the option itself.

Note that a consequence of the above rules—and the fact that there is no facility to set execution options on a pattern definition in a pattern file—is that there is no direct rule to set options which apply to all references to a pattern. The mechanism for achieving this is to use a single-pattern pattern list.

The tester specifies a certain set of pattern list execution options that modify its burst behavior, and that modify its execution sequence.

When an execution sequence for a pattern list is submitted to the hardware, the hardware produces a burst. A Burst is the execution of a sequence of patterns directly by the hardware, without any involvement from the software. A Burst Discontinuity is a position in an execution sequence where a prior burst is terminated, and a new burst is started.

One of the objectives of the pattern management software is to provide the hardware with the execution sequences that it needs to produce a burst on. By default, a pattern tree yields an execution sequence, which if submitted to the hardware will result in a single burst. This behavior can however be modified by the use of options on the pattern list. Thus, the use of options result can result in burst discontinuities.

Furthermore, users will sometimes require a prologue or epilogue pattern to be run before or after every pattern or every burst. This modifies the execution sequence to be submitted to the hardware.

During the creation or modification of the Pattern Execution Sequence object, the framework has all the information necessary to determine, and report if required, breaks in pattern bursts resulting from the combination of execution options specified and the particular execution sequence embodied by the pattern tree. While doing this, it might need to investigate the hardware capabilities of the modules in the system. For example, one hardware implementation allows four stored configurations for pin masks, of which two (0 and 3) are used for default masked (to support Mask This Vector, MTV) and unmasked operation. The user is thus allowed two different global pin-mask configurations without breaking burst mode.

Note that if a module vendor does not support pattern list implementations in hardware, the vendor's processing of the Pattern Execution Sequence would result in individual execution of all patterns in the execution sequence. In both Site-Compatible and Site-Heterogeneous systems, the burst capability of sites would be limited by the "lowest common denominator". The tester provides for a certain default set of options and their parameters is described below. Each option is specified by stating:

Whether it is Intrinsic (i.e. associated with a definition with the Global or Local keyword) or Referential (i.e. associated with a reference with the Pat or PList keyword). Intrinsic options apply at the point of definition and at every reference, but referential options apply only at the reference they are associated with.

Furthermore, an option is said to be Inherited by Children if the option is assumed to apply recursively to all statically (syntactically) or dynamically (semantically by being referenced) nested patterns or pattern lists.

Below is the list of options. Every compliant vendor will interpret these options as specified.

1. Mask <pin/pin group>
   Intrinsic when applied to GlobalPList, LocalPList
   Referential when applied to PList, Pat.
   Inherited by children.
   This pattern list will always have the compare circuits of the pins referred to by the indicated pin or pin group disabled. Sometimes, hardware limitations may result in burst discontinuities.
2. BurstOff
   Intrinsic when applied to GlobalPList, LocalPList
   Referential when applied to PList, Pat.
   Not inherited by children.
   This pattern list will always execute in the non-burst mode. This option is not inherited by children, but the BurstOffDeep option (below) is inherited by children.
3. BurstOffDeep
   Intrinsic when applied to GlobalPList, LocalPList
   Referential when applied to PList, Pat.
   Inherited by children.
   This pattern list will always execute in the non-burst mode. This option is inherited by children, but the BurstOff option (above) is not inherited by children.
   Note that the BurstOffDeep option cannot be turned off by a child.
4. PreBurst <pattern>
   Intrinsic when applied to GlobalPList, LocalPList
   Inherited only by child nodes having no burst options specified.
   The indicated pattern is to be prefixed to all bursts within this pattern list. The
   PreBurst pattern occurs just before every burst that is started due to this pattern list node. The option is not applied when already within a burst which has a PreBurst option that is the same pattern.
5. PostBurst <pattern>
   Intrinsic when applied to GlobalPList, LocalPList
   Inherited only by child nodes having no burst options specified.
   The indicated pattern is to be suffixed to all bursts within this pattern list. The PostBurst pattern occurs just after every burst that is started due to this pattern list node. The option is not applied when already within a burst which has a PostBurst option that is the same pattern.
6. PrePattern <pattern>
   Intrinsic when applied to GlobalPList, LocalPList
   Not inherited by children.
   The indicated pattern is to prefixed to all patterns within this pattern list.
7. PostPattern <pattern>
   Intrinsic when applied to GlobalPList, LocalPList
   Not inherited by children.
   The indicated pattern is to be suffixed to all patterns within this pattern list.
8. Alpg <alpg object name>
   Intrinsic when applied to GlobalPList, LocalPList
   Not inherited by children.
   The named ALPG object stores relevant information such as slow speed APG register settings, read latency, immediate data registers, address scramble, data inversion, data generators, etc.
9. StartPattern <pattern>
   Intrinsic when applied to GlobalPList, LocalPList
   Not inherited by children.
   The pattern list will start executing at the first occurrence of the StartPattern in its execution sequence.

10. StopPattern <pattern>
    Intrinsic when applied to GlobalPList, LocalPList
    Not inherited by children.
    The pattern list will stop executing at the first occurrence of the StopPattern in its execution sequence.
11. StartAddr <vector offset or label>
    Intrinsic when applied to GlobalPList, LocalPList
    Not inherited by children.
    This must be accompanied by a StartPattern option. The pattern list will start executing at the StartAddr in the first occurrence of the StartPattern in its execution sequence.
12. StopAddr <vector offset or label>
    Intrinsic when applied to GlobalPList, LocalPList
    Not inherited by children.
    This must be accompanied by a StopPattern option. The pattern list will stop executing at the StopAddr in the first occurrence of the StopPattern in its execution sequence.
13. EnableCompare_StartPattern <pattern>
    Intrinsic when applied to GlobalPList, LocalPList
    Not inherited by children.
    Pattern comparison will commence at the first occurrence of the indicated pattern.
14. EnableCompare_StartAddr, EnableCompare_StartCycle
    Intrinsic when applied to GlobalPList, LocalPList
    Not inherited by children.
    This must be accompanied with EnabelCompare_StartPattern. Indicates the address or cycle within the pattern where pattern comparison is to start.
15. EnableCompare_StopPattern <pattern>
    Intrinsic when applied to GlobalPList, LocalPList
    Not inherited by children.
    Pattern comparison will complete at the first occurrence of the indicated pattern.
16. EnableCompare_StopAddr, EnableCompare_StopCycle
    Intrinsic when applied to GlobalPList, LocalPList
    Not inherited by children.
    This must be accompanied with EnableCompare_StopPattern. Indicates the address or cycle within the pattern where pattern comparison is to complete.
17. Skip.
    Referential when applied to PList, Pat.
    Not inherited by children.
    Causes a pattern or the entire subsequence dominated by a pattern list to be skipped. This will also cause skipping of all options at the root of this pattern list sub-tree. It is as if this pattern sub-tree were not there for execution purposes.

Pattern List Burst Control

As described earlier, when an execution sequence for a pattern list is submitted to the hardware, the hardware produces a burst of a sequence of patterns, without any involvement from the software. A Burst Discontinuity is a position in an execution sequence where a prior burst is terminated, and a new burst is started. The PreBurst, PostBurst, BurstOff and BurstOffDeep options control where the burst discontinuities occur, as described in the option list above. PreBurst and PostBurst options determine burst discontinuities subject to certain additional rules described below:

1. When a parent list has PreBurst and PostBurst options, and the nested list has the same corresponding options, there is no burst discontinuity, and the PreBurst and PostBurst options of the nested list do not apply. There is only a single burst applying the PreBurst and the PostBurst of the parent list.
2. Notice that when the nested list has no burst options, it is equivalent to having the same PreBurst and PostBurst options as the parent list by the description of these options. Consequently, nested lists with no burst options do not result in a burst discontinuity.
3. If rule 1 above does not apply and there is a contribution to the pattern execution sequence from the start of the parent list to the start of the nested list, then there is a burst discontinuity at the start of the nested list. In this case the PreBurst and PostBurst of the parent list apply to this contribution to the pattern execution sequence from the parent list. The PreBurst and the PostBurst of the nested list apply to the nested list.
4. If rule 1 above does not apply, and there is a contribution to the pattern execution sequence from the end of the nested list to the end of the parent list, then there is a burst discontinuity at the end of the nested list. In this case the PreBurst and PostBurst of the parent list apply to this contribution to the pattern execution sequence from the parent list. The PreBurst and the PostBurst of the nested list apply to the nested list.
5. If rule 1 does not apply, and there is no contribution to the pattern execution sequence from the parent list other than from the nested list, then the PreBurst and the PostBurst of the parent list do not apply. There is only a single burst applying the PreBurst and PostBurst of the nested list.

Below are a few examples illustrating the effect of options on the execution sequence. To simplify, it is assumed that all the pattern lists are specified in a single file.

EXAMPLE 1

Use of BurstOff

This example illustrates BurstOff and PreBurst. Of particular emphasis is that BurstOff causes patterns to run singly in bursts that are one pattern long. Hence the PreBurst option still applies. The input pattern lists are as below:

| Global A | [BurstOff] [PreBurst pat_z] |
|---|---|
| { | |
| Pat | q; |
| PList | B; |
| Pat | r; |
| Pat | s; |
| Global C | |
| { | |
| Pat | t; |
| PList | D; |
| }; | |
| PList | D; |
| PList | E; |
| }; | |
| Global B | |
| { | |
| Pat a; | |
| Pat b; | |
| }; | |

-continued

```
Global D [BurstOff]
{
    Pat c;
    Pat d;
};
Global E
{
    Pat e;
};
```

Figure 8:
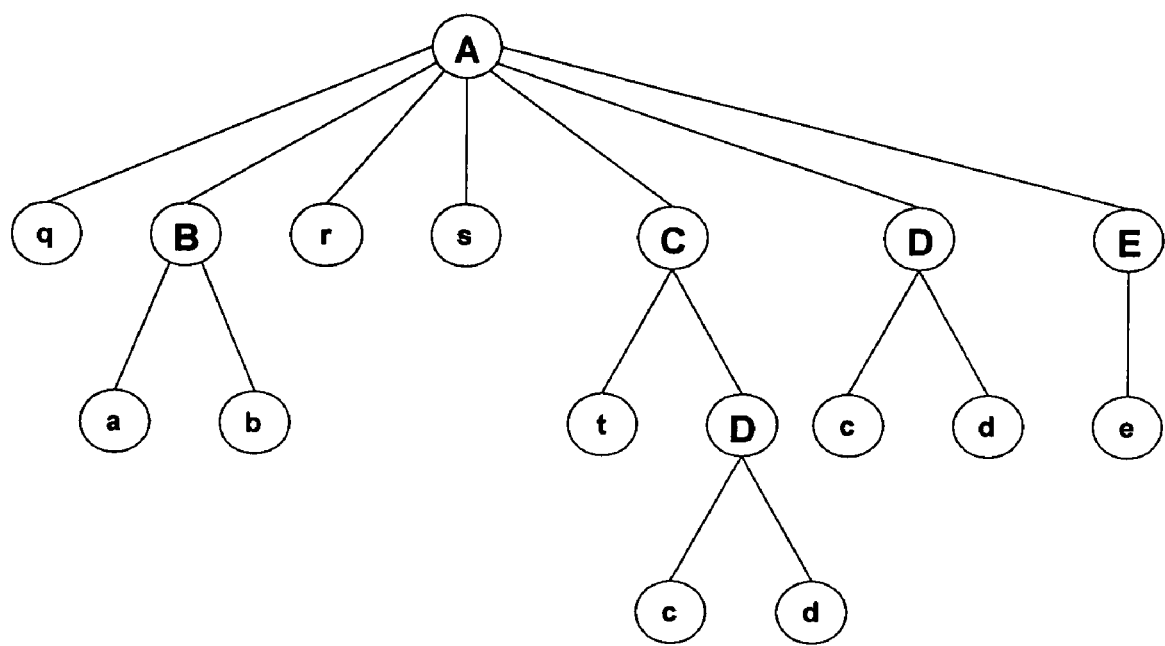
FIG. 8 illustrates another ordered pattern tree example according to an embodiment of the present invention.

The tree rooted at A may be represented in FIG. 8.

The execution sequence for this pattern is below. The character | indicates a burst break. This pattern list executes in 10 bursts, the first one having patterns z and q, and the last one with pattern e:

z q | a b | z r | z s | t | c | d | c | d | e

Note the following about this execution sequence:
1. Since the BurstOff option on A is not inherited by B, the patterns a and b in B operate as a burst.
2. Since the PreBurst option on A is not inherited by B, the a and b in the burst by B is not prefixed by z.
3. The prefix by z only happens for the patterns that are executed due to being direct children of a, namely patterns q, r and s. These patterns are executed singly as if in a burst that is only one pattern long due to A having the BurstOff option. The BurstOff requires patterns to be run individually in one-pattern long bursts. Hence, the PreBurst and PostBurst options still apply.
4. Pattern list D has an intrinsic burst off option that causes its children c and d to execute singly. They do not inherit the PreBurst z from A.

EXAMPLE 2

Use of BurstOffDeep

This example illustrates the BurstOffDeep option. BurstOffDeep during pattern list definition affects nested definitions and referenced lists. However, PreBurst and PostBurst options are not inherited by nested and referenced lists. The example uses the same patterns A, B, C, D, E as in example 1, but the options are different:
5. Options on definition of A: [BurstOffDeep], [PreBurst z], [PostBurst y]
6. No other options on any other node.

The execution sequence is as below. As earlier, the | character indicates a burst break.

z q y | a | b | z r y | z s y | t | c | d | c | d | e

Note the following about this execution sequence:
1. PreBurst and PostBurst are not inherited by B, C, D, E.
2. BurstOffDeep is inherited by B, C, D, and E.

EXAMPLE 3

PreBurst and PostBurst Inhibition

Suppose now the pattern list tree of Example 1 is considered, where the options are:

1. Options on definition of A: [PreBurst x] [PostBurst y]
2. Options on definition of C: [PreBurst x] [PostBurst z]
3. No other options on any other node.

The execution sequence would be:

x q a b r s t c d c d e y

The reasons why the "t c d" subsequence is not "x t c d z" are as follows:
1. The first x is inhibited since it is equal to the pre-burst option x that is associated with the current burst in effect.
2. The last z is inhibited since the PostBurst z is not inherited to D, and there is no pattern that is generated from C to which the z can be appended.

EXAMPLE 4

Use of Skip

This example illustrates the effect of the Skip option on nested definitions and referenced lists. The example uses the same patterns A, B, C, D, E as in example 1, but the options are different:
1. Options on definition of A: [Skip], [PreBurst z], [PostBurst y]
2. Options on reference to r: [Skip]
3. Options on definition of C: [Skip]

The execution sequence is a single burst with no breaks as below:

z q a b s c d e y

Note the following about this execution sequence:
1. The nodes for r and C are skipped.
2. There are no burst breaks at all.

EXAMPLE 5

Use of Mask

This example illustrates the effect of the Mask option and its effects on pattern and pattern list definitions and references. The example uses the same patterns A, B, C, D, E as in example 1, but the options are different:
1. Options on definition of A: [mask pin1_pin2], [PreBurst z]
2. Options on reference of B: [mask pin3]
3. Options on definition of B: [mask pin4]
4. Options on reference of e: [mask pin5]
5. No other options on any nodes.

The name "pin1_pin2" specifies a group which masks Pin1 and Pin2. The names "pin3", "pin4" and "pin5" specify masking Pin3, Pin4 and Pin5 respectively. The execution sequence is provided below, with | indicating the burst break. The numerals below each pattern indicate the pins that are masked during that pattern execution.

```
z q a b z r z s t c d c d | e
1 1 1 1 1 1 1 1 1 1 1 1 1   1
2 2 2 2 2 2 2 2 2 2 2 2 2   2
        3 3                 5
        4 4
```

Note the following about this execution sequence:
1. The vendor's hardware can only accommodate 2 mask blocks without a burst break. Until e is executed the two mask blocks are pins {1, 2} and pins {1, 2, 3, 4}. When pattern e arrives with a different mask block of pins {1, 2, 5}, the hardware requires a burst break.

EXAMPLE 6

Use of Inherited Options and References

This example illustrates that an inherited option at a definition does not apply when the definition is referenced. Consider the following example:

```
Global A
{
    Global B [BurstOffDeep]
    {
        Global C
        {
            ...
        };
        ...
    };
    ...
    PList C;
};
Global D
{
    PList C;
};
```

The BurstOffDeep option is inherited by C at its point of definition. However, it is not an intrinsic option, and so it is not applied to C at both its point of references.

EXAMPLE 7

PreBurst and PostBurst with Nested Lists

Consider the following example:

```
GlobalPList A [PreBurst x] [PostBurst y]
{
    Pat p1;
    LocalPList B [PreBurst x] [PostBurst y]
    {
        Pat p2;
    }
    LocalPList C
    {
        Pat p3;
    }
    LocalPList D [PreBurst x] [PostBurst z]
    {
        Pat p4;
    }
    LocalPList E [PreBurst w] [PostBurst y]
    {
        Pat p5;
    }
    Pat p6;
}
```

The execution sequence is:

```
x p1 p2 p3 y | x p4 z | w p5 y | x p6 y
```

1. Pattern p2 is in the same burst as p1 because the PreBurst and PostBurst options of the nested list are specified the same as the parent. Pattern p3 is also in the same burst because these options are inherited the same as the parent. These options have at least one different member in the remaining nested lists, giving rise to burst discontinuities Timing The user interacts with the system primarily by defining the test setups using pattern files. The Timing File is used to describe the Timing of these patterns. This file requires other system files (e.g. Pin, SpecSelector) for underlying definitions to be resolved. Further the Spec-Selectors and Global definitions used to resolve various variables used in the Timing definition are encapsulated in a composite TestConditionGroup object. Higher-level files, such as the Test Plan file, in turn use this TestConditionGroup instance.

Figure 9:
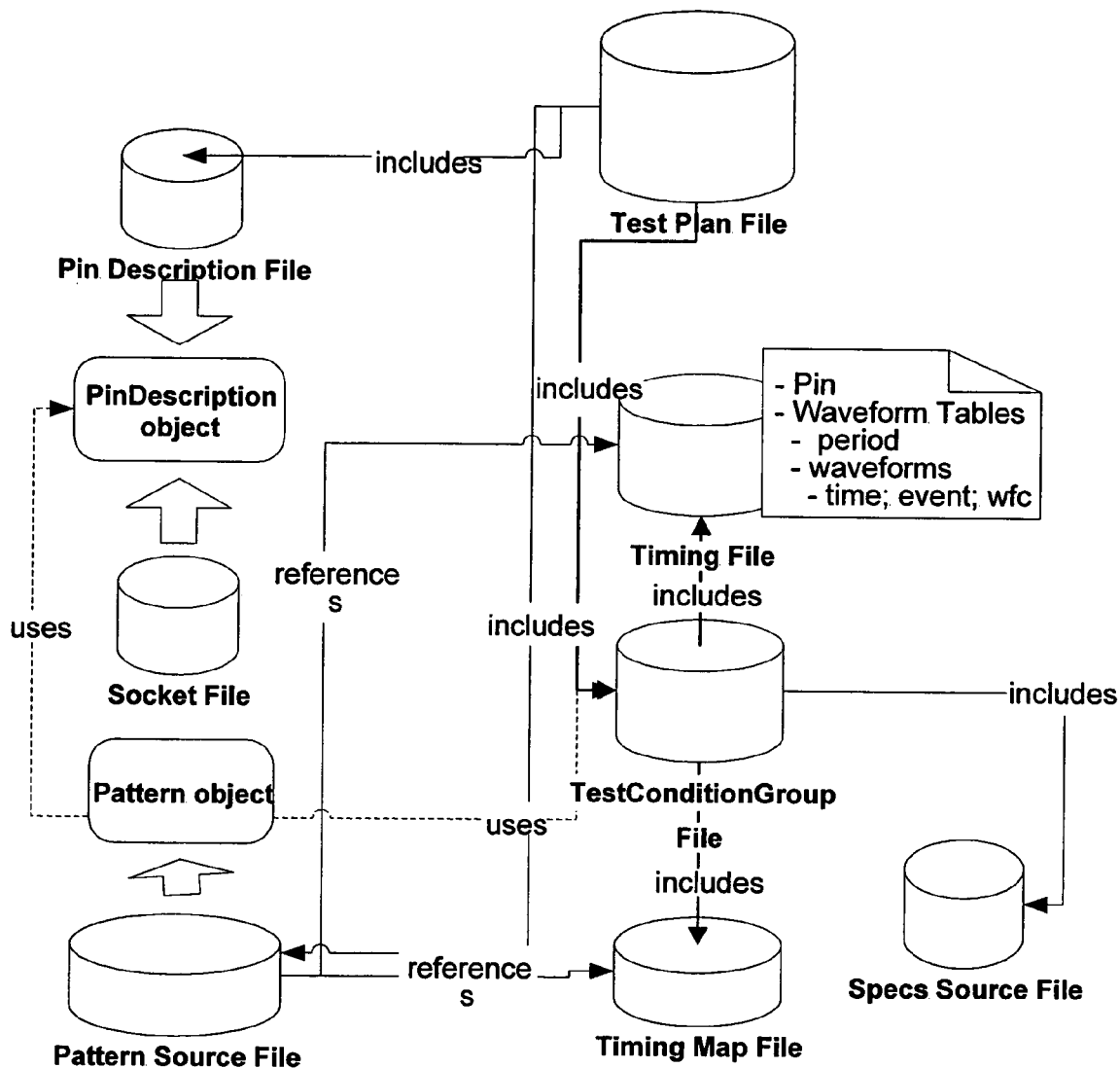
FIG. 9 illustrates the relationships among files that are required by a test program according to an embodiment of the present invention.

The Test Plan File contains references to the TestConditionGroup object. The Pattern Source File makes references to the WaveformSelector components within a TimingMap object. The Timing objects itself references the Pin objects. Optionally the Timing object might also reference a variable modulated by a SpecSelector object. These relationships are illustrated in FIG. 9.

The Pattern object within the Pattern-List specifies the name of the WaveformSelector object to use for a set of pattern characters. Also note that the Timing Map file is specified in the pattern: Patterns need not be compiled if this map is not changed.

```
Version 1.0;
MainPattern
{
    CommonSection
    {
        ...
        Timing = myGalxy.tim;
        TimingMap = myGalxyMap.tmap;
        ...
        Domain default
        {
            NOP  V  {SIG=1; CLK=1; DATA=L } W {SIG=wfs1;
                     FASTCLK=wfs1; }
            NOP  W  {SIG=wfs2;}
               NOP  V  {SIG=L; }
            NOP  V  {SIG=0; }
        }
    }
}
```

Here we define the WaveformSelector component of the TimingMap to use for the pattern characters.

The TestConditionGroup File objects import the Timing object to use and the TimingMap object to use. Each Test uses a TimingCondition instance derived from the TestConditionGroup object for that instance. Thus multiple Timing objects, which support the same set of waveform tables, can be stored in the tester framework and can be swapped as required. Similarly multiple Test Plan Files can share a common TestConditionGroup object.

An example of a Test Plan description file illustrates the usage of the Timing object below.

```
Import partlist1.plist;
Import tim1.tim;
Import tim2.tim;
Import tmap1.tmap;
TestConditionGroup tim1_prod
{
    SpecSet = prodTmgSpec(min, max, typ)
    {
        period = 10ns, 15ns, 12ns;
    }
    Timings
    {
        Timing = tim1;         [Two Tests within a Test Plan
        TimingMap = tmap1;      using different timing objects
    }                           defined earlier.]
}
TestConditionGroup tim2_prod
{
    SpecSet = prodTmgSpec(min, max, typ)
    {
        period = 10ns, 15ns, 12ns;
    }
    Timings
    {
        Timing = tim2;
        TimingMap = tmap1;
    }
}
        }
        TestCondition tim1_prod_typ
        {
            TestConditionGroup = tim1_prod;
            Selector = typ;
        }
        TestCondition tim2_prod_max
        {
            TestConditionGroup = tim2_prod;
            Selector = max;
        }
        Test FunctionalTest MyFunctionalTestSlow
        {
            PListParam = partlist1;
            TestConditionParam = tim1_prod_typ;
        }
        Test FunctionalTest MyFunctionalTestFast
        {
            PListParam = patList1;
            TestConditionParam = tim2_prod_max;
        }
```

The Timing object defines various waveforms on a per pin basis. The pins used in the Timing file and the Timing Map file need to be defined appropriately in the Pin definition file.

The Timing object can use SpecificationSet objects to define values within the waveform objects. Though the Timing object can include hard-coded values for various attributes it is usually the case that users have various attributes be assigned values using variables. These variables in turn can depend on SpecificationSet objects. An example of this usage is illustrated below.

```
Version 1.0;
Timing basic_functional     [This variable, which defines the
{                            edge placement, is defined
    ...                      elswhere and is dependent on a
    Pin SIG                  SpecificationsSet.]
    {
        WaveformTable wfs1
        {
            { 1 } U @t_le ;D@t_te D; Z@45ns;} }
        };
    };
    Pin CLK
    {
        WaveformTable wfs1
        {
            { 0 { U@20ns; D@40ns; }};
        };
    };
}
```

The SpecSelector is defined as illustrated below.

```
SpecificationSet prodTmgSpec( min, max, typ)
{
    t_le = 10ns, 14ns, 12ns;
    t_te = 30ns, 34ns, 32ns;
    ...
}
```

The changing of the timing used by changing the spec is illustrated in the example below.

```
This timing uses the
typical specification in the
SpecSelector.
TestCondition prodTmp_typ
{
    TestConditionGroup = prodTmgSpec;   [This timing uses the
    SpecSelector = typ;                  typical specification in the
}                                        SpecSelector.]
TestConditionGroup prodTmp_max
{
    TestConditionGroup = prodTmgSpec;   [This timing uses the
    SpecSelector = max;                  max specificaiton in the
};                                       SpecSelector.]
```

F2. Mapping to the Timing Components of a tester

Figure 10:
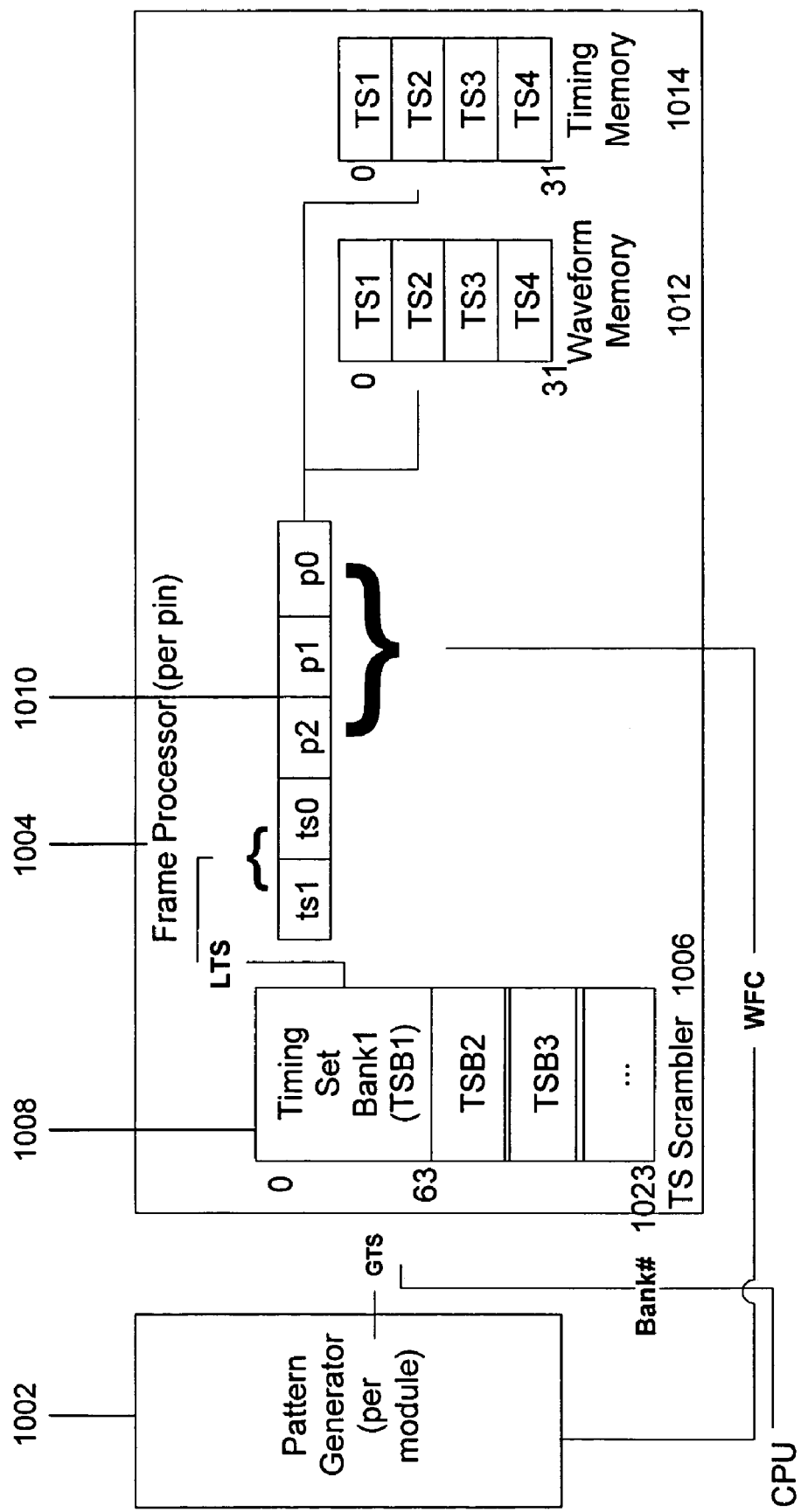
FIG. 10 illustrates waveform generation according to an embodiment of the present invention.

Two components of a tester module are directly involved with the generation of wave shapes and their associated timings. The two modules are the Pattern Generator (PG) and the Frame Processor (FP). A simplified block diagram illustrating the wave shape formatting and the timing generation by the Frame Processor within the open architecture test system architecture is illustrated in FIG. 10. A brief description of the generation of waveforms is given below.

The Pattern Generator 1002 generates a timing set which is common for all the pins in the module. This timing set is called the Global Timing Set (GTS). There are three modes in which the Pattern Generator can be set up. These three modes affect the number of bits that can be used to describe the GTS. In addition these settings also impact the number of bits used to select a bank and whether the Capture This Vector (CTV) and Mask This Vector (MTV) bits are set or not. To instruct the tester to capture the results of this vector, the user uses the CTV flag in the Pattern file. Similarly the user uses the MTV flag in the pattern to instruct the tester to mask the results of the current vector. This is illustrated in Table 1 below. The Pattern Generator 1002 is also responsible for the generation of Waveform Characters (WFC). WFCs are generated on a per pin basis. The tester module uses a fixed number of bits to describe the WFCs.

TABLE 1

| GTS bits | GTS in a Bank | GTS Bank | CTV | MTV |
|---|---|---|---|---|
| 8 bits | 256 | 4 | NO | NO |
| 7 bits | 128 | 8 | YES | NO |
| 6 bits | 64 | 16 | YES | YES |

The tester module provides a Frame processor 1004 per pin. Each Frame Processor contains a Timing Set Scrambler (TSS) 1006, which has a total depth of up to 1024 in this example. The TSS 1006 can be partitioned into a number of banks 1008 depending on the mode of the Pattern Generator as described earlier and illustrated in FIG. 10 where 16 banks of 64 entries per bank are being used. The TSS is provided so as to allow more flexibility in the ability to define Waveform Tables for each pin. In the "FP" mode the TSS outputs a Timing Set using 2 bits. Thus the TSS will generate a total of four distinct physical Timing Sets per pin. These Timing Sets are referred to as the Local Timing Sets (LTSs).

The Frame Processor 1004 combines LTS and WFC and creates an index 1010 into the Waveform Memory 1012 and Timing Memory 1014. In the "FP" mode the 5-bit value is split up with 2 bits being generated by the LTS and 3 bits being generated by the WFC. Thus the depth of the physical Waveform Memory and Timing Memory is 32 deep per pin though a maximum of 4 physical Timing Sets may be used. The Waveform Memory contains the enabled timing edges that form the wave shapes. The timing values for the enabled edges are obtained from the Timing Memory, Thus, the Frame Processor formats wave shapes.

Mapping Methodology

The methodology is to map all the WaveformTable blocks on a per pin basis to LTSs in the tester. If tester hardware supports 4 LTSs, the user can define a maximum of 4 WaveformTable blocks. Each WaveformTable block can have a maximum of n waveform definitions for the tester digital module.

The Timing-Map file provides a mapping of Logical WaveformSelectors defined in the Timing-Map block to the WaveformTable for the module in open architecture test system. In this case the tester supports up to 256 Logical WaveformSelectors. In open architecture test system system, the Logical WaveformSelectors map directly to the GTSs. The Pattern compiler depends on both the Timing-Map and the Timing blocks to be able to compile the pattern files. However if the waveform characters in the WaveformTables of the Timing block are unchanged or the WaveformSelector mappings in the Timing-Map block are unchanged, there is no need to re-compile the pattern.

Example Using this Mapping Methodology

To illustrate the mapping into a tester Digital Module the following assumptions are made: the Frame Processor is set to the FP mode; and CTV and MTV bits are set so total number of GTS bits is 6 and the total number of Timing Bank Selector bits is 4.

Each WaveformTable defined in the Timing block is mapped to a distinct LTS within the Timing file. This is done on a per-pin basis. Thus WaveformTable seq1 is mapped to LTS1. In the case of the "SIG" pin all 8 possible waveform entries are used up. However the "CLK" pin requires a single waveform entry and thus uses up a single row in the Waveform memory (WFT) and the Waveform Timing memory (WTM).

Figure 11:
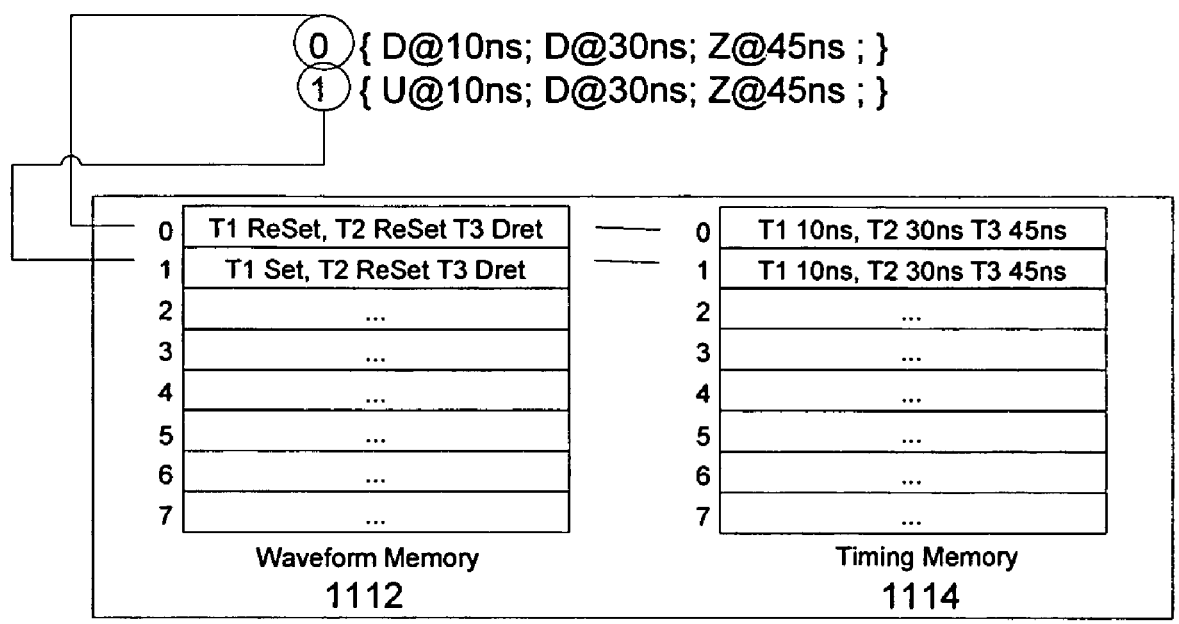
FIG. 11 illustrates a mapping used for timing according to an embodiment of the present invention.
Figure 12:
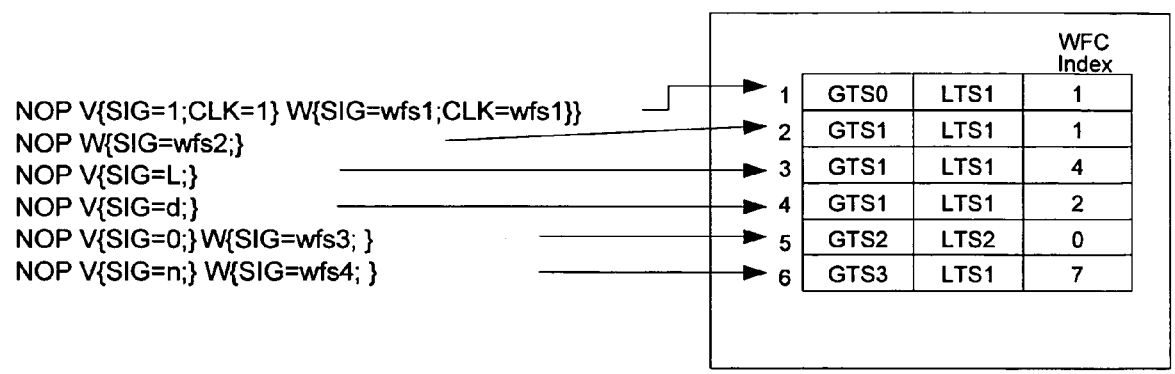
FIG. 12 illustrates another mapping used for timing according to an embodiment of the present invention.

The mapping of the first 2 physical waveforms of the "SIG" pin is illustrated in FIG. 11. As this Waveform Table maps two waveform characters that need separate configurations of the edges, we end up allocating two entries in the Waveform memory (WFT) 1112 and the Waveform Timing memory (WTM) 1114. The shape of the waveform is stored in the WFM and the timing details are stored in the WTM. One embodiment of the module has a total of 6 timing edges T1, T2, T3, T4, T5 and T6. These map directly to the Events E1, E2, . . . defined in the waveforms within a Edge Resource section of the Timing block. If more than 6 events are defined in the Timing block and this is used with a the above module, it will result in an error.

In the example of FIG. 11, the first waveform character "0" uses Timing Edge T1 to program the "Force Down" or "D" event, which occurs at time 10 ns into the cycle. Timing Edge T2 is also used to generate a "Force Down" or "D" event at time 30 ns. Finally Timing Edge T3 is used to generate a "Force Off" or "Z" event at time 45 ns.

The second waveform character "1" uses Timing Edge T1 to program the "Force Up" or "U" event, which occurs at time 10 ns into the cycle. Timing Edge T2 is also used to generate a "Force Down" or "D" event at time 30ns. Finally Timing Edge T3 is used to generate a "Force Off" or "Z" event at time 45 ns.

In this fashion, the WFCs are mapped into the WFM memory and WTM memory of the Frame Processor. The final setup of Waveform Memory WFM of LTS1 for pin "SIG" is illustrated in Table 2 below.

TABLE 2

| Index | (WFC) | T1Set | T1ReSet | T2Set | T2ReSet | T2Drel | T2Dret | EXPH | EXPHZ |
|---|---|---|---|---|---|---|---|---|---|
| 0 | 0 |   |   | 1 |   |   | 1 |   |   |
| 1 | 1 | 1 |   |   |   |   | 1 |   |   |
| 2 | d |   |   | 1 | 1 |   |   |   |   |
| 3 | u | 1 |   |   |   |   | 1 |   |   |
| 4 | L |   |   |   |   |   |   |   |   |
| 5 | H |   |   |   |   |   |   | 1 |   |
| 6 | m |   |   |   |   |   |   |   |   |
| 7 | n |   |   |   |   |   |   |   | 1 |

| Index | T3Set | T3ReSet | T3Drel | T3Dret | T4Drel | T4Dret | EXPL | EXPHZ |
|---|---|---|---|---|---|---|---|---|
| 0 |   |   |   | 1 |   |   |   |   |
| 1 |   |   |   | 1 |   |   |   |   |
| 2 |   |   |   | 1 |   |   |   |   |
| 3 |   |   |   | 1 |   |   |   |   |
| 4 |   |   |   |   |   |   | 1 |   |
| 5 |   |   |   |   |   |   |   |   |
| 6 |   |   |   |   |   |   |   | 1 |
| 7 |   |   |   |   |   |   |   |   |

The final step of Waveform Timing Memory WTM of LTS1 for pin "SIG" is illustrated in Table 3. below.

TABLE 3

| Index | (WFC) | T1 | T2 | EXPH | T3 | T4 | EXPL |
|---|---|---|---|---|---|---|---|
| 0 | 0 | 10 ns | 30 ns | | | 45 ns | |
| 1 | 1 | 10 ns | 30 ns | | | 45 ns | |
| 2 | d | 12 ns | 32 ns | | | 42 ns | |
| 3 | u | 12 ns | 32 ns | | | 42 ns | |
| 4 | L | | | | | | 17 ns |
| 5 | H | | | 17 ns | | | |
| 6 | m | | | | | 15 ns | |
| 7 | n | | | 15 ns | | | |

The "CLK" pin uses up a single waveform and thus the WFM and WFT for this pin are very simple. The final setup of Waveform Memory WFM of LTS1 for the "CLK" pin is illustrated in Table 4 below.

TABLE 4

| Index | (WFC) | T1Set | T1ReSet | T2Set | T2ReSet | T2Drel | T2Dret | EXPH | EXPHZ |
|---|---|---|---|---|---|---|---|---|---|
| 0 | 1 | 1 | | | 1 | | | | |
| 1 | | | | | | | | | |
| 2 | | | | | | | | | |
| 3 | | | | | | | | | |
| 4 | | | | | | | | | |
| 5 | | | | | | | | | |
| 6 | | | | | | | | | |
| 7 | | | | | | | | | |

| Index | T3Set | T3ReSet | T3Drel | T3Dret | T4Drel | T4Dret | EXPL | EXPHZ |
|---|---|---|---|---|---|---|---|---|
| 0 | | | | | | | | |
| 1 | | | | | | | | |
| 2 | | | | | | | | |
| 3 | | | | | | | | |
| 4 | | | | | | | | |
| 5 | | | | | | | | |
| 6 | | | | | | | | |
| 7 | | | | | | | | |

The final setup of Waveform Timing Memory WTM of LTS2 is illustrated in Table 5 below.

TABLE 5

| Index | (WFC) | T1 | T2 | EXPH | T3 | T4 | EXPL |
|---|---|---|---|---|---|---|---|
| 0 | 1 | 20 ns | 40 ns | | | | |
| 1 | | | | | | | |
| 2 | | | | | | | |
| 3 | | | | | | | |
| 4 | | | | | | | |
| 5 | | | | | | | |
| 6 | | | | | | | |
| 7 | | | | | | | |

The TimingMap block explicitly maps out the Waveform-Selectors to the Waveform tables of the Timing block. For a tester system this boils down to setting up the Timing Set Scrambler (TSS) memory. The TSS basically contains a mapping from the GTS to the LTS that holds the settings. The TSS setup for our example for pin SIG will look like Table 6 below.

TABLE 6

| GTS | LTS |
|---|---|
| 0 (wfs1) | 1 |
| 1 (wfs2) | 1 |

TABLE 6-continued

| GTS | LTS |
|---|---|
| 2 (wfs3) | 2 |
| 3 (wfs4) | 1 |
| 4 (wfs5) | 3 |
| 5 (wfs6) | 1 |
| . | |
| . | |
| . | |
| N (wfs1) | 1 |
| . | |
| . | |
| . | |
| 255 | |

Finally after the TSS and LTS setup mappings are resolved, the Pattern Compiler can use this information to program the pattern with the correct waveform table (LTS) and the correct waveform character to use. Thus our example pseudo-pattern considering only pin "SIG" is illustrated in FIG. 11. Note that this compilation has no dependency on the Timing block and only depends on the Timing-Map block.

G. Tester Operation

This section describes the basic operation of the tester operating system (TOS). The activities considered in this section are:
system initialization
Test Plan loading
Pattern loading
Running a Test Plan
Running an individual Test System Initialization In order to initialize the system in one embodiment, certain assumptions must be satisfied, and certain conditions must be met. The following sub-section lists these.

Preconditions

Copies of the relevant system software components have a central store, whose location is known to the System Controller. This may be on the System Controller itself, or on another system with a network mounted directory (or known to the SYSC via another mechanism)—whatever the mechanism, before the system can function, all software must be made available to the System Controller for use. This software includes:

vendor hardware control (i.e., module software) DLLs,
standard or user test class DLLs, and
user test plan DLLs.

The system module configuration file is available on the System Controller. Recall that this file allows the user to specify the physical configuration of the tester, e.g., the physical location and type of each module in the system chassis, as well as the names of the module software DLLs.

The system configuration file is available on the System Controller. Recall that this file contains the list of Site Controllers in the system, as well as a map of Site Controller hostnames to Switch Matrix input port addresses.

Site controllers have a service called the Site Configuration Manager (SCM) running. This service is responsible for determining what hardware is installed in each slot, by a process termed "hardware discovery". It is also responsible for participating in the system initialization process with the System Controller. Note that the Switch Matrix operation protocol dictates, in one embodiment, that the SCM on a single Site Controller, with Switch Matrix input port connection address 1, should always be used to configure the Switch Matrix connections to the modules. Recall that this "special" site is denoted as SITEC-1.

The System Controller is responsible for providing each Site Controller's SCM with its Switch Matrix connection address.

Each Site controller's SCM is capable of starting a process called the Test Plan Server (TPS). The Test Plan Server on each Site Controller is ultimately responsible for containing and executing the user's test plan (or test plans, in the case where a single Site Controller is running tests on multiple DUTs).

Initialization Phase I: System Validation

Once the above assumptions and preconditions have been satisfied, system initialization first proceeds with a system validation step as follows:

1. The System Controller reads the system and module configuration files to initialize the user-specified view of the system.
2. Using the specified system configuration information, the System Controller verifies that the specified Site Controllers are alive, reachable, and ready (i.e., have SCMs running). Any error during this verification step will cause a system error to be raised, and initialization to be aborted.
3. The System Controller then instructs the SCM service at SITEC-1 to configure the switch matrix to have access to all hardware modules, and requests it to perform hardware discovery.
4. The SCM service at SITEC-1 polls all available module slots (known hardware locations) for {vendor, hardware} tuples and generates a map of {vendor, hardware} tuples to slots. At conclusion, this poll has thus identified the entire set of {vendor, hardware, slot} bindings that exist in the complete system. The results of this poll are sent to the System Controller.
5. The System Controller verifies that the results of the above hardware discovery step match the user-specified configuration in the module configuration file. Any error during this verification step will cause a system error to be raised, and initialization to be aborted.
6. The System Controller then loads a default environment (such as search paths for module DLLs, pattern lists, patterns, test plan DLLs, test class DLLs, etc.) from the environment setup file(s) at well-known location(s).
7. The System Controller ensures that all identified module software DLLs exist. If one is not available on the System Controller, it is retrieved from the central store, if possible; otherwise, a system error is raised, and initialization is aborted.

Initialization Phase II: Site Configuration (Optional)

Site configuration, or site partitioning, involves the software-level assignment of the available system hardware modules to different sites (i.e., to service multiple DUTs). Recall that site-partitioning information is provided in a socket file.

The tester system allows site (re-)partitioning to be performed both as part of a test plan load (since each test plan is associated with a particular socket), and as an independent user-callable step. In the latter case, the user initiates the site partitioning by providing a socket file that is used solely to partition the system. This is especially useful during system initialization in the case of multi-DUT testing where each site tests a different DUT type. However, this step is optional during the initialization stage, and the user can choose not to have it performed, opting instead to allow a test plan load to partition the system appropriately.

Whatever the means chosen to effect site partitioning (by an independent call or implicitly through a test plan load), the mechanism is the same. This mechanism is described below.

1. Given the socket, the System Controller first determines whether the currently existing system partition is compatible with the socket, or whether a re-partitioning is necessary. The default partition during initialization is one in which all available modules are connected to SITEC-1. The remaining steps below are performed only if re-partitioning is needed.
2. The System Controller sends a configuration message to each Site Controller SCM to re-configure itself with the number and identities of DUT sites that are enabled for it under the new socket. Note that this is a general procedure, and handles the case where the number of DUT sites controlled by a Site Controller is one. The new socket information is also conveyed to the SCMs.
3. Each SCM stops the running TPS, if any, and starts a new one, initializing it with the new socket, and the number and identities of DUT sites that are enabled for it under the new socket.
4. The System Controller determines which sites need what subsets of the required system modules. While doing this, it also prepares hardware slot information for the sites. The net result is, for each site, a list of slots versus module DLLs assigned to that site. This site-specific list will be denoted as the Site Module DLL Slot List (SITE-MDSL).
5. The System Controller provides the appropriate SITE-MDSL, as well as the necessary module DLLs, to each SCM. Each SCM in turn makes this information available to the newly-started TPS.
6. The System Controller then requests SITEC-1 to configure the Switch Matrix for the proper site-to-slot connections, that is, for site-partitioned operation.
7. The TPSs on sites 1 through n load the DLLs specified in their SITE-MDSL. Each of these DLLs has a function named initialize( ) which takes an array of slot numbers. The TPS calls initialize( ) with the appropriate slot lists for that module type. On any malfunctions at this point, a system error is raised, and initialization is aborted. The initialize( ) method does the following:

a. Creates concrete classes based on a standard interface IXXXModule. For example, a DLL associated with a digital module will create a single IPinModule-based object to service each slot it is associated with.
b. Creates concrete classes based on interface IResource, one for each "resource unit" in the module. Again, for a digital module, each IPinModule-based object will create ITesterPin-based objects for all pins in the collection of slots occupied by digital modules.
8. The TPSs on sites 1 through n then call getXXXModuleo on each loaded module DLL to retrieve module contents information.
9. Each call to getXXXModule( ) returns a <VendorHWType>Module class object as an IModule pointer (e.g., AdvantestPinModule). Each such IModule pointer is cached by the TPS, which makes these available to framework/user code. Note that the collection of IModules, IResources, etc. are persistent (at least for the lifetime of the TPS).
10. Once the above steps are complete, the TPS starts to listens on its assigned (well-known) port. This signals to the System Controller that the TPS is "ready" to begin normal (i.e., site-partitioned) operation.

Test Plan Load

This section describes the steps by which a user Test Plan DLL is loaded on a Site Controller (for single or multiple DUT testing).

Once system initialization (and optionally, initial site partitioning) has been completed, user test plans can be loaded. The loading of a user test plan on a Site Controller proceeds as follows:
1. The System Controller first loads the test plan DLL into its own process space, querying it for its associated socket file and its DUT type identifier. This information is used to identify the site(s) running this test plan, and hence, the Site Controller(s) that this test plan would be loaded on.
2. The System Controller then uses the socket information associated with the test plan to initiate the re-partitioning process as outlined above.
3. The System Controller extracts the list of test class DLLs used by the test plan from the test plan DLL, and once the System Controller has verified that the TPS is ready to begin normal (i.e., site-partitioned) operation, sends the test class DLLs, and, finally, the test Plan DLL itself, to the appropriate TPS.
4. The TPS calls LoadLibrary( ) to load it into its process space. It calls a well-known function on the DLL to create as many TestPlan objects as the number of sites (i.e., DUTs) it is servicing.
5. The TPS initializes the TestPlan object(s) with the necessary tester framework objects. During initialization, the TPS loads the appropriate DLLs for the test classes used by the TestPlan object(s) into the process space, and creates the test class instances.
6. The TPS sets up the communications channel to/from the System Controller to the TestPlan object(s).
7. The System Controller communicates with the TPS, and builds its proxies for the TestPlan object(s).

The concludes the successful load of the user's Test Plan on a Site Controller.

Running a Test Plan

The method to execute all tests in a test plan according to the pre-defined flow logic is as follows:

1. The user's application transmits a RunTestPlan message to the TPS. The TPS sends an ExecutingTestPlan message to all connected applications. The TPS then calls execute( ) on the Test Plan.
2. Testing multiple DUTs with a single Site Controller is performed using multiple threads on that Site Controller, one per DUT. Each thread runs a different, independent instance of the same TestPlan object. Since, in this case, module control software DLLs might be shared across DUTs, the module commands for hardware communication are required to take a DUT identifier parameter.
3. The TestPlan object iterates over each test in its collection (alternatively, tells its Flow object to process each test according to the flow logic), callingpreExec( ), execute( ), and postExec( ).
4. As each test executes, status messages are sent back to all connected applications.

Executing a Single Test

A user may wish to execute a single test in a test plan instead of all tests. For single test execution, the method is as follows.
1. User application transmits a RunTest message to the TPS; the TPS sends an ExecutingTest message to all connected applications. The TPS then calls executeTest( ) on the Test Plan, specifying the test to run.
2. The Test Plan object executes the specified test by calling preExec( ), execute( ), and postExec( ) on that test object.
3. When the test executes, it sends status messages back to all connected applications.

Although the invention has been described in conjunction with particular embodiments, it will be appreciated that various modifications and alterations may be made by those skilled in the art without departing from the spirit and scope of the invention. The invention is not to be limited by the foregoing illustrative details, but rather interpreted according to the scope of the claims.

What is claimed is:

1. A method for managing a pattern object file in a modular test system, comprising:
providing a modular test system, wherein the modular test system comprises a system controller for controlling at least one site controller, and wherein the at least one site controller controls at least one test module and its corresponding device under test (DUT);
creating an object file management (OFM) framework for establishing a standard interface between vendor-supplied pattern compilers and the modular test system;
receiving a pattern source file;
creating a pattern object metafile based on the pattern source file using the OFM framework; and
testing the DUT for generating test results for display through the test module using the pattern object metafile.

2. The method of claim 1, wherein the OFM framework provides standard interface classes for supporting integration of vendor-supplied pattern data into the modular test system.

3. The method of claim 1, wherein the OFM framework is further configured to transfer module-specific pattern data from different vendors to the pattern object metafile.

4. The method of claim 1, wherein creating the OFM framework comprises:
creating a vendor pattern compiler class for interfacing the vendor-supplied pattern compilers and the test module;

creating an OFM module agent class for accessing a pattern object metafile class, wherein the pattern object metafile class encapsulates the pattern object metafile being compiled; and creating an OFM label reader class for accessing specific parts of other auxiliary pattern object metafiles used during pattern compilation.

5. The method of claim 4, wherein creating the vendor pattern compiler class comprises:
supporting pattern compilation of the pattern source file;
updating module-specific sections of the pattern object metafile;
updating a common section of the pattern object metafile; and
consolidating compilation errors.

6. The method of claim 4, wherein creating the OFM module agent class comprises:
supporting read operations of the vendor-supplied pattern compilers from a common section;
supporting read operations of the vendor-supplied pattern compilers from vendor-specific sections; and
supporting write operations from the vendor-supplied pattern compilers to the module-specific sections of the pattern object metafile.

7. The method of claim 4, wherein creating the OFM label reader class comprises:
accessing labels of auxiliary pattern object metafiles; and
accessing label offsets of the auxiliary pattern object metafiles.

8. The method of claim 1, wherein the pattern object metafile comprises:
one or more pattern blocks for representing non-cycle-based pattern blocks in the pattern source file; and
at most one cyclized pattern block for representing cycle-based pattern block in the pattern source file.

9. The method of claim 1, wherein creating the pattern object metafile comprises:
initializing an OFM manager for controlling the compilation of patterns;
storing common section data of the pattern source file using a pattern object metafile class, wherein the common section data comprises information accessible to the vendor-supplied pattern compilers;
instantiating a vendor pattern compiler interface object for each vendor module to be utilized by the pattern object metafile, wherein the vendor pattern compiler interface object supports multiple types of pattern blocks;
obtaining a list of system resources supported by the test module in accordance with a vendor pattern compiler interface object;
compiling a list of resource types within the pattern source file with a pattern compiler to generate a common section data;
updating the pattern object metafile with the common section data; and
generating a list of compilation errors and warnings.

10. The method of claim 9, wherein the pattern compiler comprises:
at least one module-specific pattern compiler; and
an object file manager for directing each module-specific compiler to compile both a module-specific section and a common section of the corresponding pattern source file.

11. The method of claim 9, wherein the vendor pattern compiler interface object comprises a cycle-based pattern compiler interface object.

12. The method of claim 9, wherein the vendor pattern compiler interface object comprises a non-cycle-based pattern compiler interface object.

13. The method of claim 9, wherein the multiple types of pattern blocks comprises one or more items selected from the group consisting of cycle-based patterns and non-cycle-based patterns.

14. A modular test system, comprising:
a system controller;
at least one site controller coupled to the system controller;
at least one test module and its corresponding device under test (DUT), wherein the test module is controlled by the site controller;
an object file management (OFM) framework for establishing a standard interface between vendor-supplied pattern compilers and the modular test system;
means for receiving a pattern source file;
means for creating a pattern object metafile based on the pattern source file using the OFM framework; and
means for testing the DUT for generating test results for display through the test module using the pattern object metafile.

15. The system of claim 14, wherein the OFM framework provides standard interface classes for supporting integration of vendor-supplied pattern data into the modular test system.

16. The system of claim 14, wherein the OFM framework is configured to transfer module-specific pattern data from different vendors to the pattern object metafile.

17. The system of claim 14, wherein the OFM framework further comprises:
means for creating a vendor pattern compiler class for interfacing the vendor-supplied pattern compilers and the test module;
means for creating an OFM module agent class for accessing a pattern object metafile class, wherein the pattern object metafile class encapsulates the pattern object metafile being compiled; and
means for creating an OFM label reader class for accessing specific parts of other auxiliary pattern object metafiles used during pattern compilation.

18. The system of claim 17, wherein the means for creating the vendor pattern compiler class comprise:
means for supporting pattern compilation of the pattern source file;
means for updating module-specific sections of the pattern object metafile;
means for updating a common section of the pattern object metafile; and
means for consolidating compilation errors.

19. The system of claim 17, wherein the means for creating the OFM module agent class comprise:
means for supporting read operations of the vendor-supplied pattern compilers from a common section;
means for supporting read operations of the vendor-supplied pattern compilers from module-specific sections; and
means for supporting write operations from the vendor-supplied pattern compilers to the module-specific sections of the pattern object metafile.

20. The system of claim 17, wherein the means for creating the OFM label reader class comprise:
means for accessing labels of auxiliary pattern object metafiles; and
means for accessing label offsets of the auxiliary pattern object metafiles.

21. The system of claim 14, wherein the pattern object metafile comprises:
  one or more pattern blocks for representing non-cycle-based pattern blocks in the pattern source file; and
  at most one cyclized pattern block for representing a cycle-based pattern block in the pattern source file.

22. The system of claim 14, wherein the means for creating the pattern object metafile comprises:
  means for initializing an OFM manager for controlling the compilation of patterns;
  means for storing common section data of the pattern source file using a pattern object metafile class, wherein the common section data comprises information accessible to the vendor-supplied pattern compilers;
  means for instantiating a vendor pattern compiler interface object for each vendor module to be utilized by the pattern object metafile, wherein the vendor pattern compiler interface object supports multiple types of pattern blocks;
  means for obtaining a list of system resources supported by the test module in accordance with a vendor pattern compiler interface object;
  means for compiling a list of resource types within the pattern source file with a pattern compiler to generate a common section data;
  means for updating the pattern object metafile with the common section data; and
  means for generating a list of compilation errors and warnings.

23. The system of claim 22, wherein the pattern compiler comprises:
  at least one module-specific pattern compiler; and
  an object file manager for directing each module-specific compiler to compile both a module-specific section and a common section of the corresponding pattern source file.

24. The system of claim 22, wherein the vendor pattern compiler interface object comprises a cycle-based pattern compiler interface object.

25. The system of claim 22, wherein the vendor pattern compiler interface object comprises a non-cycle-based pattern compiler interface object.

26. The system of claim 22, wherein the multiple types of pattern blocks comprises one or more items selected from the group consisting of cycle-based patterns and non-cycle-based patterns.

27. A pattern compiler, comprising:
  at least one module-specific pattern compiler;
  an object file manager for directing each module-specific compiler to compile both a corresponding module-specific section of a pattern source file and a common section of the pattern source file; and
  a pattern object metafile, wherein the pattern object metafile includes a common header section and at least one module-specific pattern data section, and wherein the pattern object metafile is used for testing a device under test (DUT) for generating test results for display.

28. The pattern compiler of claim 27, wherein the common section includes information accessible to all of the module-specific compilers.

29. The pattern compiler of claim 27 further comprises at least a module-specific pattern loader for loading module-specific pattern data into corresponding test modules for execution.

30. The system of claim 27, wherein the pattern object metafile further comprises:
  one or more pattern blocks for representing non-cycle-based pattern blocks in the pattern source file; and
  at most one cyclized pattern block for representing a cycle-based pattern block in the pattern source file.

* * * * *